US012796139B2

(12) United States Patent
Miyata et al.

(10) Patent No.: US 12,796,139 B2
(45) Date of Patent: Nov. 10, 2026

(54) OPTICAL ELEMENT, IMAGE SENSOR AND IMAGING DEVICE

(71) Applicant: NTT, Inc., Tokyo (JP)

(72) Inventors: Masashi Miyata, Musashino (JP); Naru Nemoto, Musashino (JP); Fumihide Kobayashi, Musashino (JP); Toshikazu Hashimoto, Musashino (JP)

(73) Assignee: NTT, Inc., Tokyo (JP)

( * ) Notice: Subject to any disclaimer, the term of this patent is extended or adjusted under 35 U.S.C. 154(b) by 392 days.

(21) Appl. No.: 18/039,048

(22) PCT Filed: Nov. 30, 2020

(86) PCT No.: PCT/JP2020/044560

§ 371 (c)(1),
(2) Date: May 26, 2023

(87) PCT Pub. No.: WO2022/113362

PCT Pub. Date: Jun. 2, 2022

(65) Prior Publication Data

US 2024/0006440 A1 Jan. 4, 2024

(51) Int. Cl.

*H10F 39/00* (2025.01)
*H04N 23/55* (2023.01)
*H10F 39/18* (2025.01)

(52) U.S. Cl.

CPC .......... *H10F 39/806* (2025.01); *H04N 23/55* (2023.01); *H10F 39/182* (2025.01)

(58) Field of Classification Search

None
See application file for complete search history.

(56) References Cited

U.S. PATENT DOCUMENTS

| | | | |
|---|---|---|---|
| 2007/0146531 A1 | 6/2007 | Toshikiyo | |
| 2008/0272454 A1 | 11/2008 | Toshikiyo et al. | |
| 2020/0266230 A1 | 8/2020 | Miyata et al. | |
| 2020/0301053 A1* | 9/2020 | Wang | G02B 5/201 |
| 2021/0125301 A1* | 4/2021 | Park | G06T 1/0007 |
| 2021/0126035 A1* | 4/2021 | Roh | G02B 1/002 |
| 2022/0137424 A1 | 5/2022 | Lee et al. | |

FOREIGN PATENT DOCUMENTS

| | | |
|---|---|---|
| CN | 111095561 A | 5/2020 |
| JP | 2019184986 | 10/2019 |
| JP | 2022074093 A | 5/2022 |

OTHER PUBLICATIONS

Kudo et al., "Pigmented Photoresists for Color Filters," Journal of Photopolymer Science and Technology, 1996, 9(1):109-119.

* cited by examiner

*Primary Examiner* — Nilufa Rahim
(74) *Attorney, Agent, or Firm* — Fish & Richardson P.C.

(57) ABSTRACT

An optical element includes a transparent layer for covering a plurality of pixels each including a photoelectric conversion element, and a plurality of structure members disposed on the transparent layer or in the transparent layer, the structure members being arranged in a plane direction of the transparent layer. The plurality of structure members is arranged to condense light of colors corresponding to respective pixels of the plurality of pixels into the corresponding pixels, the light of the colors being of incident light.

14 Claims, 91 Drawing Sheets

OPTICAL ELEMENT, IMAGE SENSOR AND IMAGING DEVICE

CROSS-REFERENCE TO RELATED APPLICATIONS

This application is a National Stage application under 35 U.S.C. § 371 of International Application No. PCT/JP2020/044560, having an International Filing Date of Nov. 30, 2020. The disclosure of the prior application is considered part of the disclosure of this application, and is incorporated by reference in its entirety into this application.

TECHNICAL FIELD

The present invention relates to an optical element, an imaging device, and an imaging apparatus.

BACKGROUND ART

Some imaging devices include optical elements such as microlenses and color filters. Color filters are disclosed in Non Patent Literature 1, for example.

CITATION LIST

Non Patent Literature

Non Patent Literature 1: Takanori Kudo, Yuki Nanjo, Yuko Nozaki, Kazuya Nagao, Hidemasa Yamaguchi, Wen-Bing Kang, Georg Pawlowski, PIGMENTED PHOTORESISTS FOR COLOR FILTERS, Journal of Photopolymer Science and Technology, 1996, Vol. 9, No. 1, pp. 109-119, Aug. 4, 2006

SUMMARY OF INVENTION

Technical Problem

When two kinds of optical elements, which are microlenses and color filters, are used, the manufacturing costs become higher accordingly.

The present invention aims to lower the manufacturing costs.

Solution to Problem

An optical element according to the present invention characteristically includes: a transparent layer for covering a plurality of pixels each including a photoelectric conversion element; and a plurality of structure members disposed on the transparent layer or in the transparent layer, the structure members being arranged in a plane direction of the transparent layer. In the optical element, the plurality of structure members is arranged to condense light of colors corresponding to respective pixels of the plurality of pixels into the corresponding pixels, the light of the colors being of incident light.

An imaging device according to the present invention characteristically includes: the above optical element; and the plurality of pixels covered with the transparent layer.

An imaging apparatus according to the present invention characteristically includes: the above imaging device; and a signal processing unit configured to generate an image signal on a basis of an electrical signal obtained from the imaging device.

Advantageous Effects of Invention

According to the present invention, manufacturing costs can be lowered.

DESCRIPTION OF EMBODIMENTS

Figure 1:
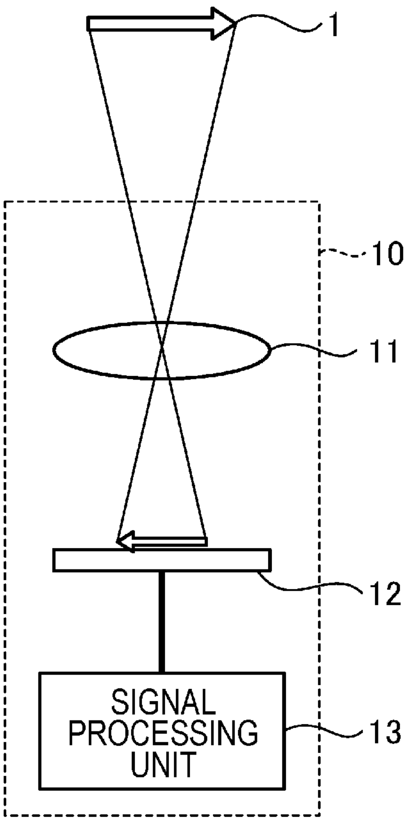
FIG. 1 is a diagram illustrating an example schematic configuration of an imaging device and an imaging apparatus in which an optical element according to an embodiment is used.

The following is a description of an embodiment of the present invention, with reference to the drawings. The shapes, sizes, positional relationships, and the like illustrated in the drawings are merely schematic, and do not limit the present invention. Like components are denoted by like reference numerals, and explanation of them will not be repeated more than once.

FIG. 1 is a diagram illustrating an example schematic configuration of an imaging device and an imaging apparatus in which an optical element according to an embodiment is used. An imaging apparatus 10 images an object 1, the incident light being light from the object 1 (subject) illustrated as an outlined arrow. The incident light enters an imaging device 12 via a lens optical system 11. A signal processing unit 13 processes an electrical signal from the imaging device 12, to generate an image signal.

FIGS. 2 to 5 are diagrams illustrating an example schematic configuration of an imaging device. In the drawings, an X-Y-Z coordinate system is shown. The X-Y plane direction corresponds to the plane direction of a pixel layer 3, a transparent layer 5, and the like, which will be described later. In the description below, a "planar view" means a view in a Z-axis direction (for example, in the negative Z-axis direction), unless otherwise specified. A "side view" means a view in an X-axis direction or a Y-axis direction (for example, the negative Y-axis direction).

The imaging device 12 includes a wiring layer 2, a pixel layer 3, and an optical element 4. The wiring layer 2, the pixel layer 3, and the optical element 4 are provided in this order in the positive Z-axis direction.

Figure 2:
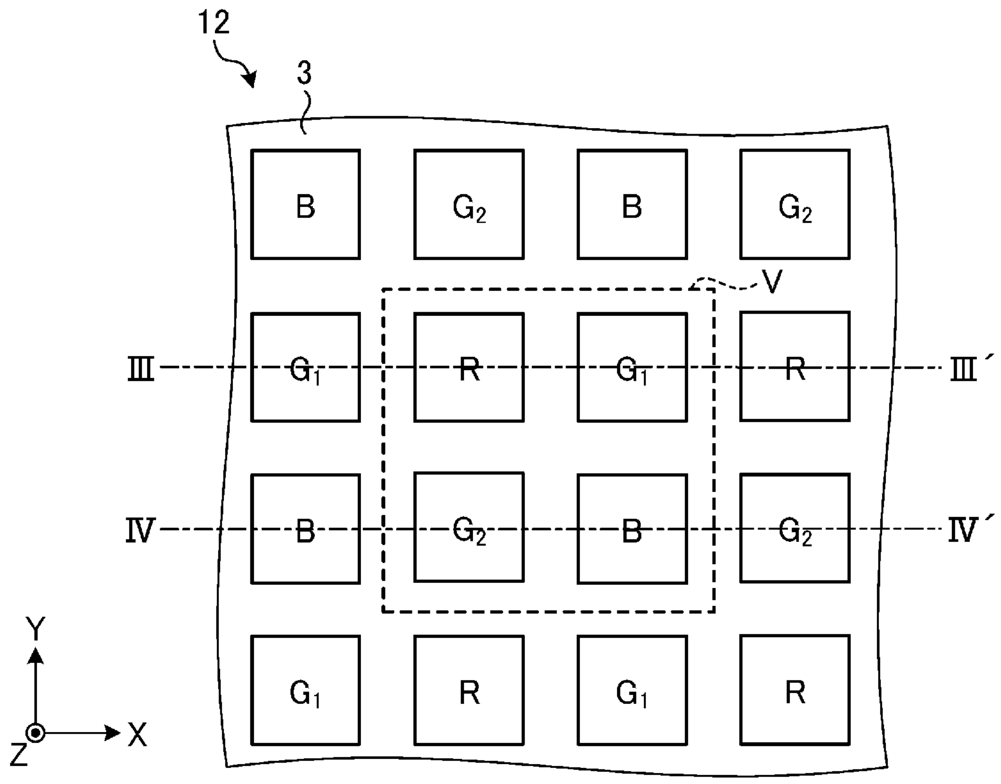
FIG. 2 is a diagram illustrating an example schematic configuration of an imaging device.

FIG. 2 schematically illustrates the layout of the pixel layer 3 in a planar view. The pixel layer 3 is a pixel array that includes a plurality of pixels arranged in the X-Y plane direction. Each pixel includes a photoelectric conversion element. An example of the photoelectric conversion element is a photodiode (PD). Each pixel corresponds to one of the colors of red (R), green (G), and blue (B). Where the wavelength is $\lambda_0$, an example of the wavelength band of red light is 600 nm<$\lambda_0$. An example of the wavelength band of green light is 500 nm<$\lambda_0$≤600 nm. An example of the wavelength band of blue light is $\lambda_0$≤500 nm. The respective pixels are referred to as a pixel R, a pixel $G_1$, a pixel $G_2$, and a pixel B, so as to be distinguishable by color. These four pixels R, $G_1$, $G_2$, and B are arranged in the Bayer array, and constitute one pixel unit (color pixel unit).

Figure 3:
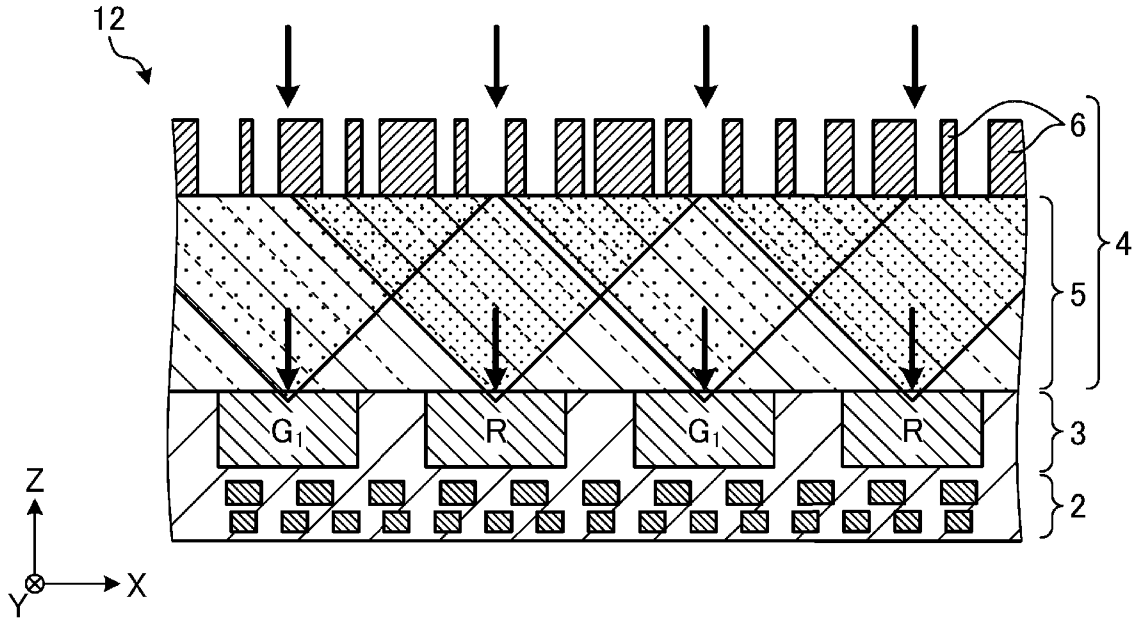
FIG. 3 is a diagram illustrating an example schematic configuration of an imaging device.
Figure 4:
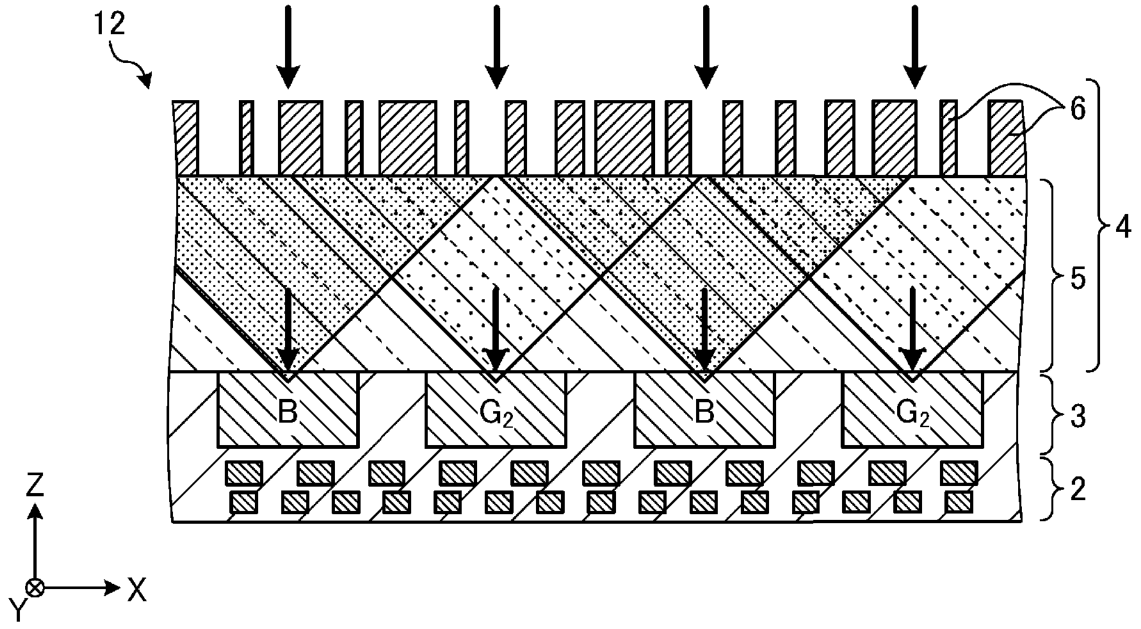
FIG. 4 is a diagram illustrating an example schematic configuration of an imaging device.

FIG. 3 illustrates an example cross-section of the imaging device 12 as viewed from a side along the line III-III' defined in FIG. 2. FIG. 4 illustrates an example cross-section of the imaging device 12 as viewed from a side along the line IV-IV' defined in FIG. 2. In the drawings, arrows schematically indicate light entering the imaging device 12. The light that has entered travels in the negative Z-axis direction, and reaches the pixel layer 3 via the optical element 4.

According to the principles described later, the optical element 4 condenses the red light of the incident light into the pixel R, condenses the green light into the pixel $G_1$ and the pixel $G_2$, and condenses the blue light into the pixel B. Electrical charges generated in the pixel R, the pixel $G_1$, the pixel $G_2$, and the pixel B are converted into an electrical signal serving as a basis of a pixel signal by a transistor or the like (not illustrated), and are output to the outside of the imaging device 12 via the wiring layer 2. Some of the wiring lines included in the wiring layer 2 are shown in the drawings.

The optical element 4 is provided so as to cover the pixel layer 3. An example of the optical element 4 is a meta-surface. The meta-surface includes a plurality of microstructure members (corresponding to the structure members 6 described later) having a width equal to or smaller than the wavelength of light. The meta-surface may have a two-dimensional structure, or may have a three-dimensional structure. It is possible to control the phase and the light intensity in accordance with the characteristics (wavelength, polarization, and incident angle) of light, simply by changing the parameters of the microstructure members. In the case of a three-dimensional structure, the degree of freedom in design is higher than that in a two-dimensional structure.

The optical element 4 has two functions, which are a color separation function and a lens function. The color separation function is a function (a spectral function, or a light separation function) of separating incident light into light beams of the respective colors (respective wavelength bands). The lens function is a function of condensing light beams of the respective colors into the corresponding pixels. In this example, incident light is separated into red light, green light, and blue light by the color separation function. By the lens function, the red light is condensed into the pixel R, the green light is condensed into the pixel $G_1$ and the pixel $G_2$, and the blue light is condensed into the pixel B.

The optical element 4 includes a transparent layer 5 and structure members 6. The transparent layer 5 is provided on the pixel layer 3 so as to cover the pixel layer 3. The transparent layer 5 may have a lower refractive index than the refractive index of the structure members 6. An example of the material of the transparent layer 5 is $SiO_2$ or the like. The transparent layer 5 may be a void. In that case, the refractive index of the transparent layer 5 may be equal to the refractive index of air. The material of the transparent layer 5 may be a single material, or may be a plurality of layered materials.

The plurality of structure members 6 is disposed on the transparent layer 5 or in the transparent layer 5, and is arranged in the plane direction (X-Y plane direction) of the transparent layer 5 in a periodic manner (with a periodic structure), for example. In this example, the structure members 6 are disposed on the transparent layer 5 on the opposite side (the positive Z-axis direction side) of the transparent layer 5 from the pixel layer 3. The plurality of structure members 6 may be arranged at regular intervals for ease of design or the like, or may be arranged at irregular intervals. Each structure member 6 is a nano-order-sized microstructure member having a dimension equal to or smaller than the wavelength of incident light.

Figure 5:
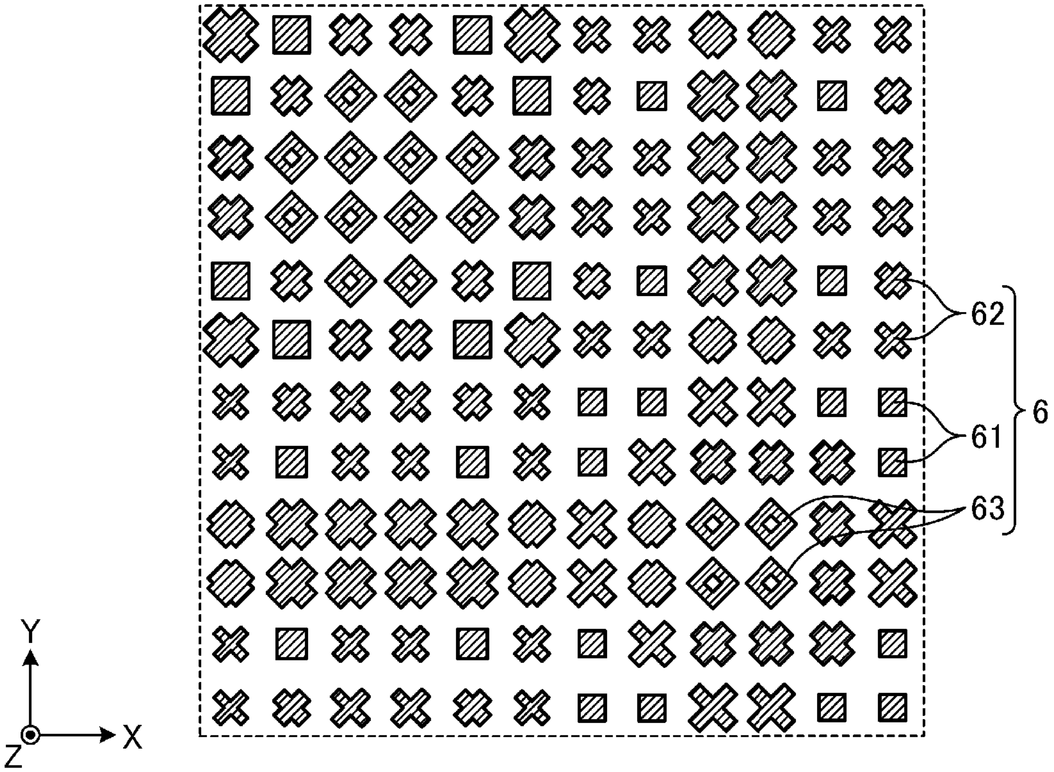
FIG. 5 is a diagram illustrating an example schematic configuration of an imaging device.

FIG. 5 schematically illustrates an example cross-section of the plurality of structure members 6 corresponding to the portion surrounded by a dashed line V in FIG. 2. The plurality of structure members 6 includes a plurality of structure members 61 (first structure members), a plurality of structure members 62 (second structure members), and a plurality of structure members 63 (third structure members). In a planar view, the plurality of structure members 61 each have the same type (first type) of cross-sectional shape. The same type of cross-sectional shape includes cross-sectional shapes having different dimensions (lengths, widths, and the like). Likewise, the plurality of structure members 62 each have the same type (second type) of cross-sectional shape. The plurality of structure members 63 each have the same type (third type) of cross-sectional shape. Each cross-sectional shape may be a four-fold rotationally symmetrical shape. Such a cross-sectional shape may include at least one of a square shape, a cross shape, and a circular shape, for example.

The structure members 61, the structure members 62, and the structure members 63 have different types of cross-sectional shapes. In the example illustrated in FIG. 5, the cross-sectional shape of a structure member 61 is a square shape. The cross-sectional shape of a structure member 62 is an X-like shape The X-like shape is an example of a shape including a cross shape, and is a shape formed by rotating a cross shape in a plane by 45°. The cross-sectional shape of a structure member 63 is a hollow rhombic shape. The hollow rhombic shape is an example of a shape including a square shape, and is a shape formed by rotating a hollow square shape in a plane by 45°.

Note that, if a shape rotated in a plane by 45°, such as an X-like shape or a rhombic shape, is adopted, the optical coupling between adjacent structure members becomes weaker. Accordingly, the optical characteristics of each structure member are easily maintained without being affected by the adjacent structure members. As a result, an ideal phase delay amount distribution that will be described later can be easily reproduced.

In a case where the pixel R, the pixel $G_1$, the pixel $G_2$, and the pixel B are arranged in a Bayer array as described above, the plurality of structure members 6 disposed in the region facing the pixel $G_1$ (or the pixel $G_2$) has an overall layout structure that is formed by rotating the overall layout structure of the plurality of structure members 6 disposed in the region facing the pixel $G_2$ (or the pixel $G_1$) by 90°, as can be seen from a comparison between FIGS. 2 and 5. This is because the layout of the adjacent pixel R and pixel B differ between the pixel $G_1$ and the pixel $G_2$. As the overall layout structures of the structure members 6 above the pixel $G_1$ are the same as those above the pixel $G_2$ except for being rotated 90°, it is possible to efficiently condense light even in a complicated color layout such as a Bayer array.

Figure 6:
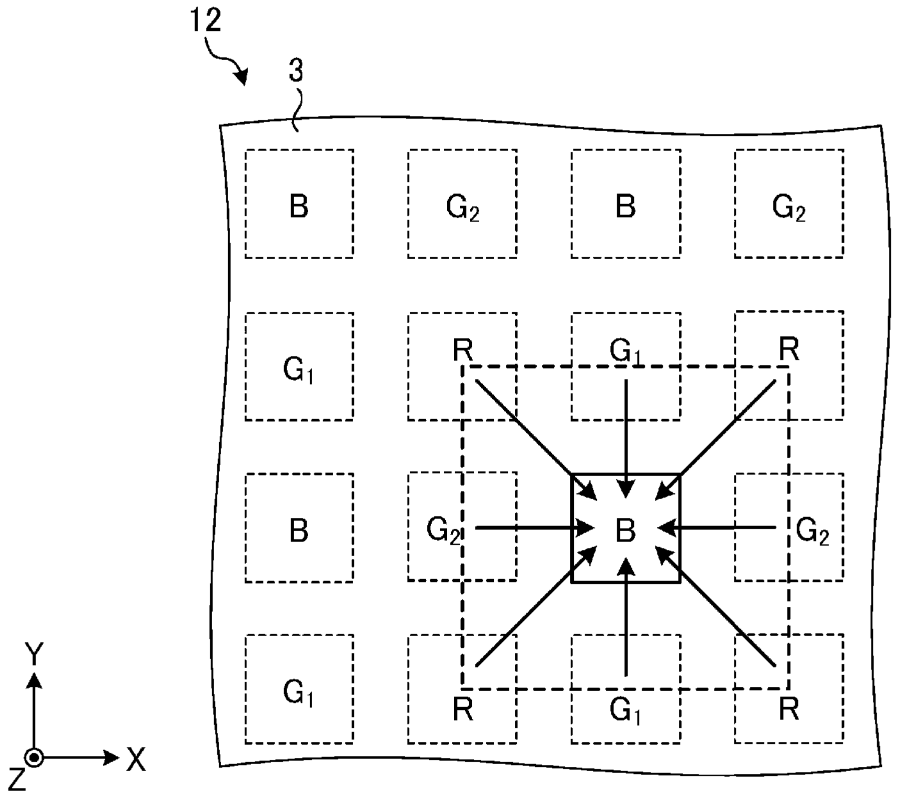
FIG. 6 is a diagram schematically illustrating light condensing into the corresponding pixel.
Figure 7:
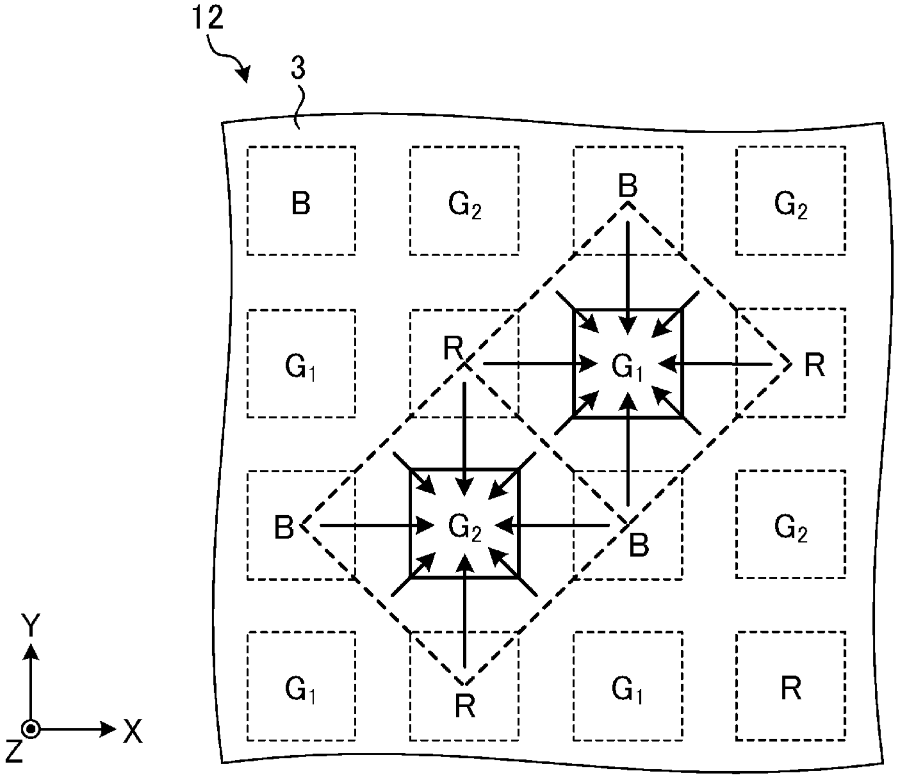
FIG. 7 is a diagram schematically illustrating light condensing into the corresponding pixel.
Figure 8:
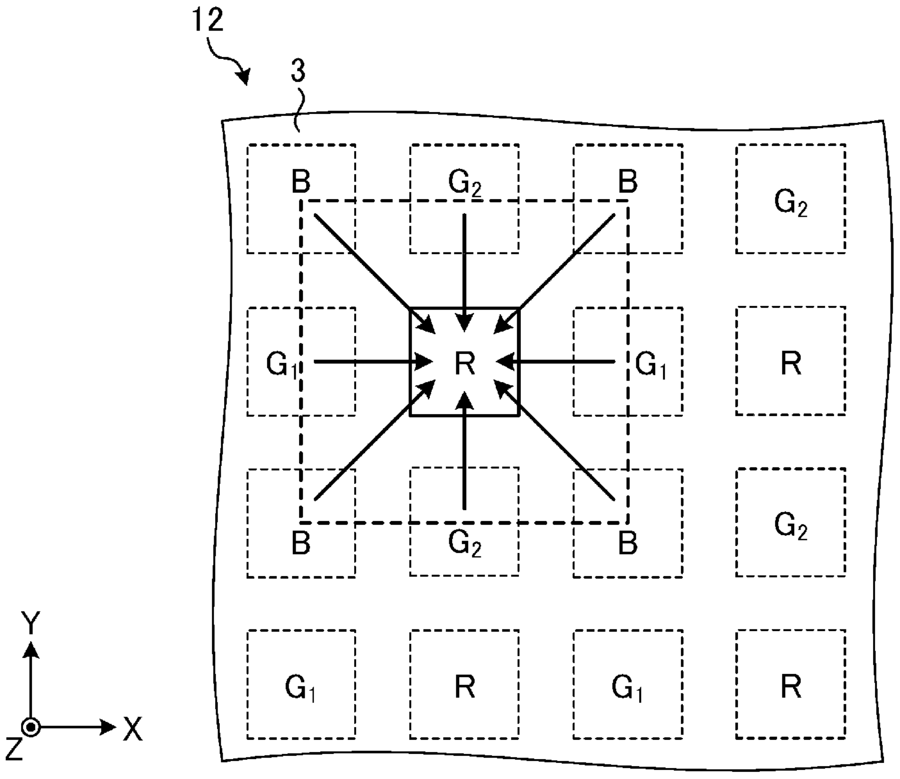
FIG. 8 is a diagram schematically illustrating light condensing into the corresponding pixel.

FIGS. 6 to 8 are diagrams schematically illustrating light condensing into the corresponding pixel. As indicated by arrows in FIG. 6, blue light is condensed into the pixel B. In this example, not only the light above the pixel B (in the positive Z-axis direction) but also the light above the pixels around the pixel B is condensed into the pixel B. That is, the plurality of structure members 6 (FIGS. 3 to 5) is disposed so that, of the light that has entered the outside of the region facing the pixel B, the light of the color corresponding to the pixel B is condensed into the pixel B. Thus, the amount of received light can be made larger than that in a case where only the light that has entered the region facing the pixel B is condensed into the pixel B.

As indicated by arrows in FIG. 7, green light is condensed into the pixel $G_1$ and the pixel $G_2$. In this example, not only the light above the pixel $G_1$ and the pixel $G_2$ but also the light above the pixels around the pixel $G_1$ and the pixel $G_2$ is condensed into the pixel $G_1$ and the pixel $G_2$. That is, the plurality of structure members 6 is disposed so that, of the light that has entered the outside of the regions facing the pixel $G_1$ and the pixel $G_2$, the light of the color corresponding to the pixel $G_1$ and the pixel $G_2$ is condensed into the pixel $G_1$ and the pixel $G_2$. Thus, the amount of received light can be made larger than that in a case where only the light that has entered the regions facing the pixel $G_1$ and the pixel $G_2$ is condensed into the pixel $G_1$ and the pixel $G_2$.

As indicated by arrows in FIG. 8, red light is condensed into the pixel R. In this example, not only the light above the pixel R but also the light above the pixels around the pixel R is condensed into the pixel R. That is, the plurality of structure members 6 is disposed so that, of the light that has entered the outside of the region facing the pixel R, the light of the color corresponding to the pixel R is condensed into the pixel R. Thus, the amount of received light can be made larger than that in a case where only the light that has entered the region facing the pixel R is condensed into the pixel R.

Figure 9:
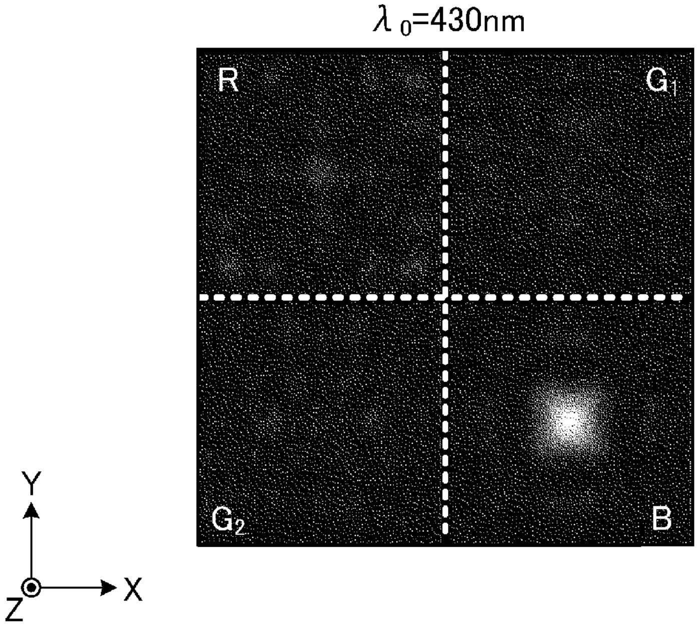
FIG. 9 is a diagram illustrating an example of a light intensity distribution on pixels at the respective wavelengths.
Figure 10:
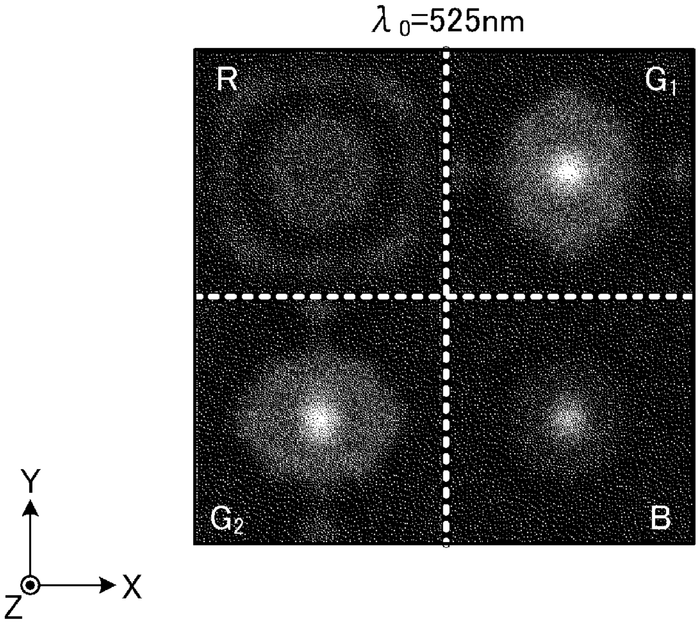
FIG. 10 is a diagram illustrating an example of a light intensity distribution on pixels at the respective wavelengths.
Figure 11:
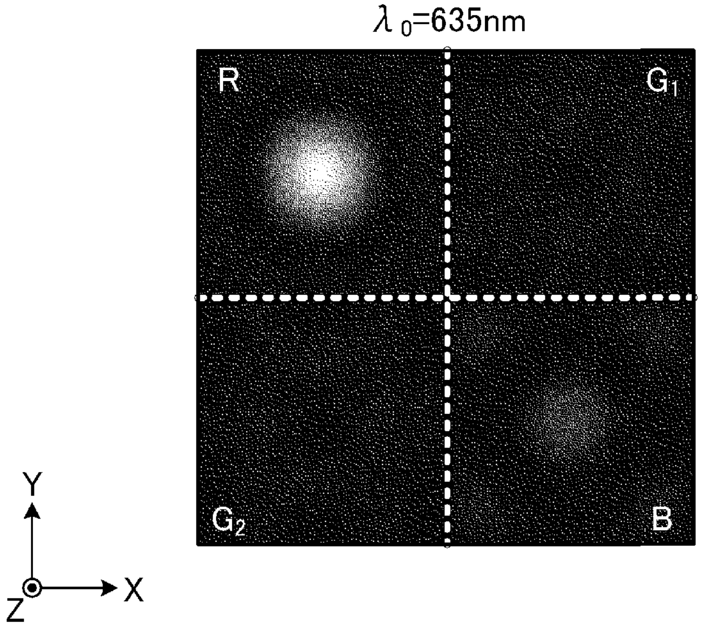
FIG. 11 is a diagram illustrating an example of a light intensity distribution on pixels at the respective wavelengths.

FIGS. 9 to 11 illustrate examples of the light intensity distributions (examples of calculation results) for each wavelength. A portion with a high light intensity is shown brightly. As illustrated in FIG. 9, blue light (wavelength $\lambda_0$=430 nm in this example) is distributed while concentrating in the pixel B. As illustrated in FIG. 10, green light (wavelength $\lambda_0$=525 nm in this example) is distributed while concentrating in the pixel $G_1$ and the pixel $G_2$. As illustrated in FIG. 11, red light (wavelength $\lambda_0$=635 nm in this example) is distributed while concentrating in the pixel R.

Figure 12:
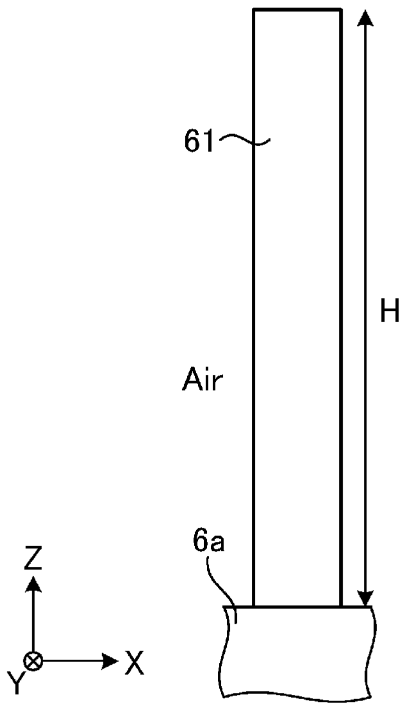
FIG. 12 is a diagram illustrating an example schematic configuration of a structure member.
Figure 13:
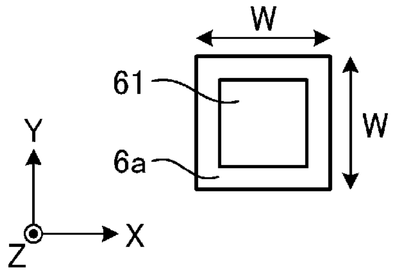
FIG. 13 is a diagram illustrating an example schematic configuration of a structure member.
Figure 14:
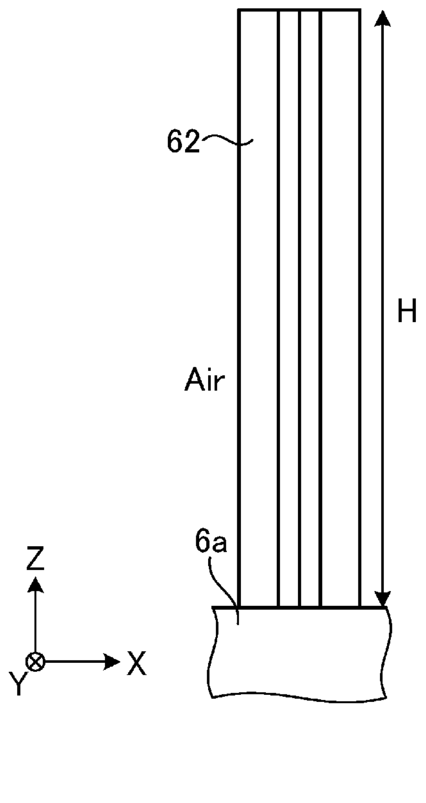
FIG. 14 is a diagram illustrating an example schematic configuration of a structure member.
Figure 15:
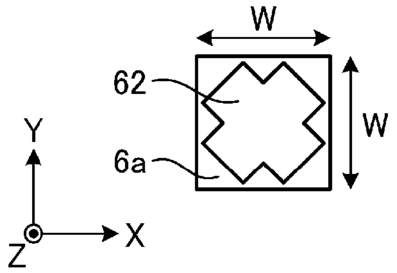
FIG. 15 is a diagram illustrating an example schematic configuration of a structure member.
Figure 16:
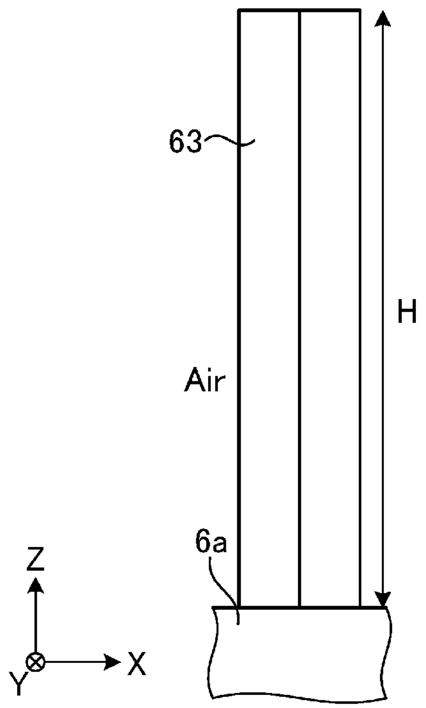
FIG. 16 is a diagram illustrating an example schematic configuration of a structure member.
Figure 17:
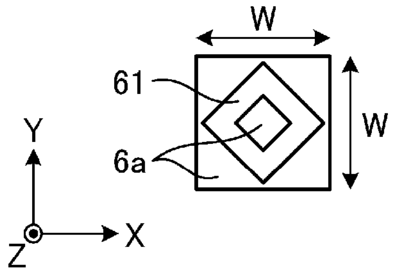
FIG. 17 is a diagram illustrating an example schematic configuration of a structure member.

FIGS. 12 to 17 are diagrams illustrating an example schematic configuration of a structure member. FIGS. 12 and 13 illustrate example schematic configurations of a structure member 61 in a side view and a planar view. FIGS. 14 and 15 illustrate example schematic configurations of a structure member 62 in a side view and a planar view. FIGS. 16 and 17 illustrate example schematic configurations of a structure member 63 in a side view and a planar view. Hereinafter, the structure member 61, the structure member 62, and the structure member 63 will be referred to simply as "the structure members 61 and the like" in some cases.

Each of the structure members 61 and the like is a columnar structure member extending in a Z-axis direction, and is formed on a base portion 6*a*. An example of the material of the columnar structure members is $TiO_2$ (the refractive index being 2.40) or SiN (the refractive index being 2.05). The base portions 6*a* constitute a transparent layer below the columnar structure member. Each base portion 61*a* is part of a $SiO_2$ substrate (the refractive index being 1.45), for example. Air exists on the sides and the upper side of each of the structure members 61 and the like.

The width of the base portion 6*a* corresponding to each of the structure members 61 and the like is referred to and shown as the width W. The width W of each base portion 6*a* defines the layout cycles of the structure members 61 and the like. The width W may be set to $W \leq (\lambda_{min}/n_2)$ so that diffracted light is not generated on the transmission side. $\lambda_{min}$ represents the shortest wavelength in the wavelength band of the light reception target, and is 410 nm, for example. $n_2$ represents the refractive index of the base portions 6*a*, and $n_2$=1.45 in a case where the base portions 6*a* are formed with $SiO_2$. An example of the width W (the layout cycle of each of the structure members 61 and the like) is 280 nm.

The height (the length in a Z-axis direction) of each of the structure members 61 and the like in a side view is referred to and shown as the height H. The heights H of the structure members 61 and the like may be the same. The height H may be set to $H \geq \lambda_r/(n_1-n_0)$ so that the structure members 61 and the like can give an optical phase delay amount (a phase value) of 2Π or larger to incident light, which is light traveling in the Z-axis direction. The wavelength $\lambda_r$ is a desired center wavelength in the wavelength band on the longest wavelength side among the wavelength bands of light to be subjected to color separation. $n_1$ represents the refractive index of the structure members 61 and the like. In a case where the structure members 61 and the like are formed with $TiO_2$, $n_1$=2.40, and the height H is 1250 nm, for example. In a case where the structure members 61 and the like are formed with SiN, $n_1$=2.05, and the height H is 1600 nm, for example.

The cross-sectional shapes of the structure members 61 and the like are designed (including the dimensional design), so that various combinations capable of giving different optical phase delay amounts to light of the respective colors (light of the respective wavelengths) can be obtained. As various cross-sectional shapes are designed, the number of combinations increases, and the degree of freedom in design becomes even higher.

Figure 18:
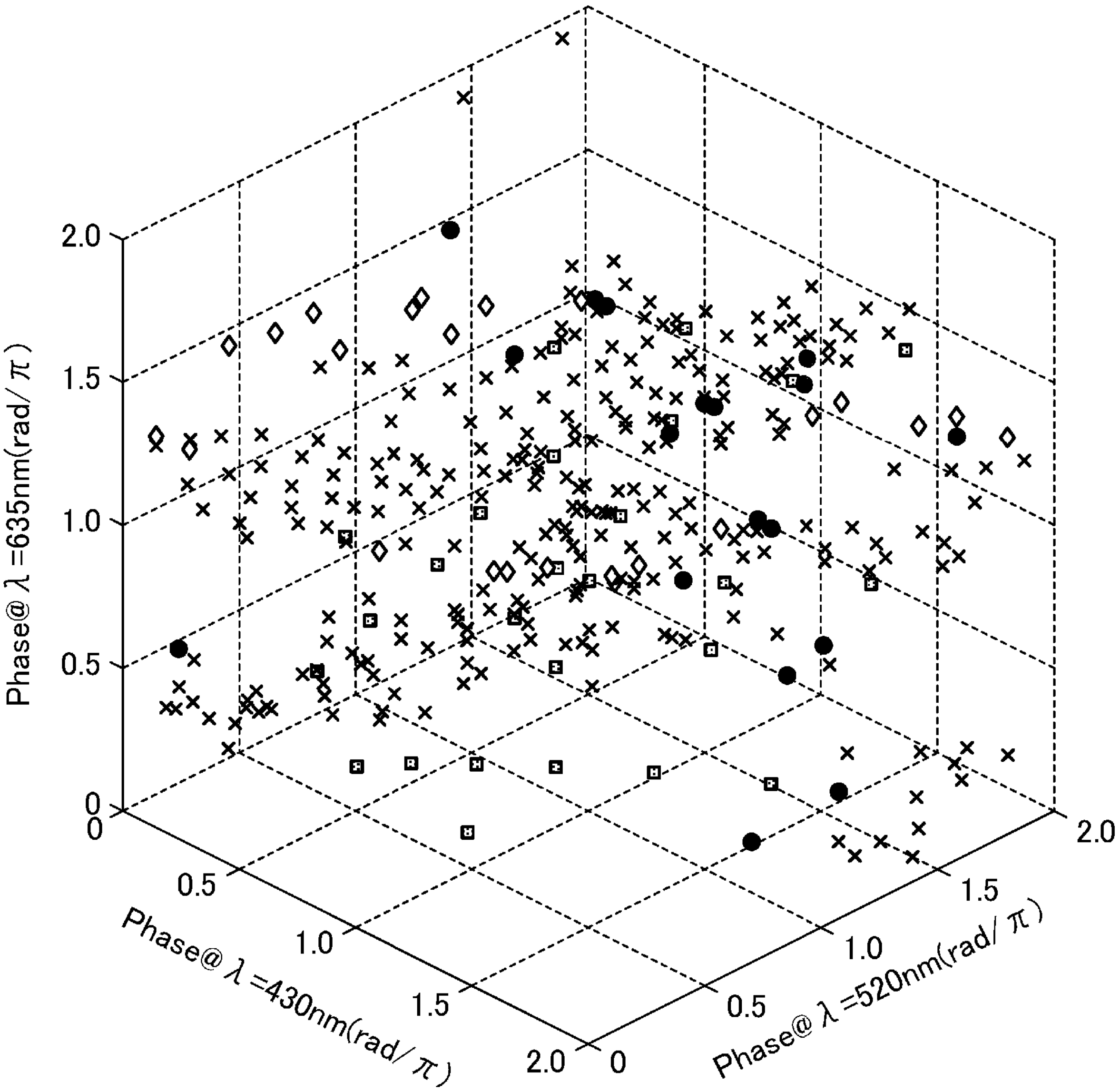
FIG. 18 is a diagram illustrating an example of combinations of the respective wavelengths and optical phase delay amounts.
Figure 19:
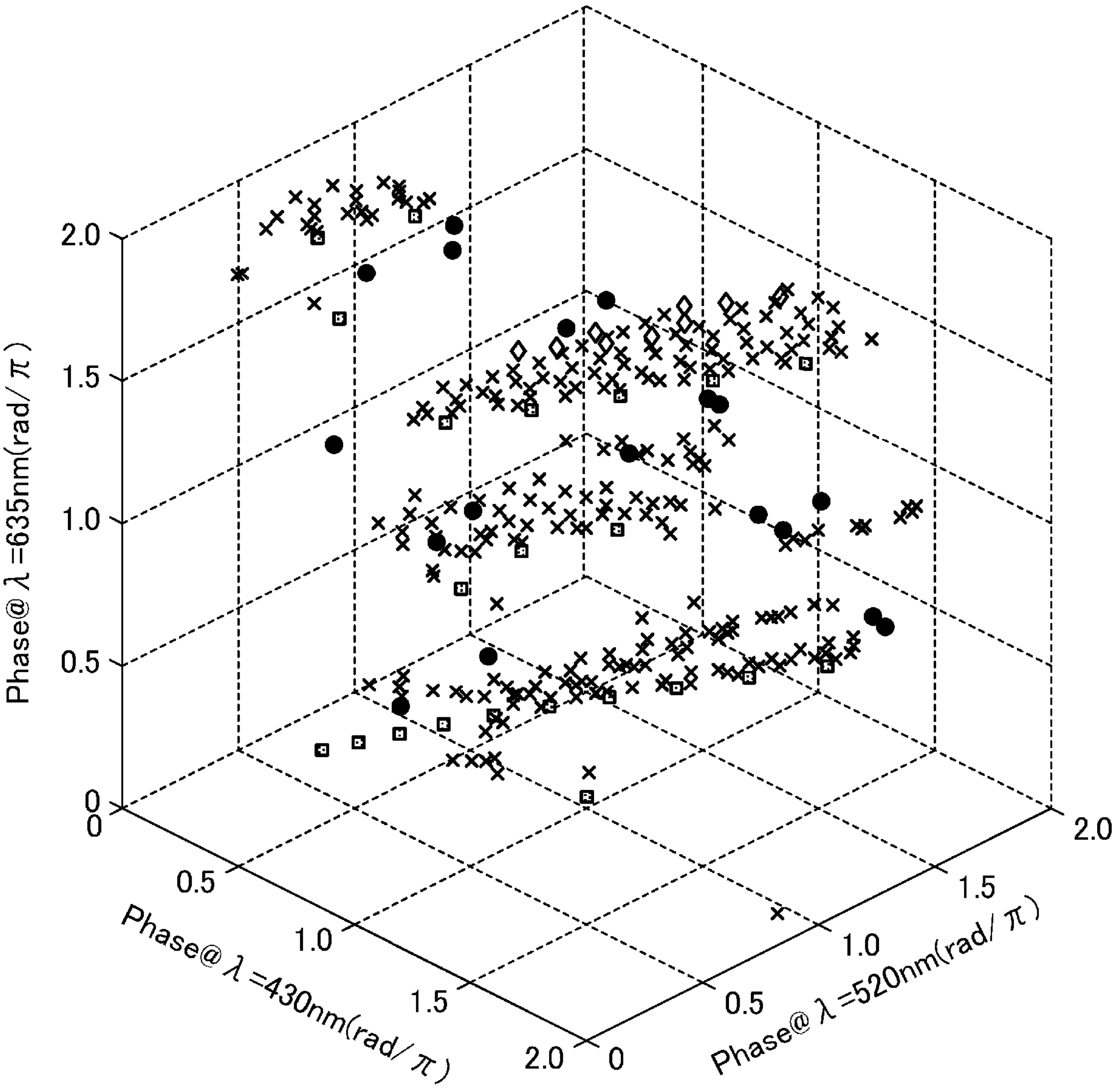
FIG. 19 is a diagram illustrating an example of combinations of the respective wavelengths and optical phase delay amounts.

FIGS. 18 and 19 are diagrams illustrating examples of combinations of the respective wavelengths and optical phase delay amounts. As an example of blue light, an optical phase delay amount (Phase@λ=430 nm (rad/Π)) for light having a wavelength of 430 nm is shown. As an example of green light, an optical phase delay amount (Phase@λ=520 nm (rad/Π)) for light having a wavelength of 520 nm is shown. As an example of red light, an optical phase delay amount (Phase@λ=635 nm (rad/n)) for light having a wavelength of 635 nm is shown.

The square plots indicate the optical phase delay amounts when the dimensions of the cross-sectional shapes of the structure members 61 each having a square cross-sectional shape are set to various values. The X-like plots indicate the optical phase delay amounts when the dimensions of the cross-sectional shapes of the structure members 62 each having an X-like cross-sectional shape are set to various values. The rhombic plots indicate the optical phase delay amounts when the dimensions of the cross-sectional shapes of the structure members 63 each having a hollow rhombic cross-sectional shape are set to various values. In any of these cases, the heights H are the same. The black circle plots indicate ideal optical phase delay amounts in the lens designs that will be described later.

FIG. 18 illustrates the optical phase delay amounts in a case where the structure members 61 and the like are formed with $TiO_2$. FIG. 19 illustrates the optical phase delay amounts in a case where the structure members 61 and the like are formed with SiN. As can be seen from the drawings, by designing the cross-sectional shapes of the structure members 61 and the like, it is possible to obtain various combinations of light of the respective colors (light of the respective wavelengths) and optical phase delay amounts. That is, simply by using columnar structure members having the same height H, it is possible to obtain optical phase delay amount characteristics (phase characteristics) having various wavelength dispersions. This is because the optical waveguide mode and the optical resonance mode to be generated, and the wavelength dispersion characteristics of the optical phase delay amounts to be generated by the optical waveguide mode and the optical resonance mode can change with cross-sectional shapes.

On the basis of the above principles, it is possible to achieve a lens function having a condensing point different for each wavelength, by designing the cross-sectional shapes and the layout of the structure members 61 and the like arranged in the plane direction of the transparent layer 5. Note that lens designing is possible not only in a case where the number of wavelengths is three but also in a case where the number of wavelengths is two or four or even more.

Examples of lens designing are now described with reference to FIGS. 20 to 39. In lens designing, the cross-sectional shapes and the layout of the structure members 61 and the like are designed so as to achieve an ideal optical phase delay amount distribution (a phase distribution). In the examples described below, the cross-sectional shapes and the layout of the structure members 61 and the like are designed in accordance with an ideal optical phase delay amount distribution for each center wavelength of the wavelength bands of red light, green light, and blue light. The size of a pixel is 1.68 μm×1.68 μm. The focal length is 4.2 μm. The center wavelength corresponding to blue light is 430 nm. The center wavelength corresponding to green light is 520 nm. The center wavelength corresponding to red light is 635 m.

Where an ideal optical phase delay amount distribution is φ, φ is expressed by the following equation.

[Expression 1]

$$\varphi(x, y) = -\frac{2\pi}{\lambda_d} n_2\left(\sqrt{(x-x_f)^2+(y-y_f)^2+z_f^2} - \sqrt{x_f^2+y_f^2+z_f^2}\right) + C \quad (1)$$

In the above Equation (1), $\lambda_d$ represents the center wavelength (designed wavelength). $X_f$, $Y_f$, and $Z_f$ represent condensing positions. $n_2$ represents the refractive index of the base portion 6*a*. C is an arbitrary constant.

The ideal optical phase delay amount distribution is a phase distribution that gives the condensing positions defined below to a pixel B, a pixel $G_1$, a pixel $G_2$, and a pixel R. Note that the center position among the four pixels (a pixel unit) correspond to x=0 and y=0.

Pixel B: $X_f$=+0.84 μm, $y_f$=−0.84 μm, $Z_f$=4.2 μm

Pixel $G_1$: $X_f$=+0.84 μm, $y_f$=+0.84 μm, $Z_f$=4.2 μm

Pixel $G_2$: $X_f$=−0.84 μm, $y_f$=−0.84 μm, $Z_f$=4.2 μm

Pixel R: $X_f$=−0.84 μm, $y_f$=+0.84 μm, $Z_f$=4.2 μm

Here, φ is converted so as to fall within the range of 0 to 2Π. For example, −0.5Π and 2.5Π are converted into 1.5n and 0.5Π, respectively. The boundary regions of the optical phase delay amount distribution at each center wavelength is set so that the optical phase delay amount distribution (including the adjacent lenses) is horizontally and vertically symmetrical about the condensing position. The constant C may be optimized so that the error (the difference from the ideal value) of the optical phase delay amount distribution is minimized at each wavelength. From the optical phase delay amount at each wavelength, a structure most suitable for the optical phase delay amount distribution at each center wavelength (a structure with the smallest error) is disposed at the corresponding position.

Figure 20:
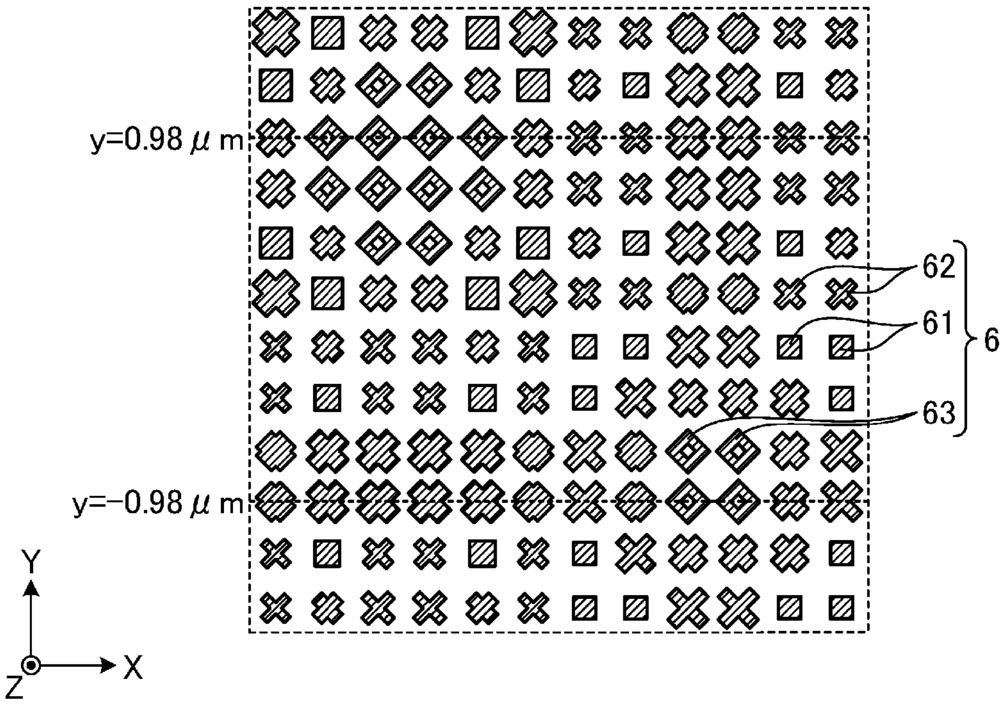
FIG. 20 is a diagram illustrating an example lens design.

FIGS. 20 to 29 illustrate examples of lens designing in a case where the structure members 61 and the like are formed with $TiO_2$. As illustrated in FIG. 20, a plurality of structure members 61 and the like is disposed. The center position among the illustrated structure members 61 and the like corresponds to x=0 and y=0.

Figure 21:
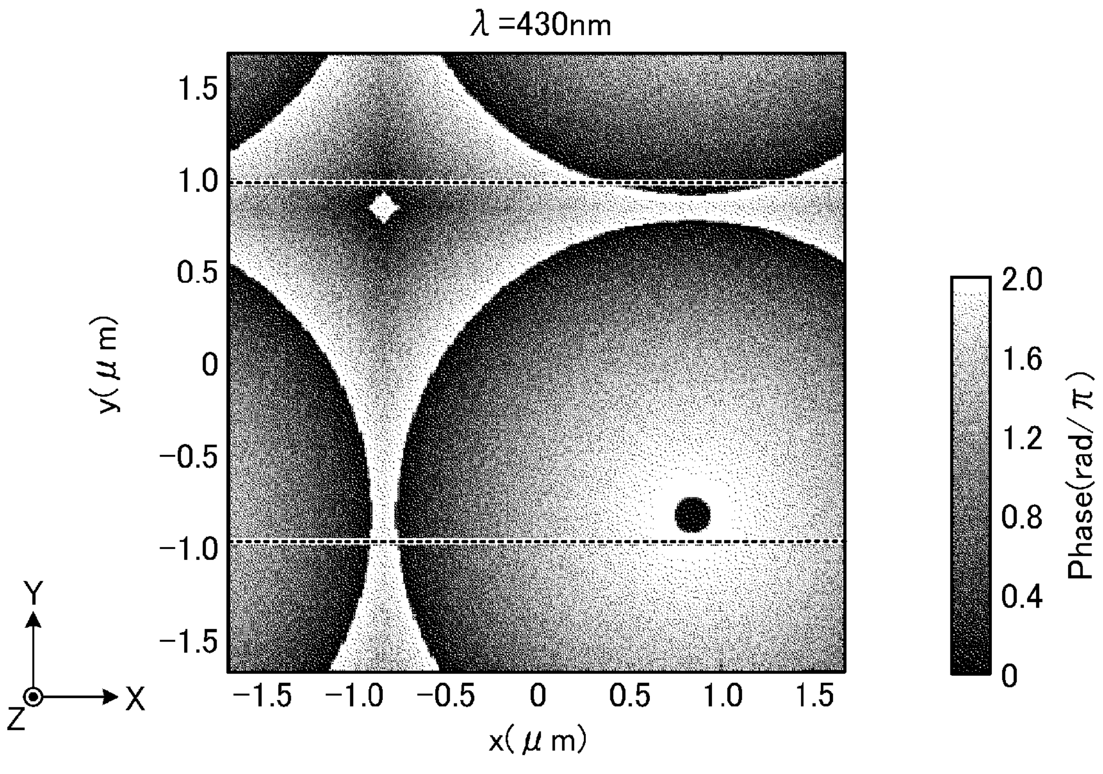
FIG. 21 is a diagram illustrating an example lens design.
Figure 22:
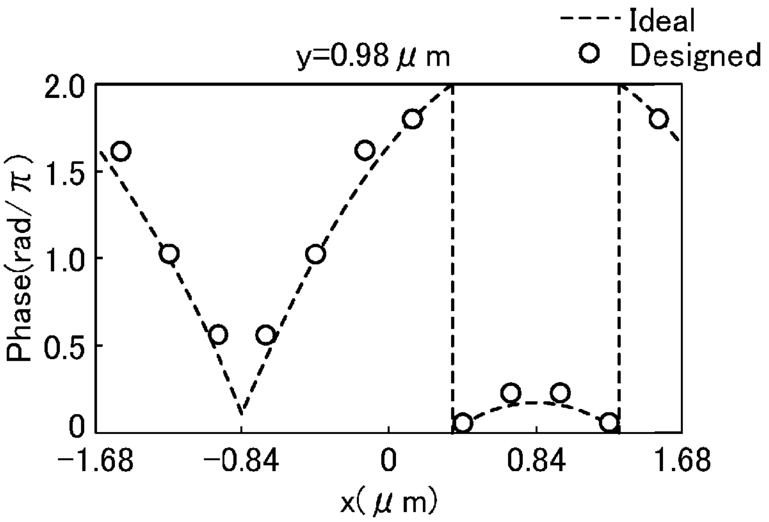
FIG. 22 is a diagram illustrating an example lens design.
Figure 23:
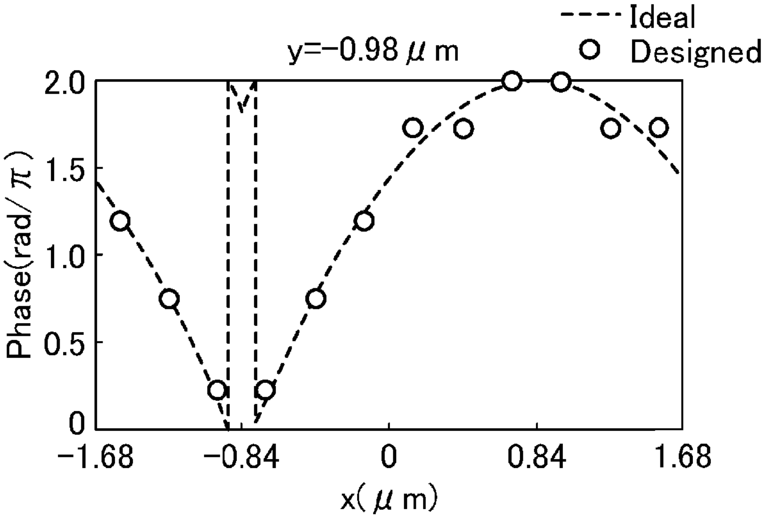
FIG. 23 is a diagram illustrating an example lens design.

FIG. 21 illustrates an ideal optical phase delay amount distribution (Phase (rad/Π)) in a case where the center wavelength is 430 nm (blue light). FIG. 22 illustrates an example of an optical phase delay amount distribution in the X-axis direction at y=0.98 μm. FIG. 23 illustrates an example of an optical phase delay amount distribution in the X-axis direction at y=−0.98 μm. A dashed line (Ideal) indicates an ideal optical phase delay amount distribution, and plots (Designed) indicate an optical phase delay amount distribution obtained with the layout of the plurality of the structure members 61 and the like illustrated in FIG. 20 described above.

Figure 24:
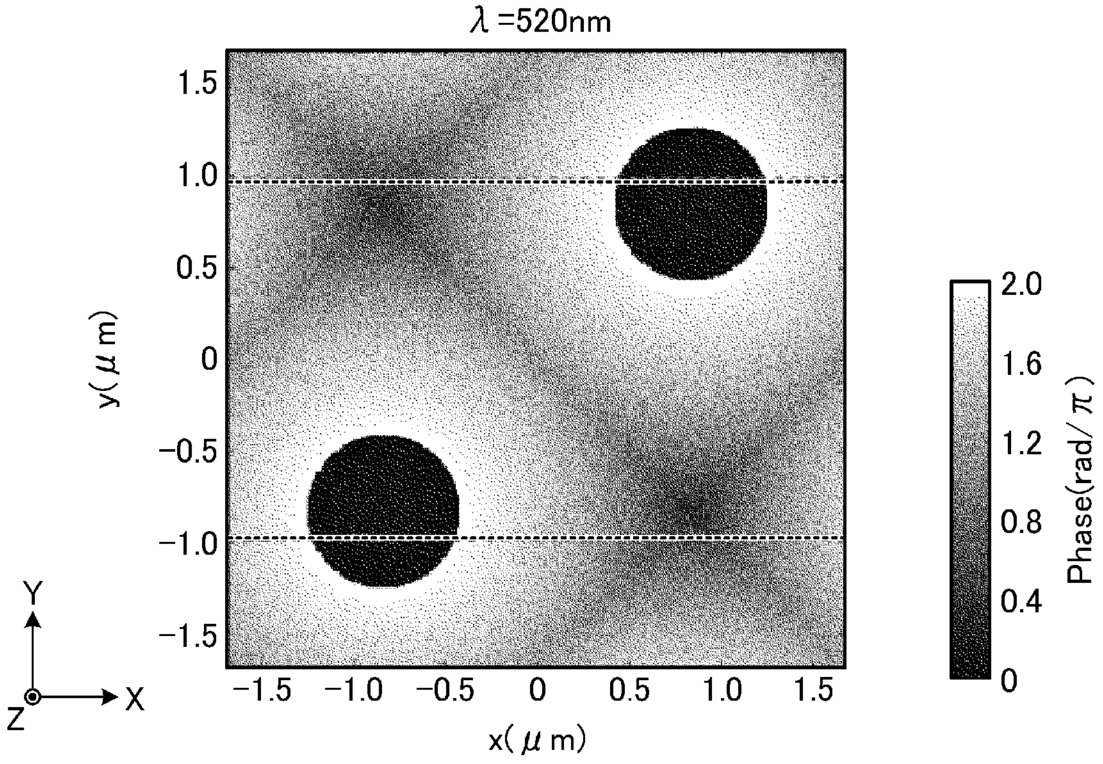
FIG. 24 is a diagram illustrating an example lens design.
Figure 25:
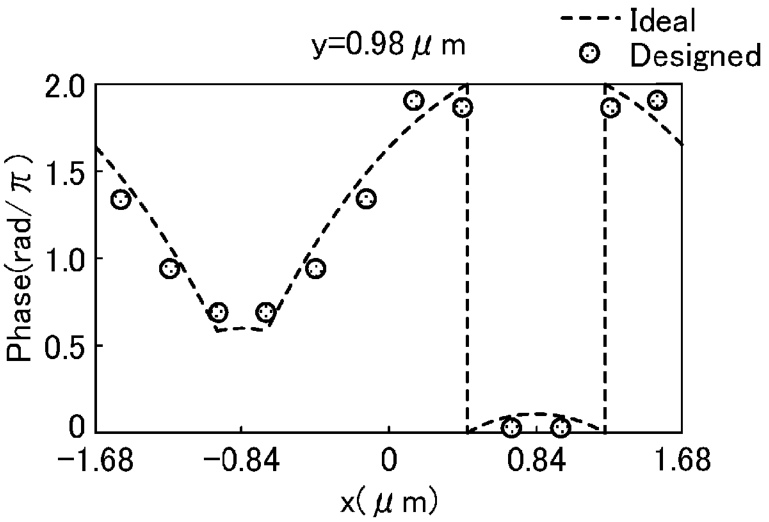
FIG. 25 is a diagram illustrating an example lens design.
Figure 26:
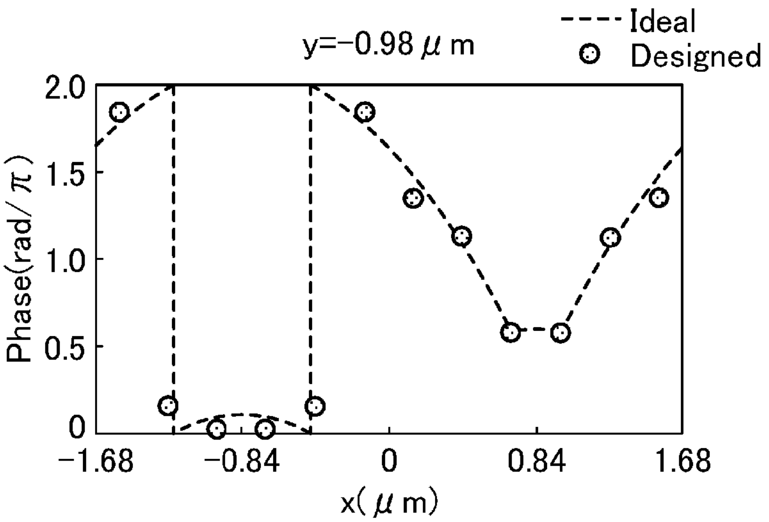
FIG. 26 is a diagram illustrating an example lens design.

FIG. 24 illustrates an ideal optical phase delay amount distribution in a case where the center wavelength is 520 nm (green light). FIG. 25 illustrates an example of an optical phase delay amount distribution in the X-axis direction at y=0.98 μm. FIG. 26 illustrates an example of an optical phase delay amount distribution in the X-axis direction at y=−0.98 μm.

Figure 27:
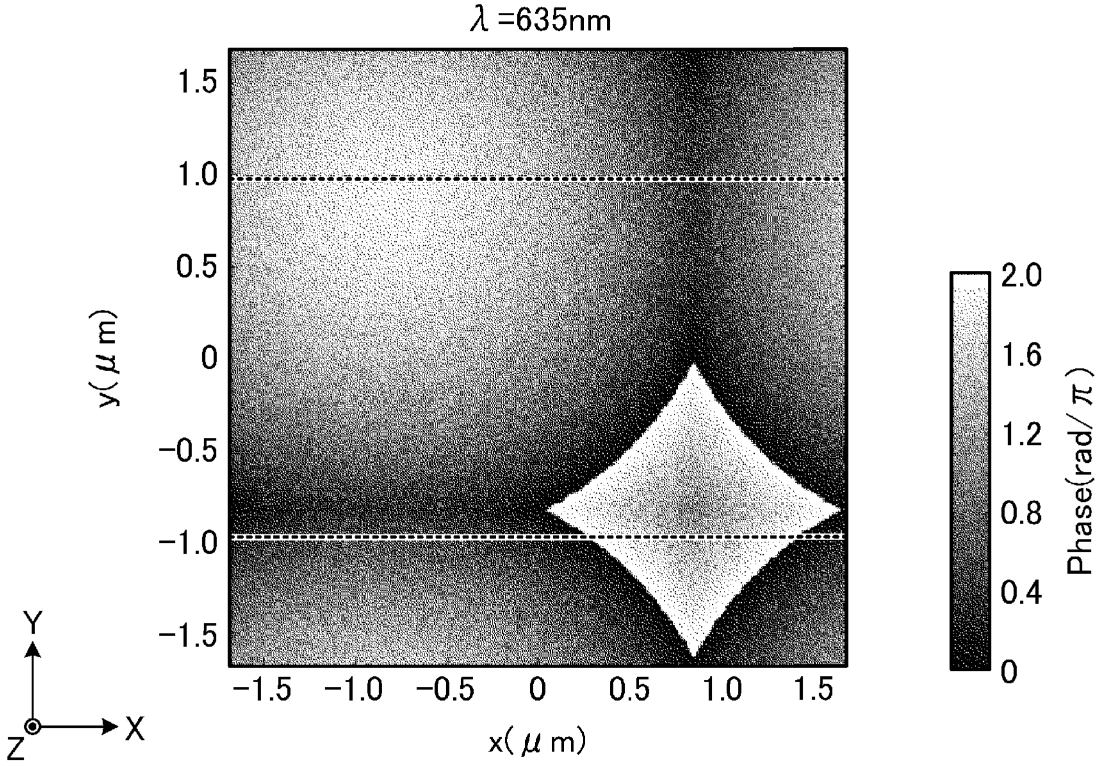
FIG. 27 is a diagram illustrating an example lens design.
Figure 28:
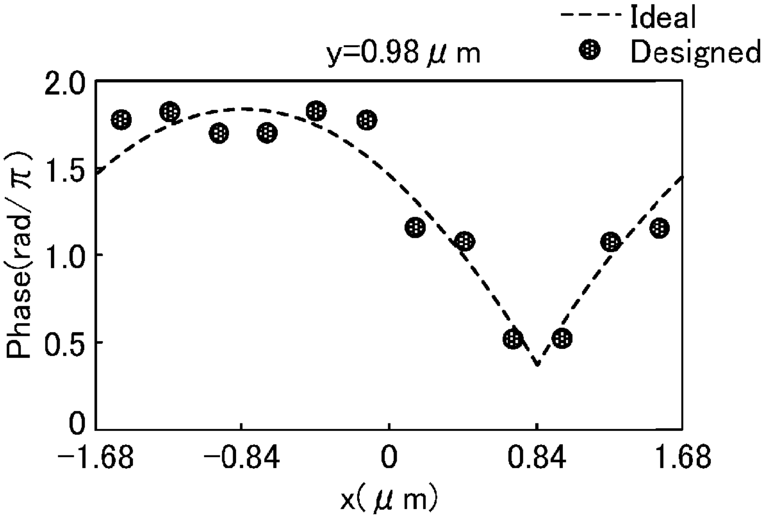
FIG. 28 is a diagram illustrating an example lens design.
Figure 29:
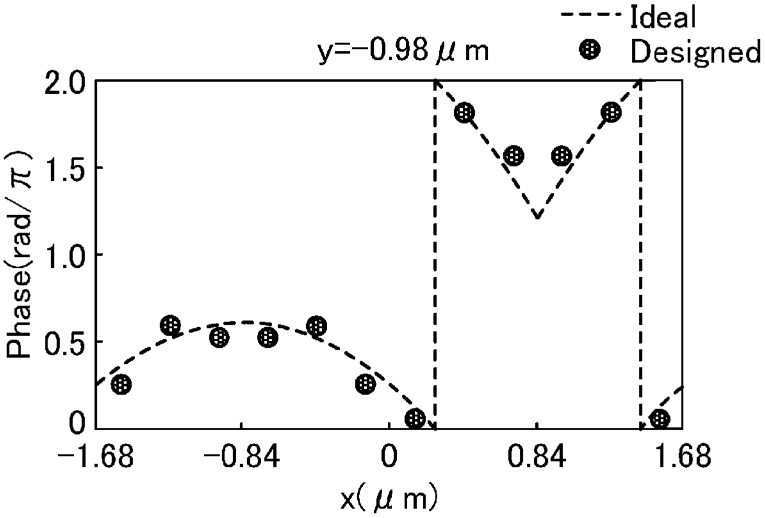
FIG. 29 is a diagram illustrating an example lens design.

FIG. 27 illustrates an ideal optical phase delay amount distribution in a case where the center wavelength is 635 nm (red light). FIG. 28 illustrates an example of an optical phase delay amount distribution in the X-axis direction at y=0.98 μm. FIG. 29 illustrates an example of an optical phase delay amount distribution in the X-axis direction at y=−0.98 μm.

As can be seen from the above, an optical phase delay amount distribution close to an ideal one is obtained at any of the center wavelengths of 430 nm, 520 nm, and 635 nm (blue light, green light, and red light).

Figure 30:
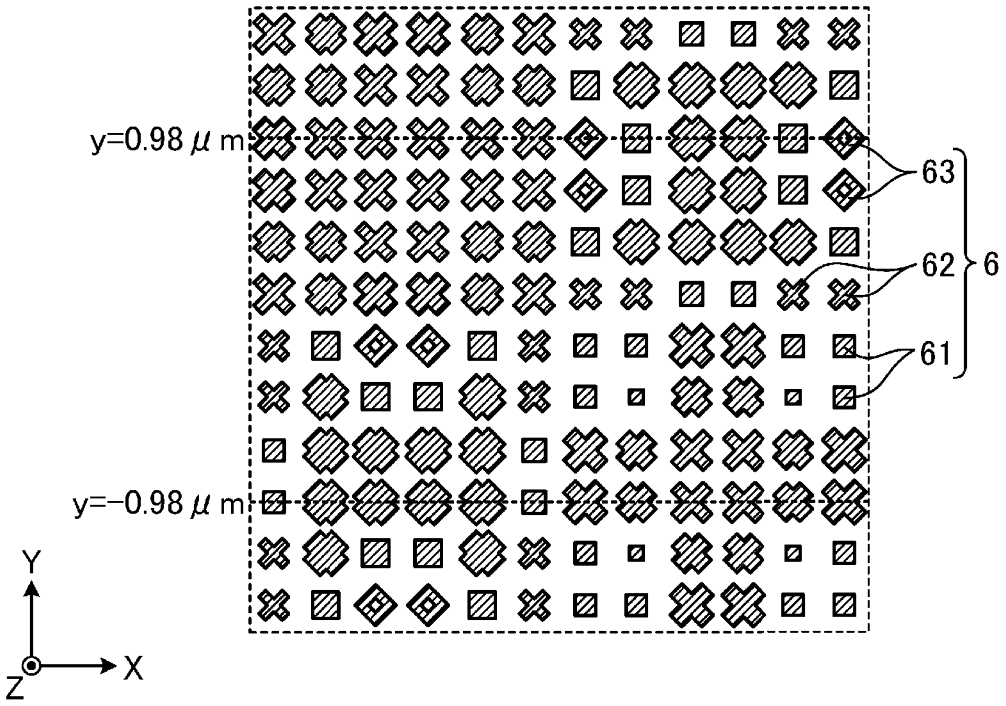
FIG. 30 is a diagram illustrating an example lens design.

FIGS. 30 to 39 illustrate examples of lens designing in a case where the structure members 61 and the like are formed with SiN. As illustrated in FIG. 30, a plurality of structure members 61 and the like is disposed.

Figure 31:
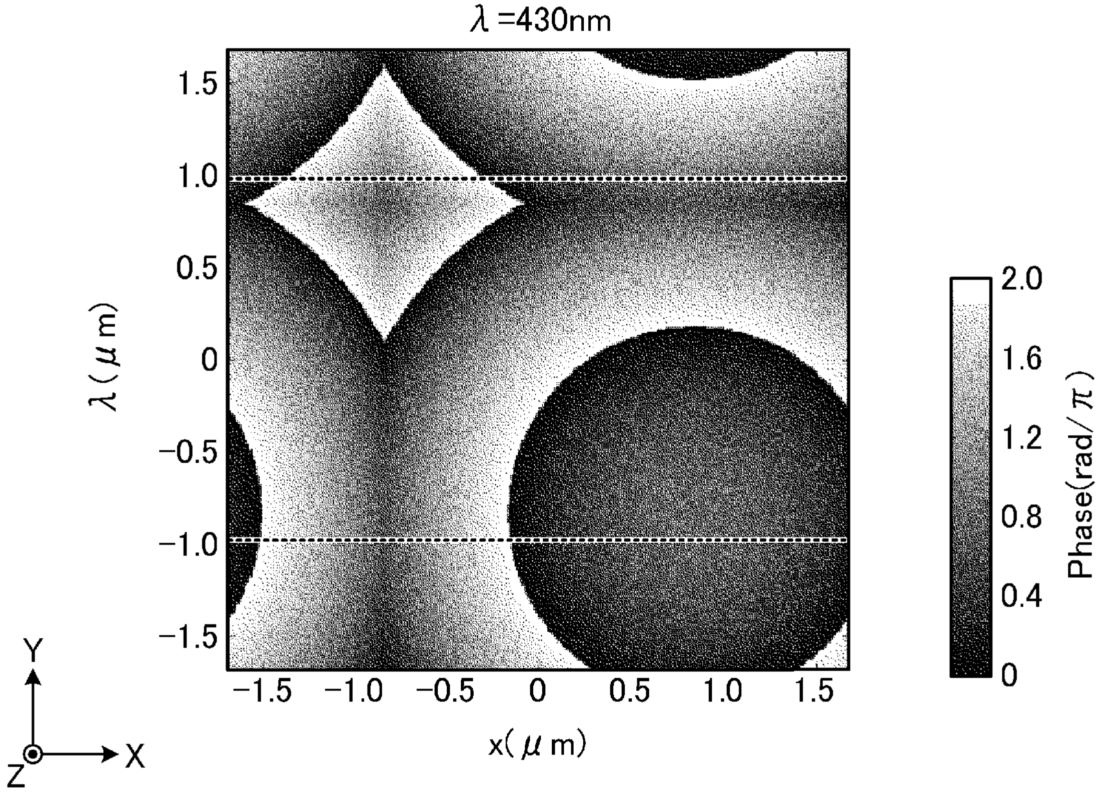
FIG. 31 is a diagram illustrating an example lens design.
Figure 32:
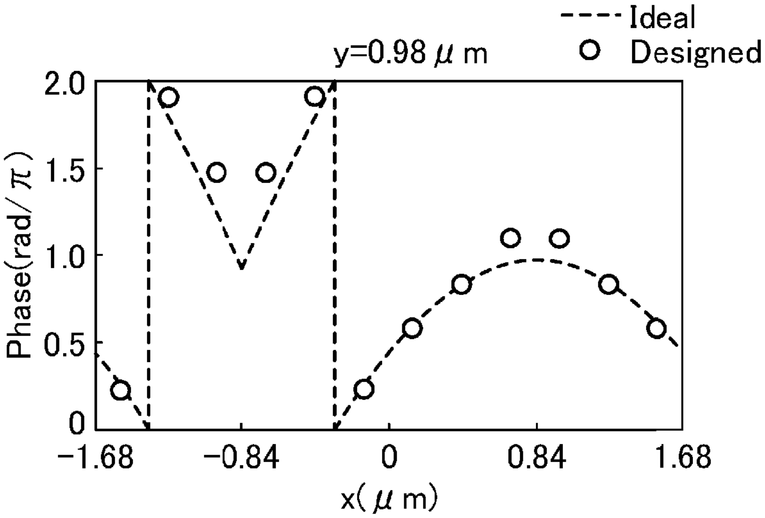
FIG. 32 is a diagram illustrating an example lens design.
Figure 33:
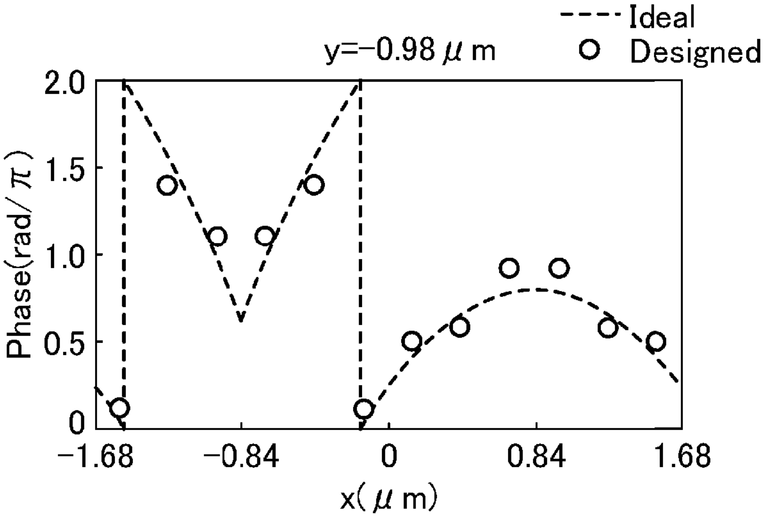
FIG. 33 is a diagram illustrating an example lens design.

FIG. 31 illustrates an ideal optical phase delay amount distribution in a case where the center wavelength is 430 nm (blue light). FIG. 32 illustrates an example of an optical phase delay amount distribution in the X-axis direction at y=0.98 μm. FIG. 33 illustrates an example of an optical phase delay amount distribution in the X-axis direction at y=−0.98 μm.

Figure 34:
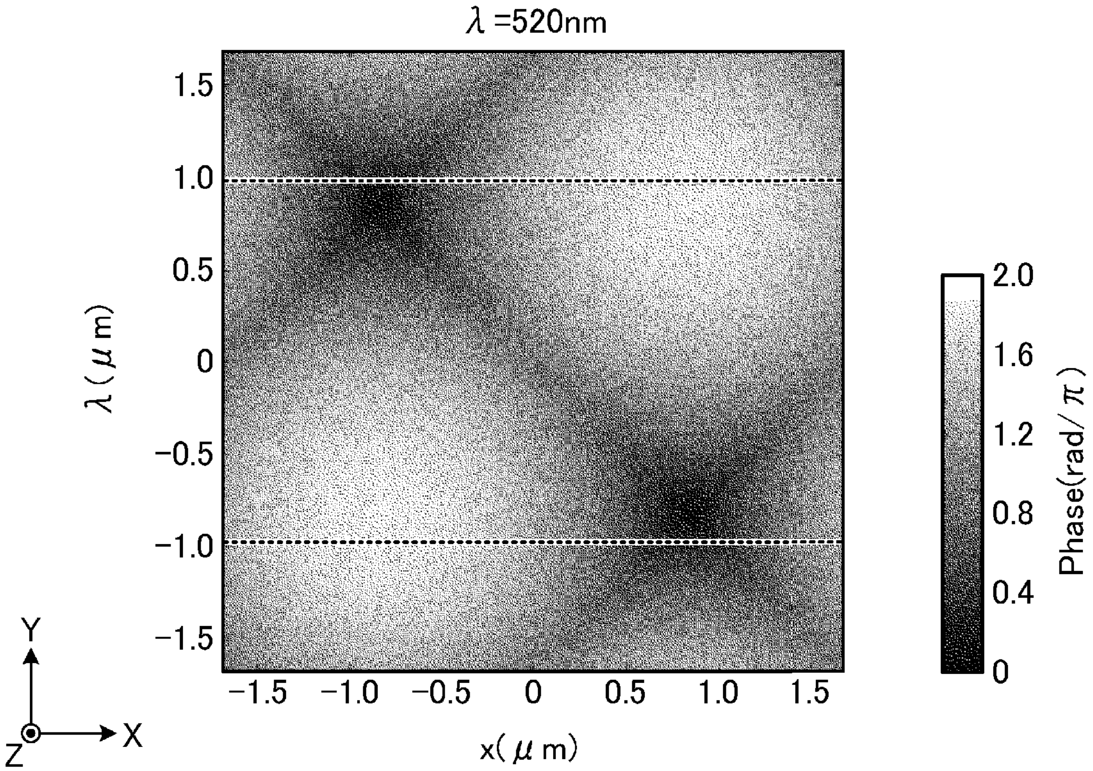
FIG. 34 is a diagram illustrating an example lens design.
Figure 35:
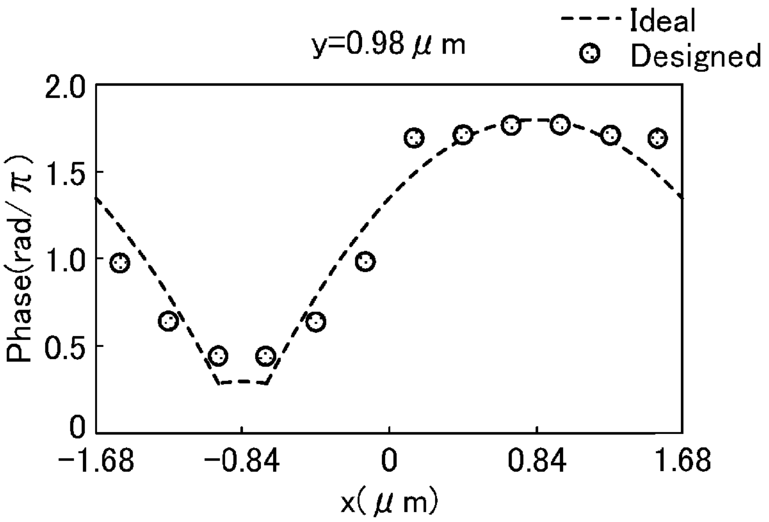
FIG. 35 is a diagram illustrating an example lens design.
Figure 36:
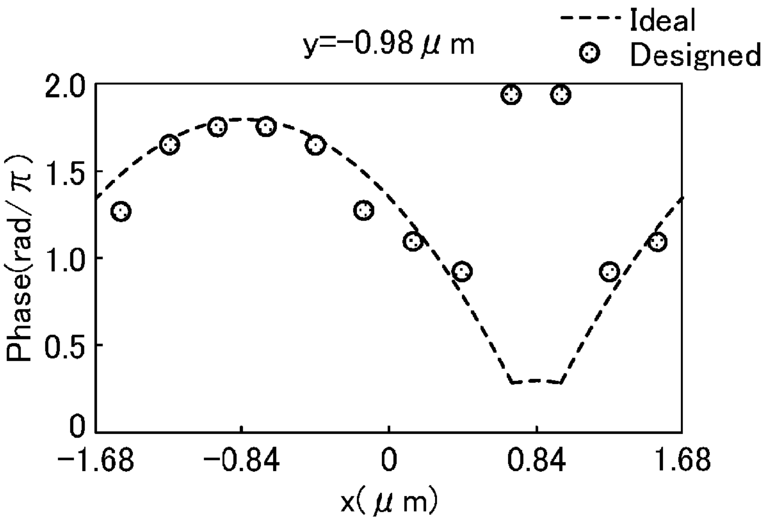
FIG. 36 is a diagram illustrating an example lens design.

FIG. 34 illustrates an ideal optical phase delay amount distribution in a case where the center wavelength is 520 nm (green light). FIG. 35 illustrates an example of an optical phase delay amount distribution in the X-axis direction at y=0.98 μm. FIG. 36 illustrates an example of an optical phase delay amount distribution in the X-axis direction at y=−0.98 μm.

Figure 37:
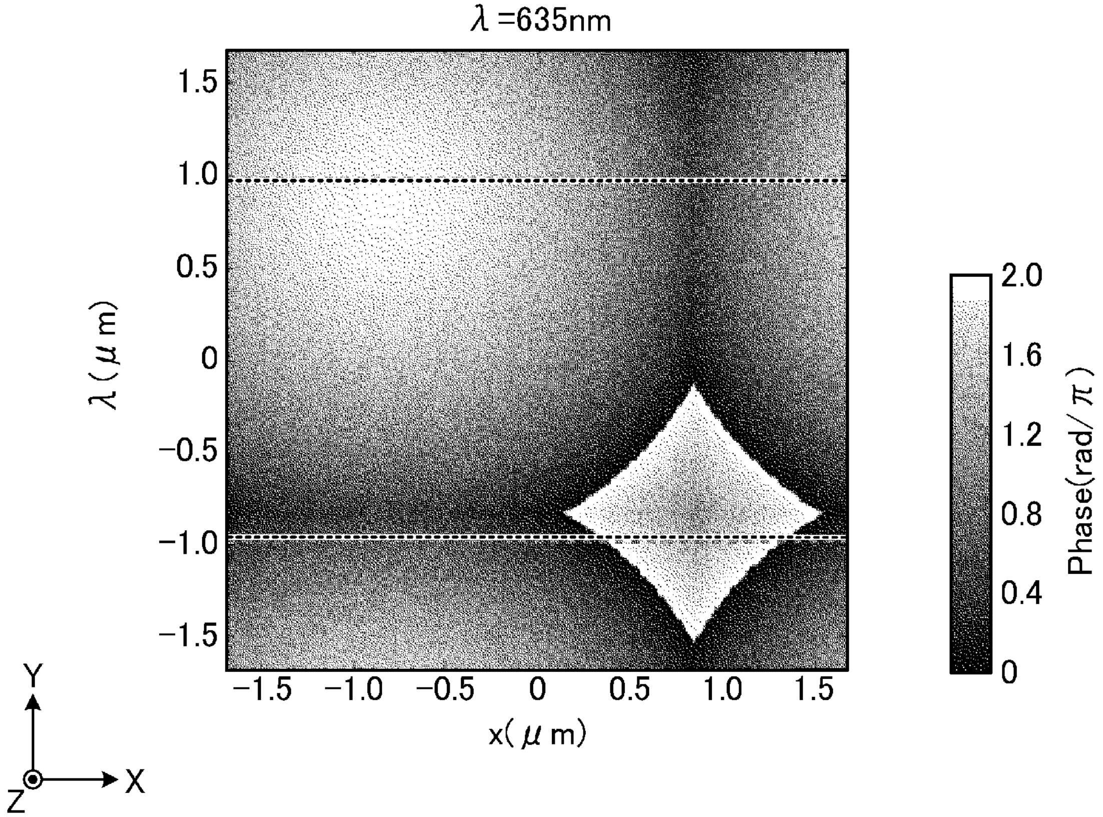
FIG. 37 is a diagram illustrating an example lens design.
Figure 38:
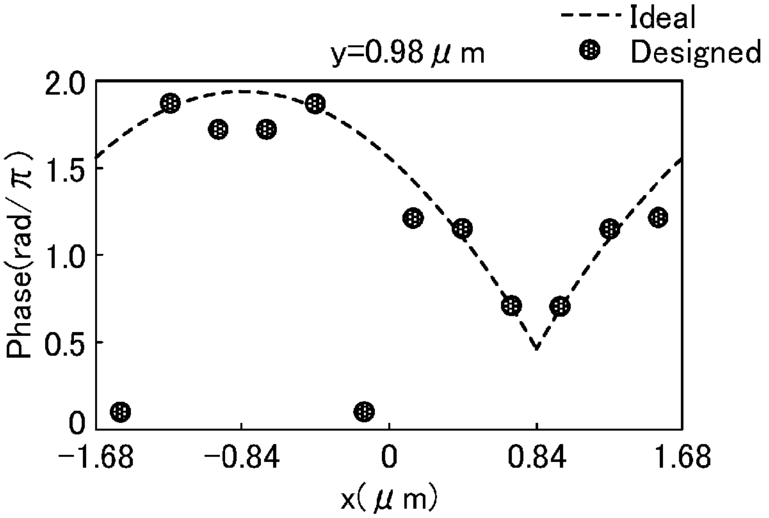
FIG. 38 is a diagram illustrating an example lens design.
Figure 39:
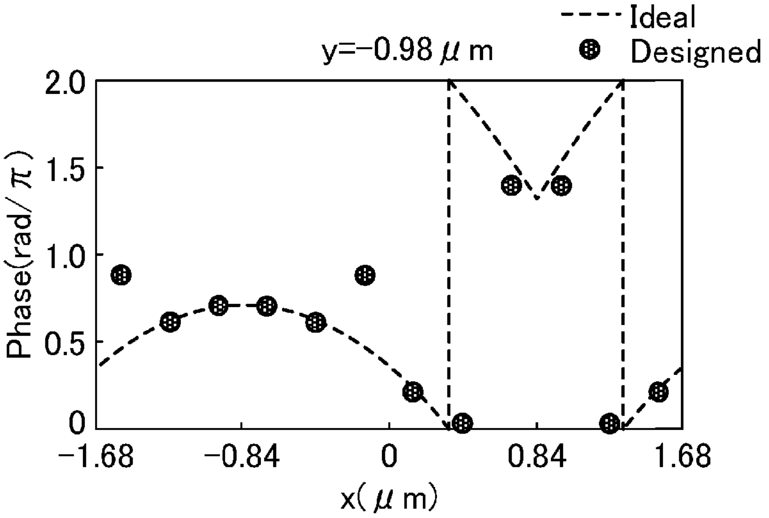
FIG. 39 is a diagram illustrating an example lens design.

FIG. 37 illustrates an ideal optical phase delay amount distribution in a case where the center wavelength is 635 nm (red light). FIG. 38 illustrates an example of an optical phase delay amount distribution in the X-axis direction at y=0.98 μm. FIG. 39 illustrates an example of an optical phase delay amount distribution in the X-axis direction at y=−0.98 μm.

As can be seen from the above, an optical phase delay amount distribution close to an ideal one is obtained at any of the center wavelengths of 430 nm, 520 nm, and 635 nm (blue light, green light, and red light).

Spectrums and intensity distributions of light entering the pixels are now described with reference to FIGS. 40 to 47.

Figure 40:
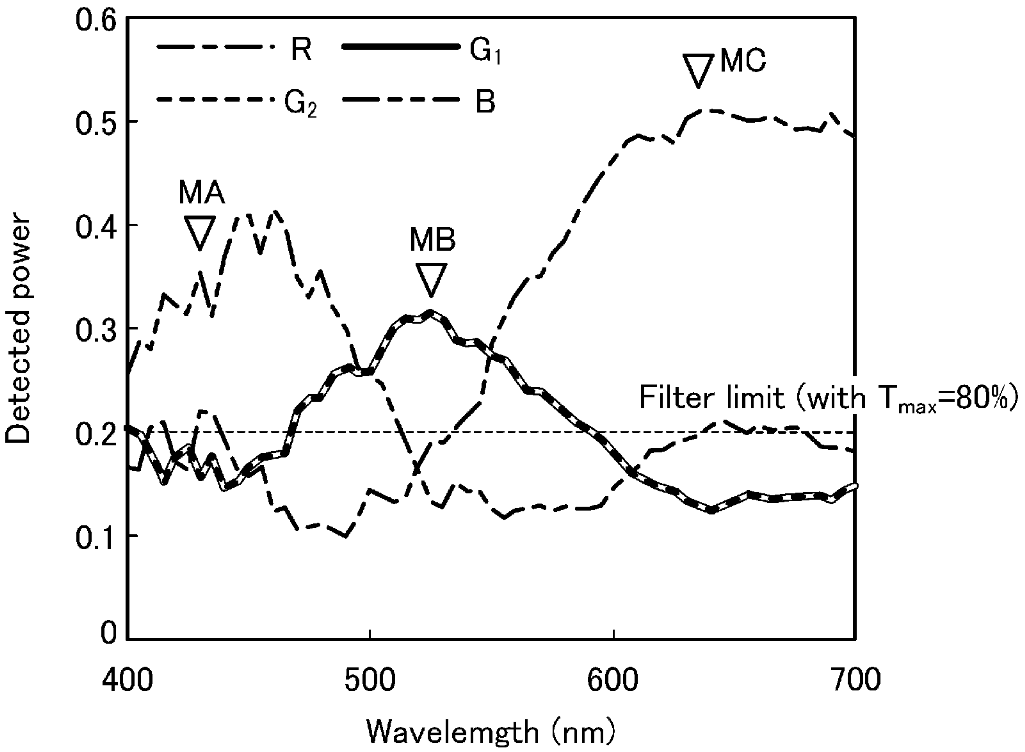
FIG. 40 is a diagram illustrating an example of the spectrums of light entering pixels.

FIG. 40 illustrates an example of the spectrums of light entering the respective pixels in a case where the structure members 61 and the like are formed with $TiO_2$. The spectrums are the spectrums observed when unpolarized planar light waves are made to enter perpendicularly to the substrate (the X-Y plane). The distance from the lower end (the lens structure end) of the structure members 61 and the like to the pixel layer 3 is 4.2 μm (the lens focal length). The abscissa axis of the graph indicates wavelength (nm). The ordinate axis indicates light reception efficiency (detected power). Light reception efficiency is "light intensity on pixels"/"intensity of light entering the structure members 61 and the like). For example, when half of the light that has entered the structure members 61 and the like enters the pixels, the light reception efficiency is 0.5.

Light is condensed into each pixel so that each pixel has a peak in the wavelength band of light of the corresponding color. The spectrum of light entering a pixel R is indicated by a graph line R. The spectrums of light entering a pixel $G_1$ and a pixel $G_2$ are indicated by a graph line $G_1$ and a graph line $G_2$. The spectrum of light entering a pixel B is indicated by a graph line B. As for a comparative example, an upper limit value of 0.2 of the light reception efficiency in a case where conventional filters (color filters) are used in place of the optical element 4 according to the embodiment is shown as a filter limit (with Tmax=80%). The upper limit value of 0.2 of the light reception efficiency is the value (0.8/4=0.2) obtained by dividing filters having the maximum transmittance of 80% at each wavelength into the four pixels of a pixel R, a pixel $G_1$, a pixel $G_2$, and a pixel B.

It can be seen that the pixel R, the pixel $G_1$, the pixel $G_2$, and the pixel B each have a peak value greater than the upper limit value of 0.2 of the comparative example, and the amount of received light in the pixels is larger than that in the comparative example. For example, at a wavelength of 430 nm indicated by a marker MA, the light reception efficiency of the pixel B greatly exceeds the upper limit value of 0.2 of the comparative example. At a wavelength of 525 nm indicated by a marker MB, the light reception efficiency of the pixel $G_1$ and the pixel $G_2$ greatly exceeds the upper limit value of 0.2 of the comparative example. At a wavelength of 635 nm indicated by a marker MC, the light reception efficiency of the pixel R greatly exceeds the upper limit value of 0.2 of the comparative example.

The value obtained by averaging the total transmittance, which is "the sum of the light intensities in all the pixels"/"the intensity of light entering the structure members 61 and the like" over the wavelength range of 400 nm to 700 nm is 93.2%, which greatly exceeds the upper limit value up to 33% in a case where conventional filters are used. This also shows that the light reception efficiency of the pixels can be increased.

Figure 41:
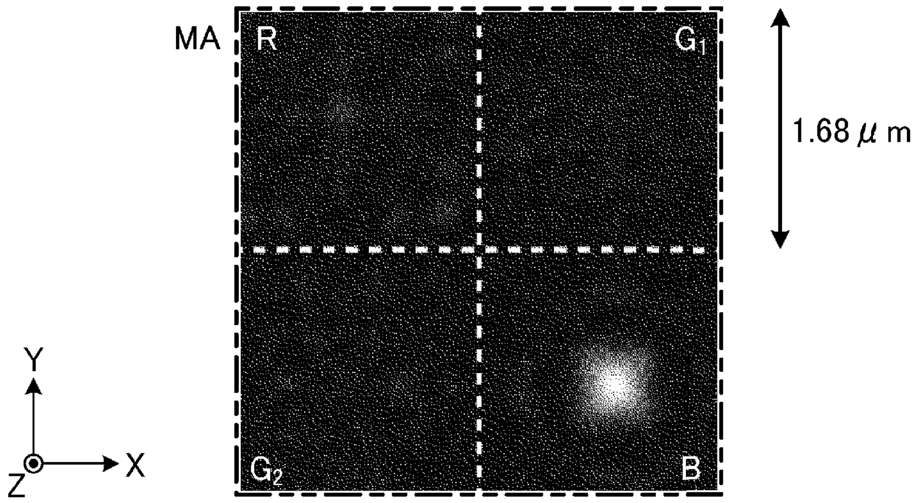
FIG. 41 is a diagram illustrating an example of the intensity distributions of light entering pixels.
Figure 42:
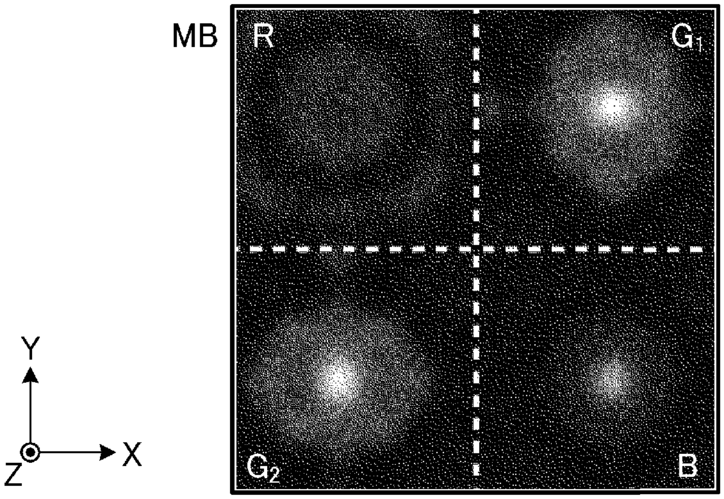
FIG. 42 is a diagram illustrating an example of the intensity distributions of light entering pixels.
Figure 43:
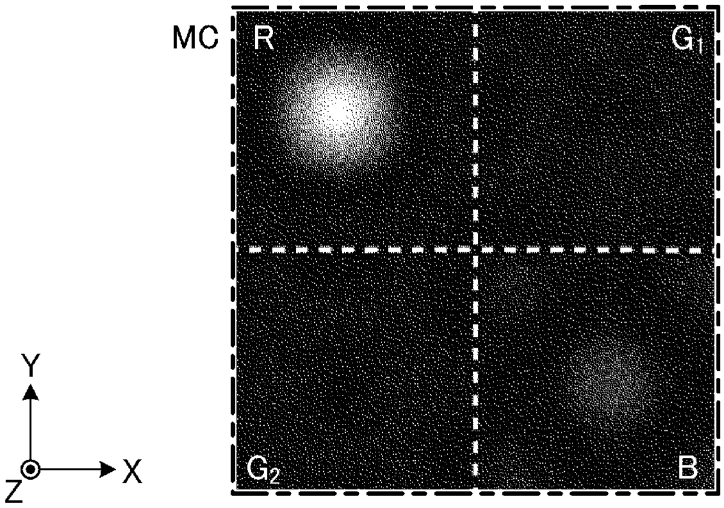
FIG. 43 is a diagram illustrating an example of the intensity distributions of light entering pixels.

FIG. 41 illustrates an intensity distribution of light (blue light) having the wavelength indicated by the marker MA in FIG. 40. It can be seen that the distribution concentrates in the pixel B. FIG. 42 illustrates an intensity distribution of light (green light) having the wavelength indicated by the marker MB in FIG. 40. It can be seen that the distribution concentrates in the pixel $G_1$ and the pixel $G_2$. FIG. 43 illustrates an intensity distribution of light (red light) having the wavelength indicated by the marker MC in FIG. 40. It can be seen that the distribution concentrates in the pixel R.

Figure 44:
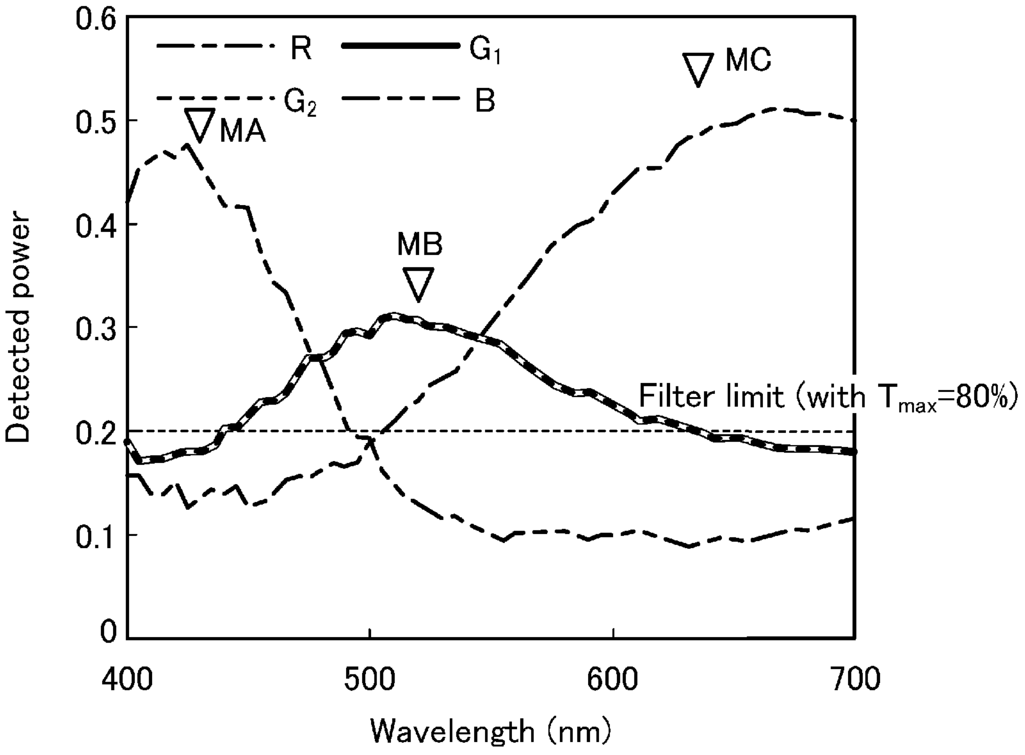
FIG. 44 is a diagram illustrating an example of the spectrums of light entering pixels.

FIG. 44 illustrates an example of the spectrums of light entering the respective pixels in a case where the structure members 61 and the like are formed with SiN. The pixel R, the pixel $G_1$, the pixel $G_2$, and the pixel B each have a peak value greater than the upper limit value of 0.2 of the comparative example, and the amount of received light in the pixels is larger than that in the comparative example, as in the above-described case where the structure members 61 and the like are formed with $SiO_2$. The total transmittance is 97.1%, which greatly exceeds the upper limit value up to 33% in a case where conventional filters are used.

Figure 45:
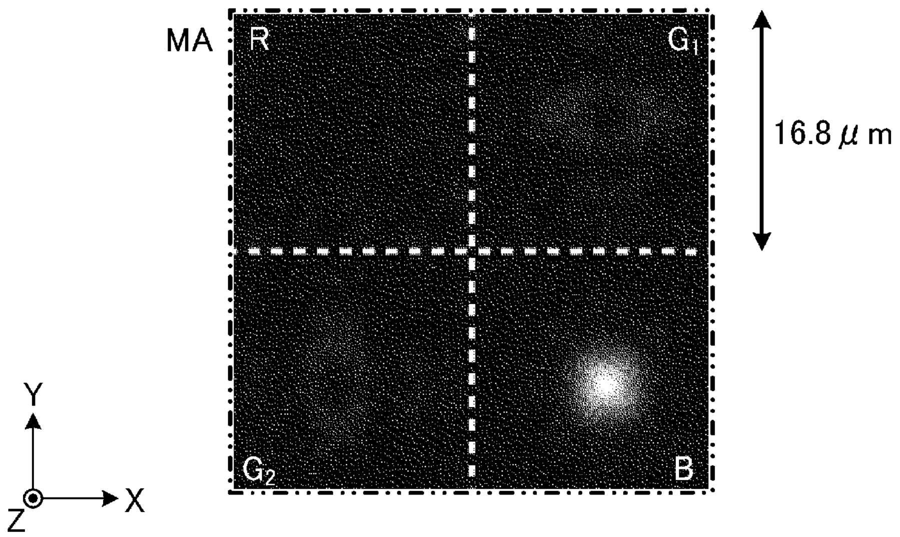
FIG. 45 is a diagram illustrating an example of the intensity distributions of light entering pixels.
Figure 46:
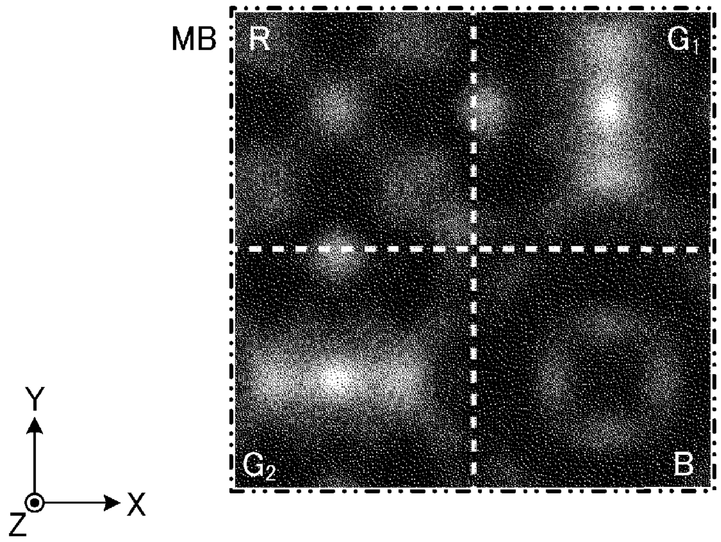
FIG. 46 is a diagram illustrating an example of the intensity distributions of light entering pixels.
Figure 47:
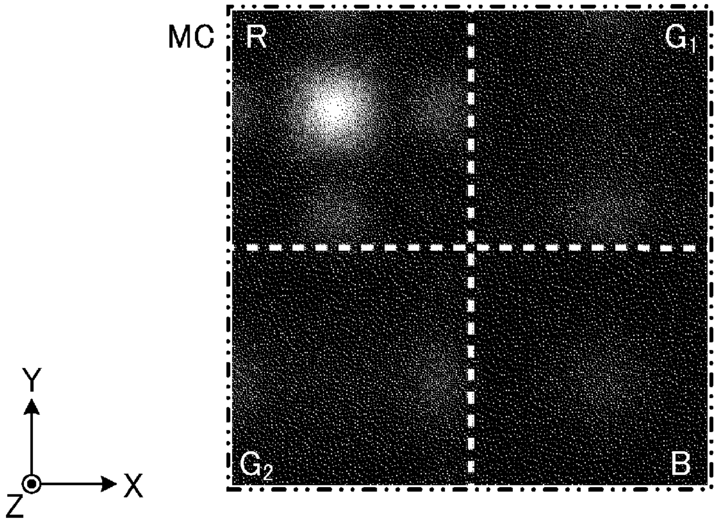
FIG. 47 is a diagram illustrating an example of the intensity distributions of light entering pixels.

FIG. 45 illustrates an intensity distribution of light (blue light) having the wavelength indicated by the marker MA in FIG. 44. It can be seen that the distribution concentrates in the pixel B. FIG. 46 illustrates an intensity distribution of light (green light) having the wavelength indicated by the marker MB in FIG. 44. Note that the wavelength indicated by the marker MB in this case with SiN is 520 nm. It can be seen that the distribution concentrates in the pixel $G_1$ and the pixel $G_2$. FIG. 47 illustrates an intensity distribution of light (red light) having the wavelength indicated by the marker MC in FIG. 44. It can be seen that the distribution concentrates in the pixel R.

FIGS. 48 to 66 are diagrams illustrating examples of incident angle dependences. FIGS. 48 to 58 illustrate examples of incident angle dependences in cases where the structure members 61 and the like are formed with $TiO_2$.

Figure 48:
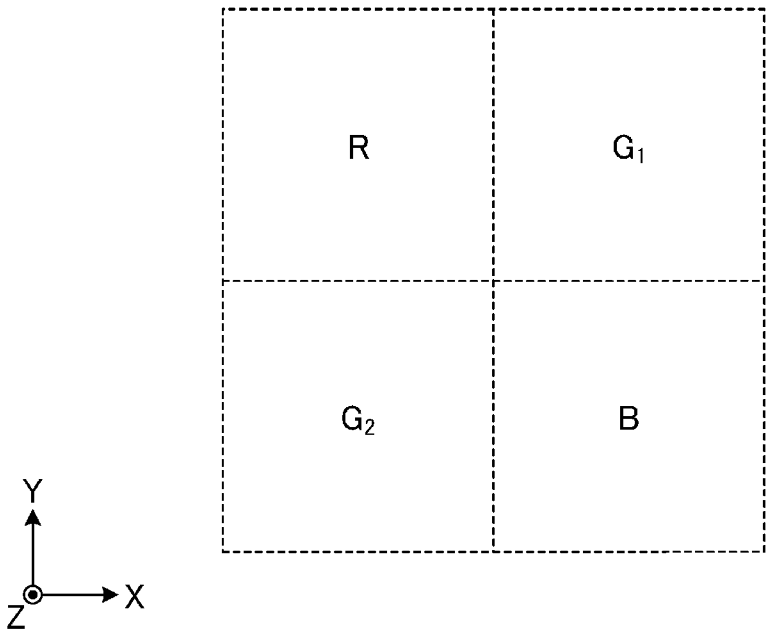
FIG. 48 is a diagram illustrating an example of incident angle dependence.
Figure 49:
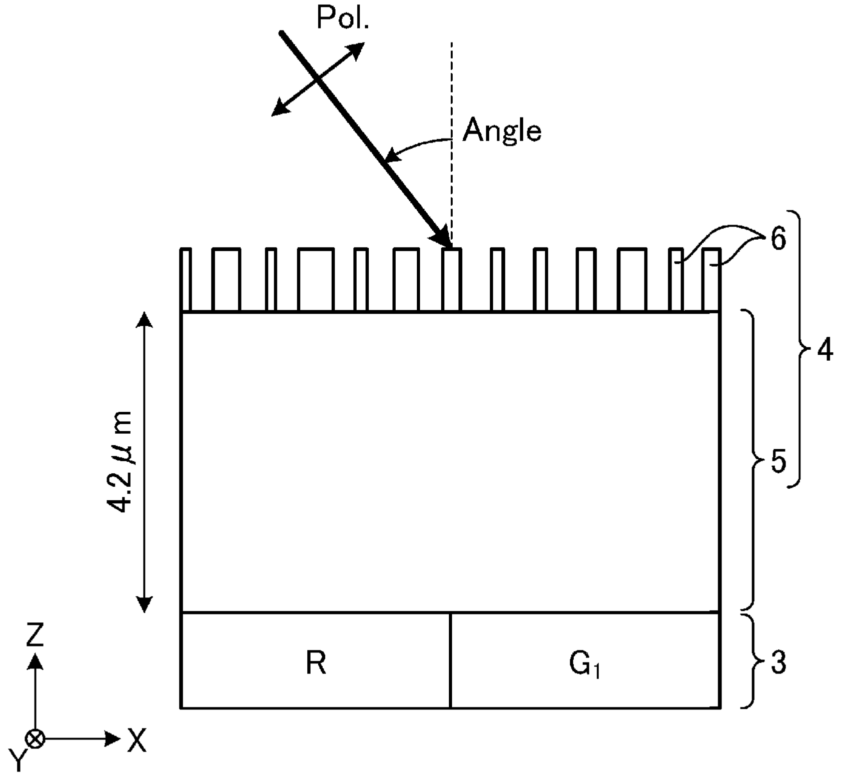
FIG. 49 is a diagram illustrating an example of incident angle dependence.
Figure 50:
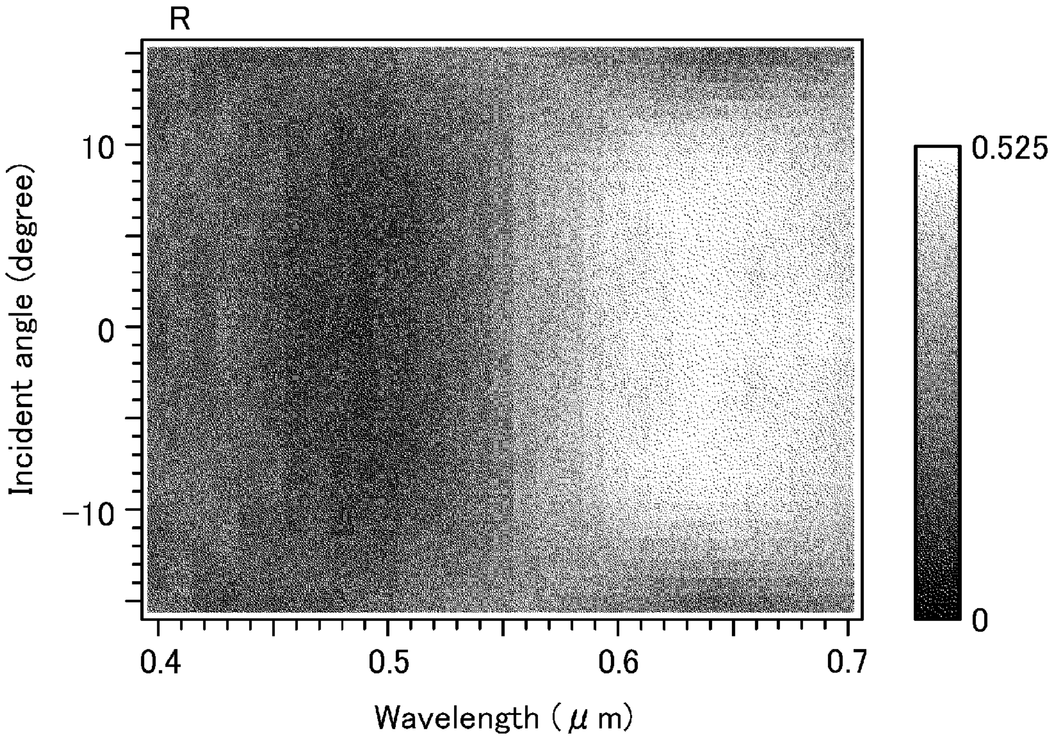
FIG. 50 is a diagram illustrating an example of incident angle dependence.
Figure 51:
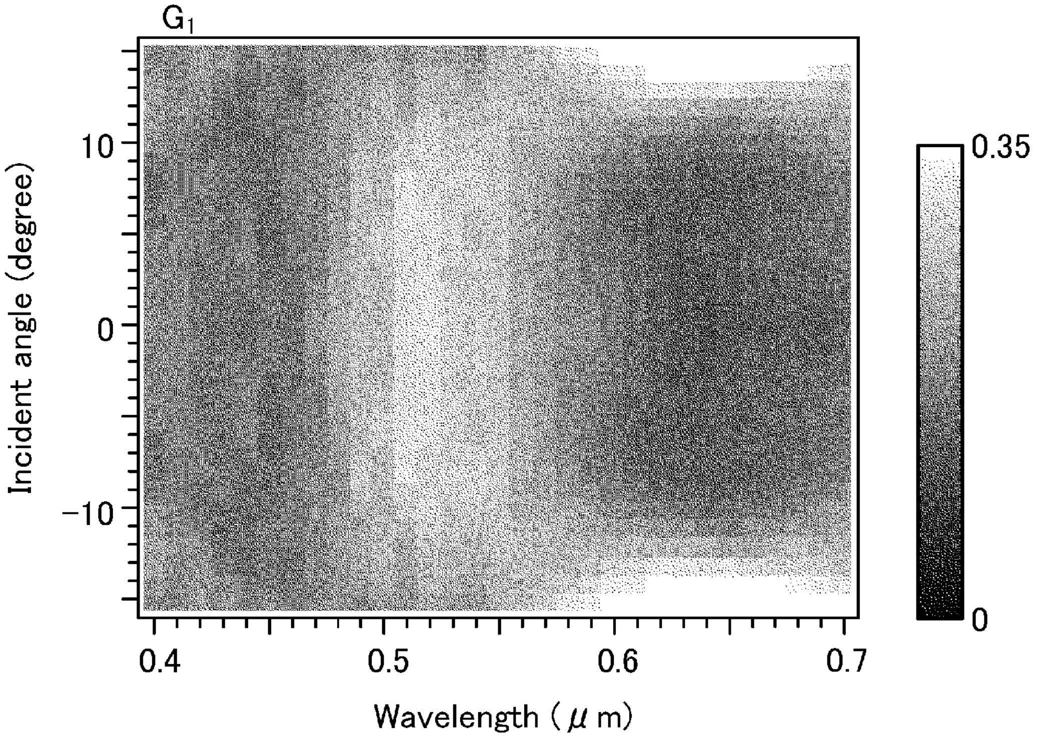
FIG. 51 is a diagram illustrating an example of incident angle dependence.
Figure 52:
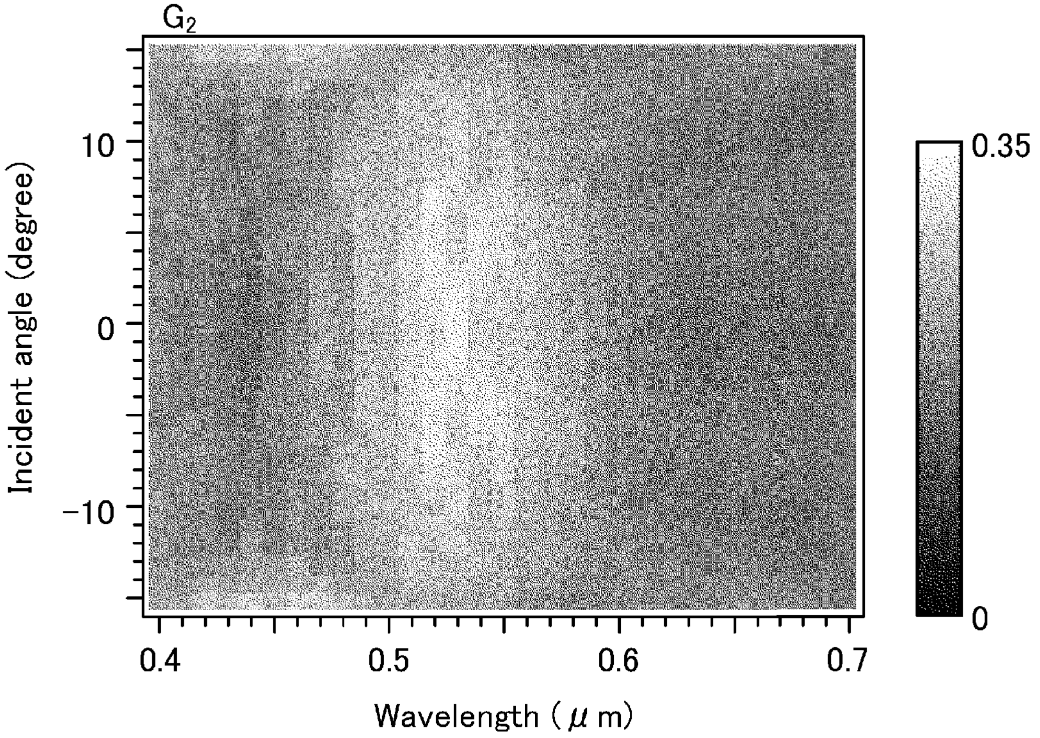
FIG. 52 is a diagram illustrating an example of incident angle dependence.
Figure 53:
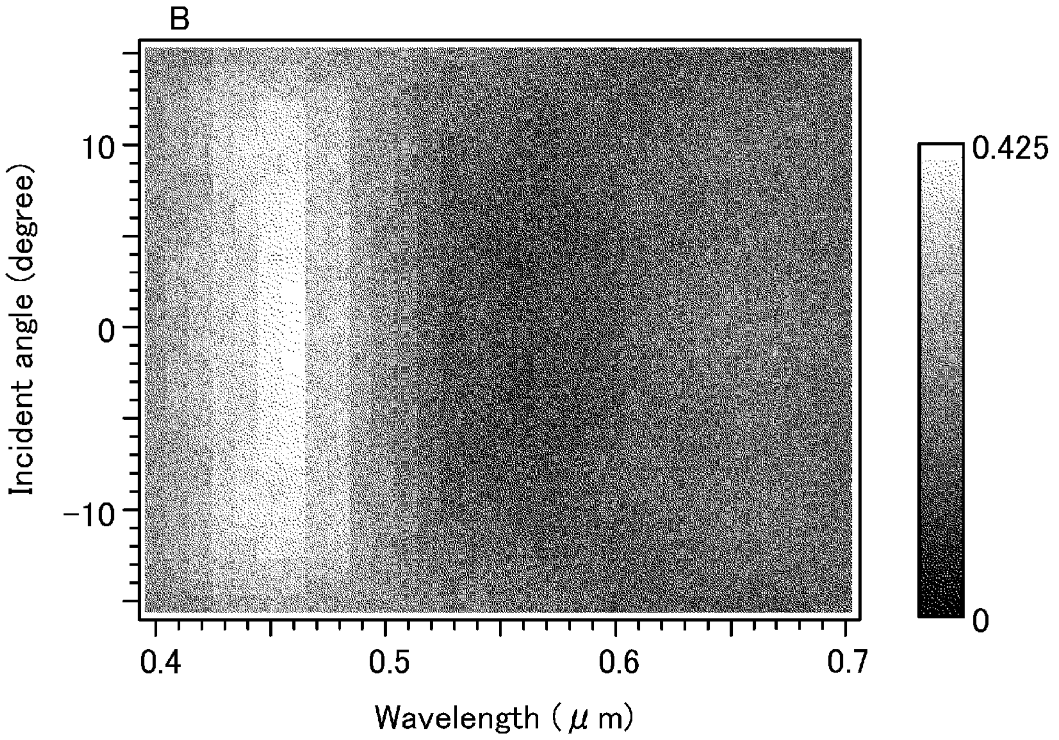
FIG. 53 is a diagram illustrating an example of incident angle dependence.

As described above, a pixel R, a pixel $G_1$, a pixel $G_2$, and a pixel B are disposed as illustrated in FIG. 48. FIGS. 50 to 53 illustrate the incident angle dependences in cases where the angle in the X-Z plane with the Z-axis direction set to 0° is set as the incident angle at this time as illustrated in FIG. 49. FIG. 50 illustrates the light reception efficiency of the pixel R as a spectrum at each wavelength (μm) and each incident angle (degrees), or at each incident angle. FIG. 51 illustrates the light reception efficiency of the pixel $G_1$ as a spectrum at each incident angle. FIG. 52 illustrates the light reception efficiency of the pixel $G_2$ as a spectrum at each incident angle. FIG. 53 illustrates the light reception efficiency of the pixel B as a spectrum at each incident angle. In any of the pixel R, the pixel $G_1$, the pixel $G_2$, and the pixel B, no significant change occurs in the spectrum over the range of about ±12° in incident angle.

Figure 54:
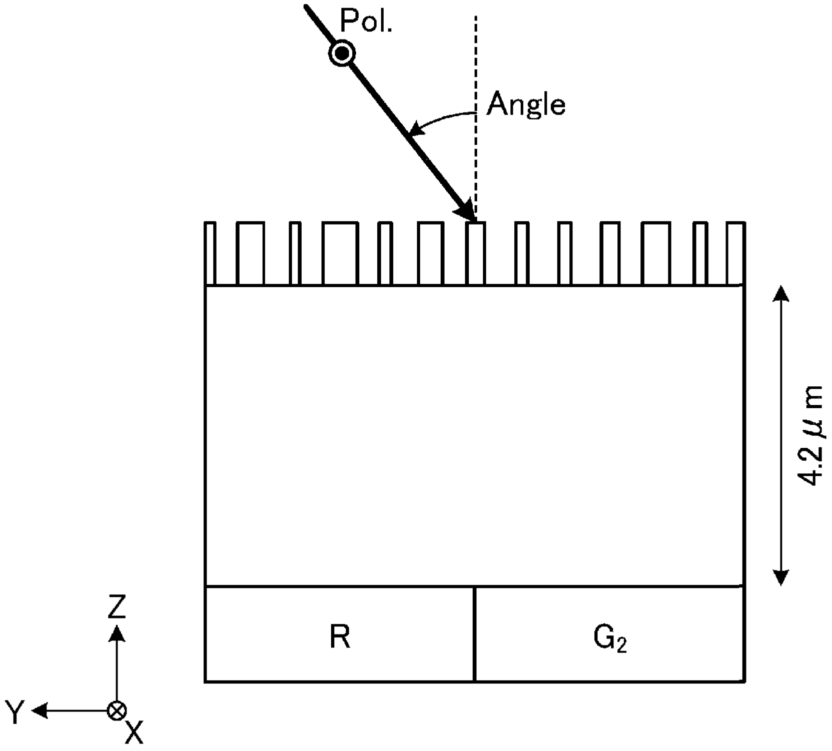
FIG. 54 is a diagram illustrating an example of incident angle dependence.
Figure 55:
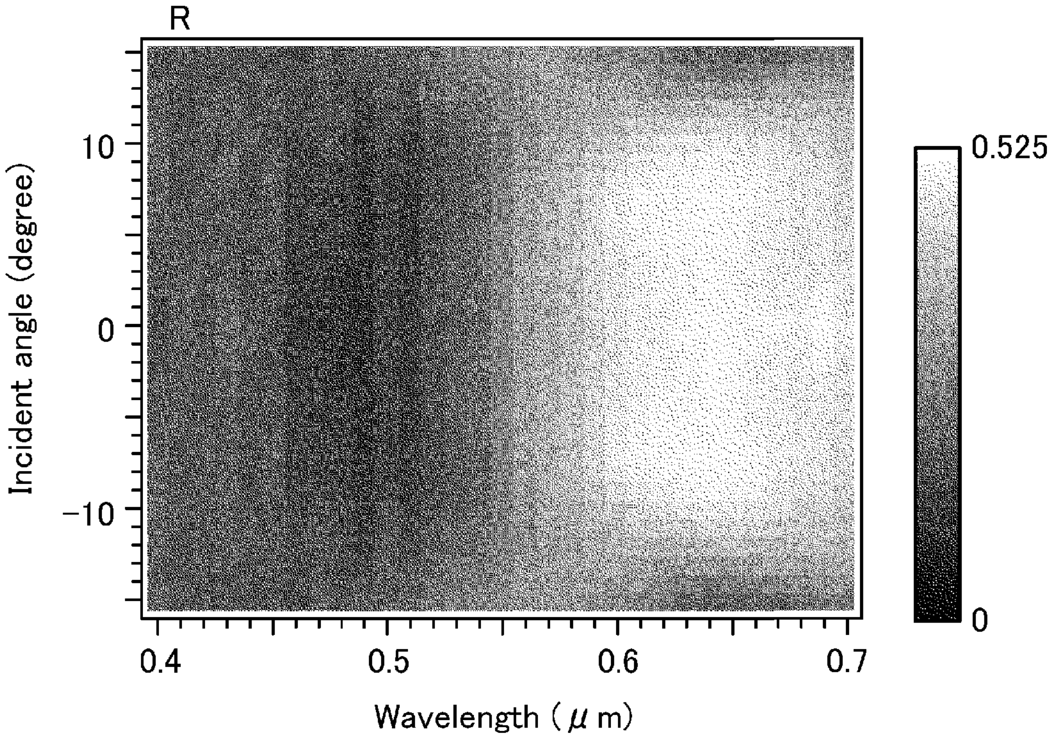
FIG. 55 is a diagram illustrating an example of incident angle dependence.
Figure 56:
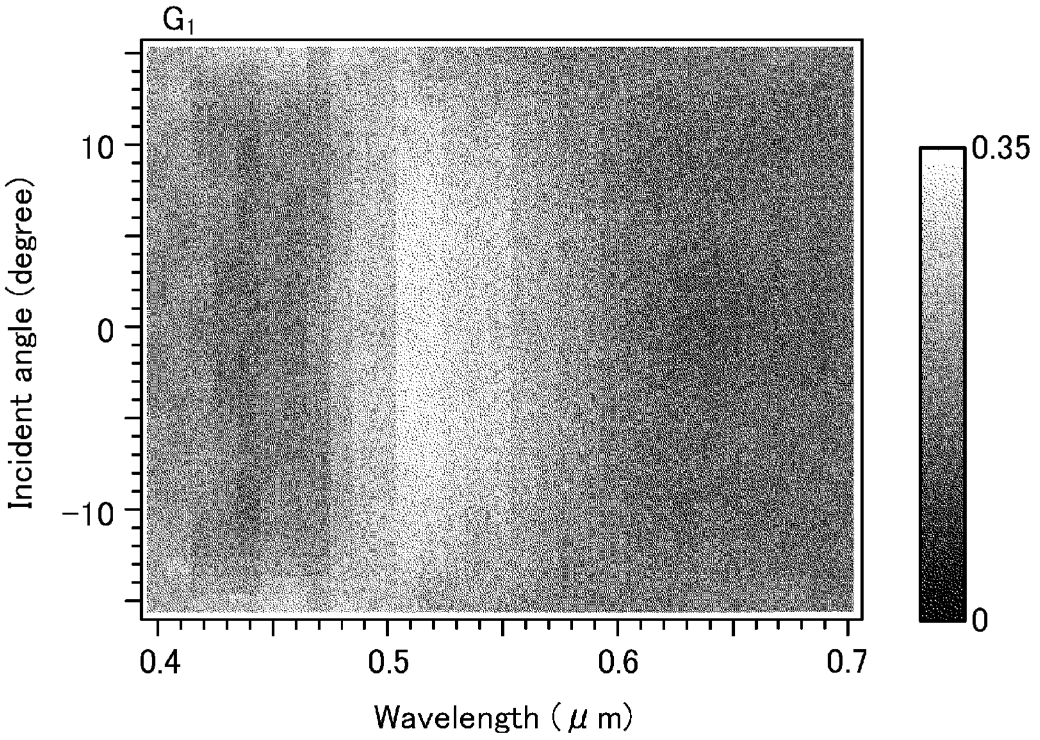
FIG. 56 is a diagram illustrating an example of incident angle dependence.
Figure 57:
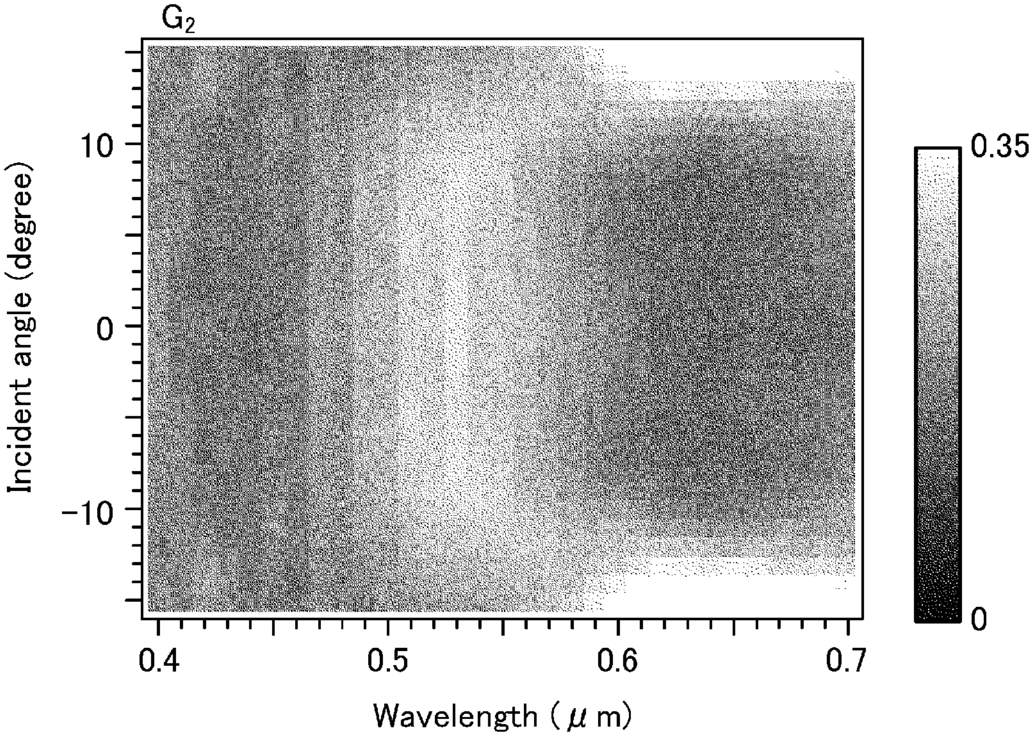
FIG. 57 is a diagram illustrating an example of incident angle dependence.
Figure 58:
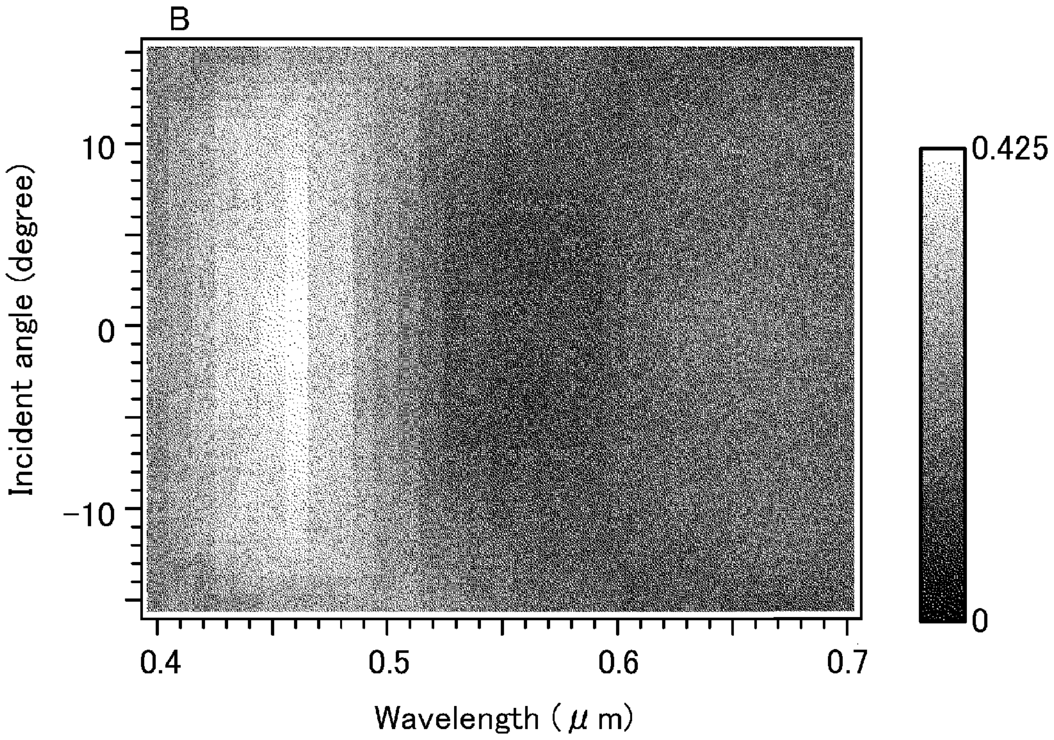
FIG. 58 is a diagram illustrating an example of incident angle dependence.

FIGS. 55 to 58 illustrate the incident angle dependences in cases where the angle in the Y-Z plane with the Z-axis direction set to 0° is set as the incident angle as illustrated in FIG. 54. FIG. 55 illustrates the light reception efficiency of the pixel R as a spectrum at each incident angle. FIG. 56 illustrates the light reception efficiency of the pixel $G_1$ as a spectrum at each incident angle. FIG. 57 illustrates the light reception efficiency of the pixel $G_2$ as a spectrum at each incident angle. FIG. 58 illustrates the light reception efficiency of the pixel B as a spectrum at each incident angle.

In any of the pixel R, the pixel $G_1$, the pixel $G_2$, and the pixel B, no significant change occurs in the spectrum over the range of about ±12° in incident angle.

FIGS. 59 to 66 illustrate examples of incident angle dependences in cases where the structure members 61 and the like are formed with SiN.

Figure 59:
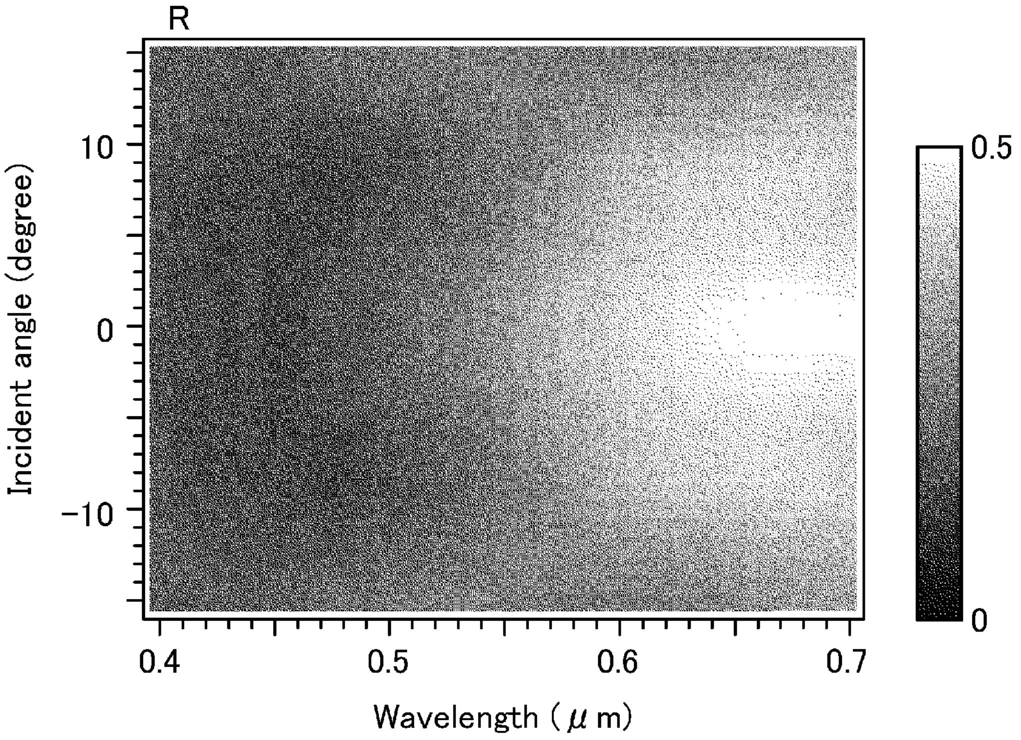
FIG. 59 is a diagram illustrating an example of incident angle dependence.
Figure 60:
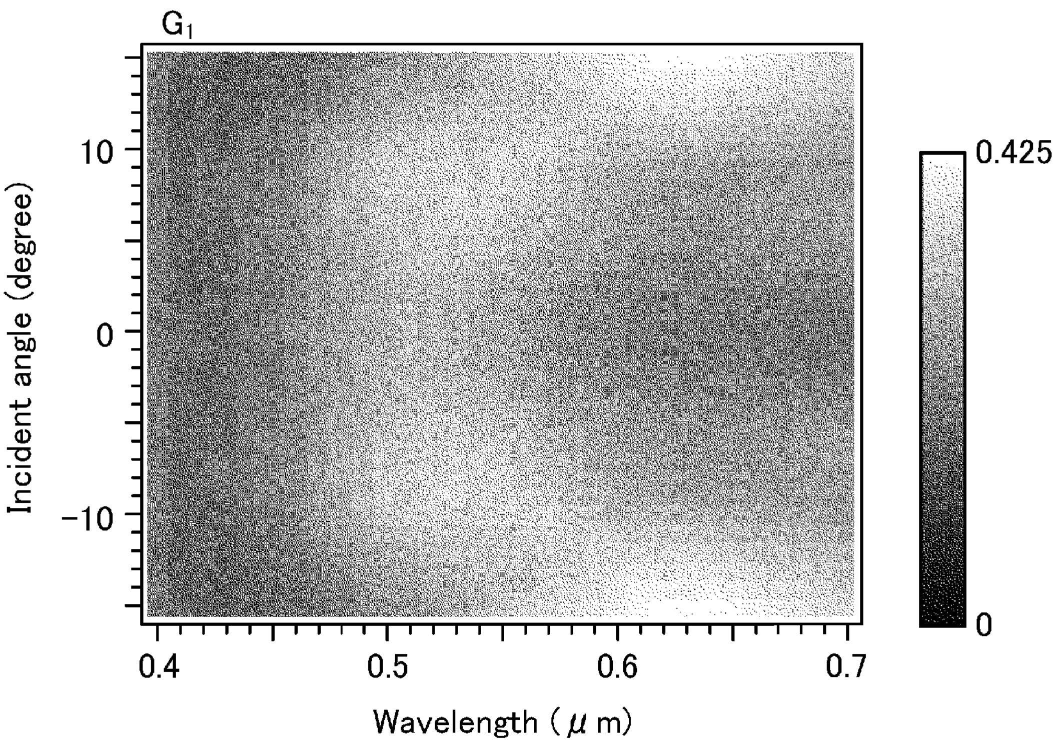
FIG. 60 is a diagram illustrating an example of incident angle dependence.
Figure 61:
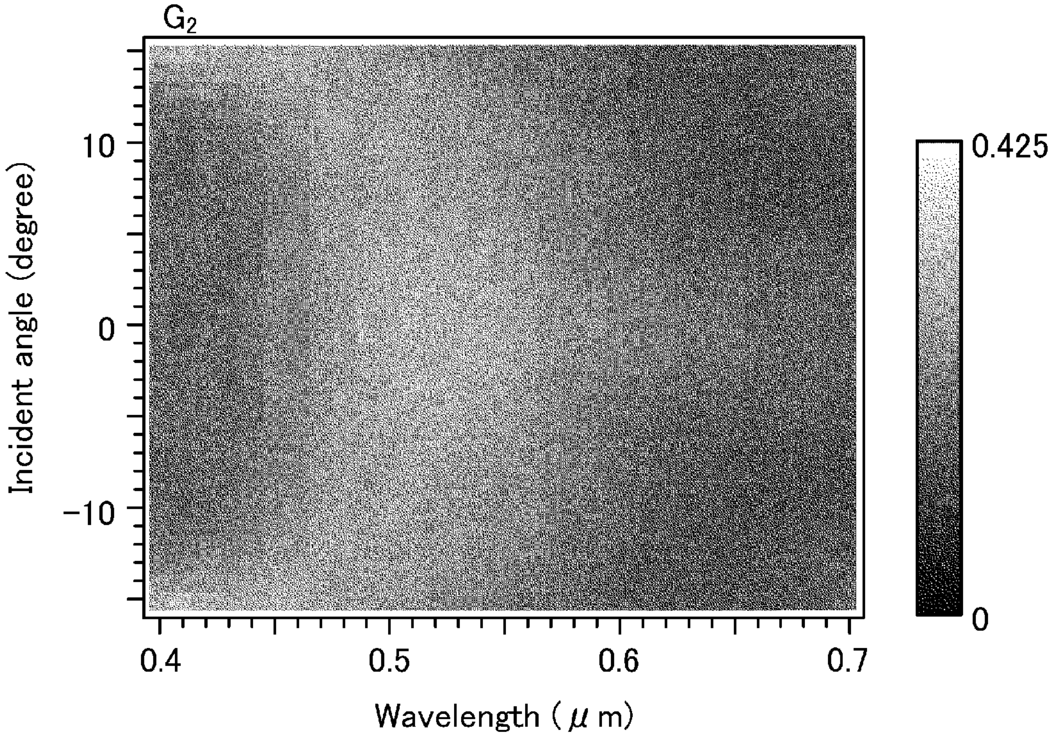
FIG. 61 is a diagram illustrating an example of incident angle dependence.
Figure 62:
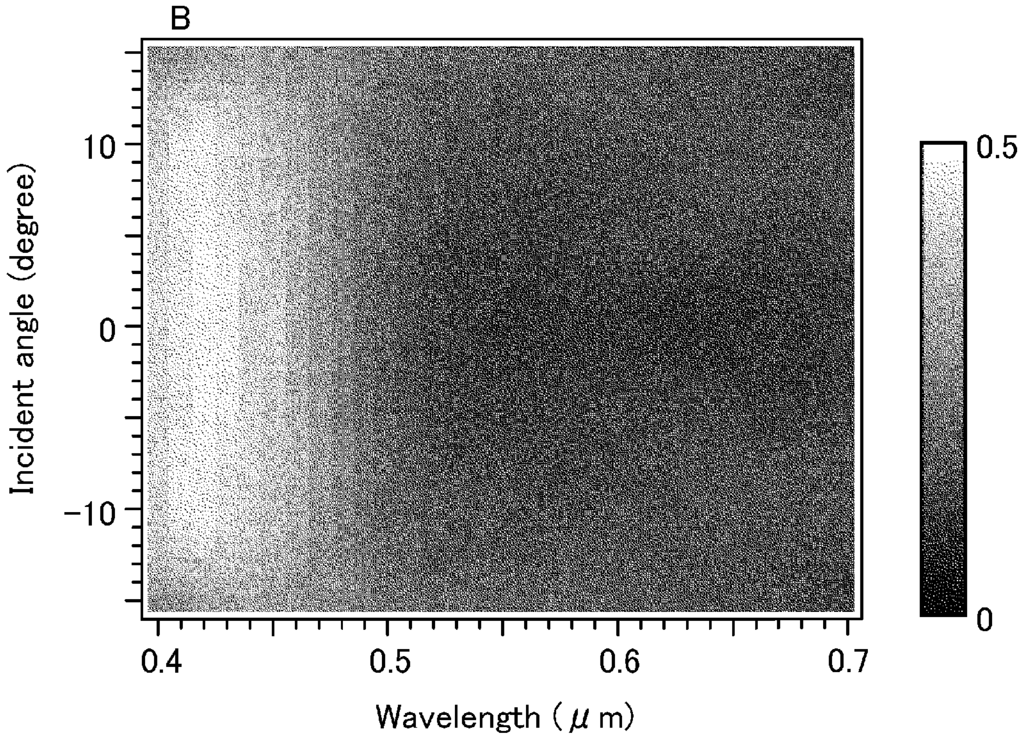
FIG. 62 is a diagram illustrating an example of incident angle dependence.

FIGS. 59 to 62 illustrate the incident angle dependences in the X-Z plane as illustrated in FIG. 49 described above. FIG. 59 illustrates the dependence on the incident angle to the pixel R. FIG. 60 illustrates the dependence on the incident angle to the pixel $G_1$. FIG. 61 illustrates the dependence on the incident angle to the pixel $G_2$. FIG. 62 illustrates the dependence on the incident angle to the pixel B. In any of the pixels, no significant change occurs in the spectrum over the range of about ±12° in incident angle.

Figure 63:
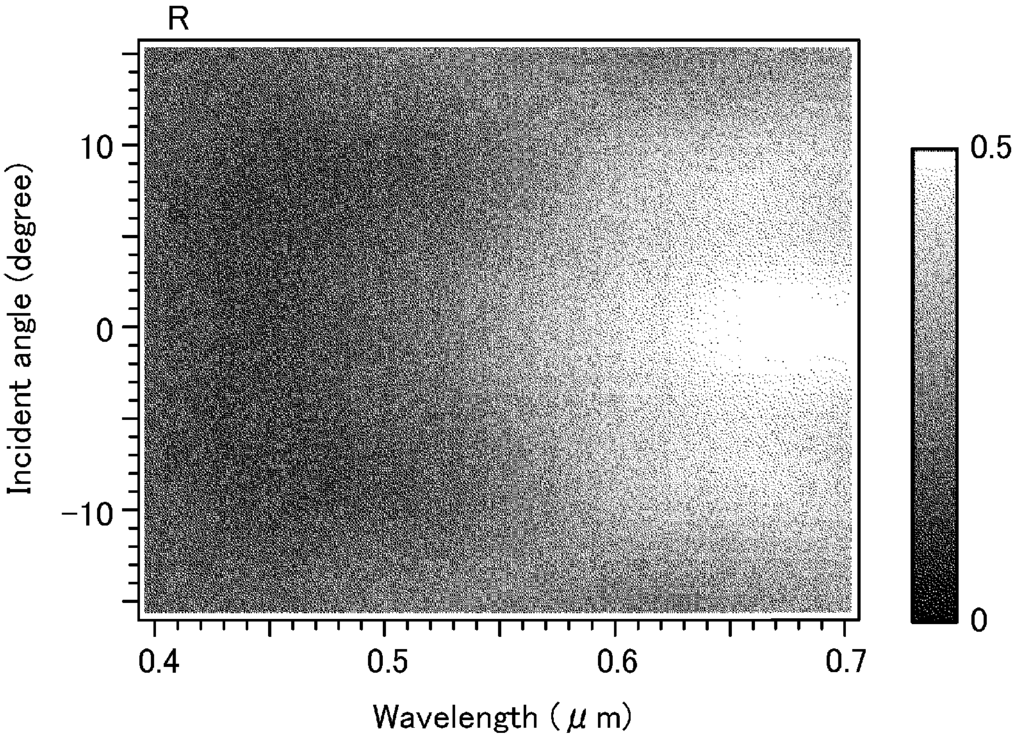
FIG. 63 is a diagram illustrating an example of incident angle dependence.
Figure 64:
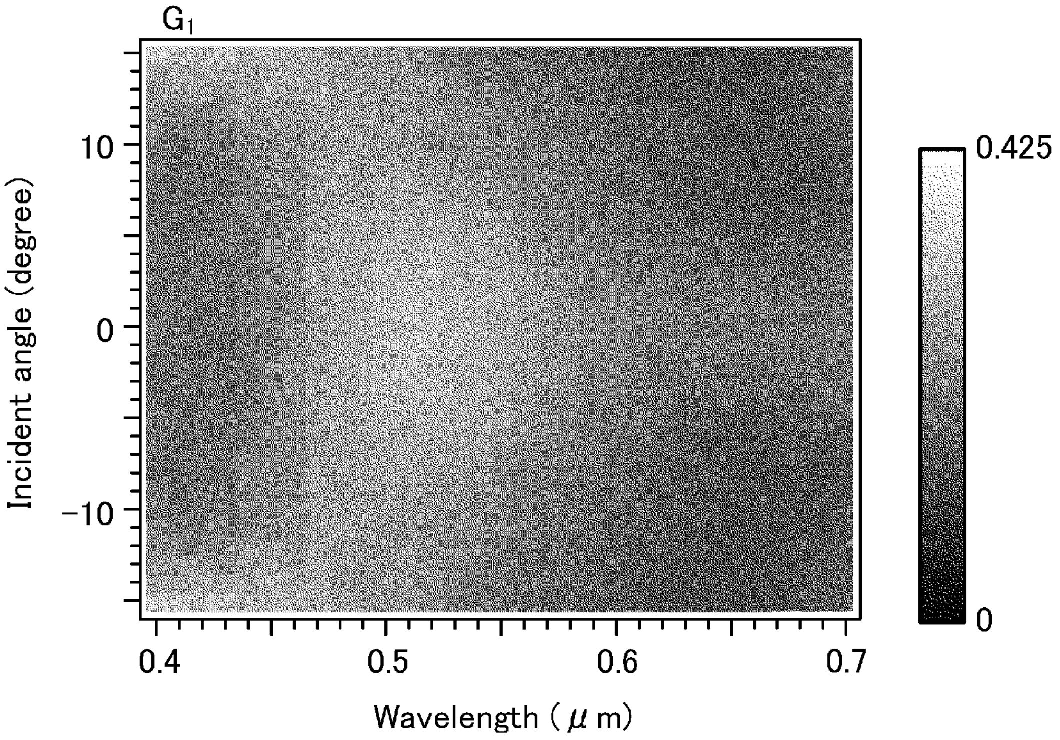
FIG. 64 is a diagram illustrating an example of incident angle dependence.
Figure 65:
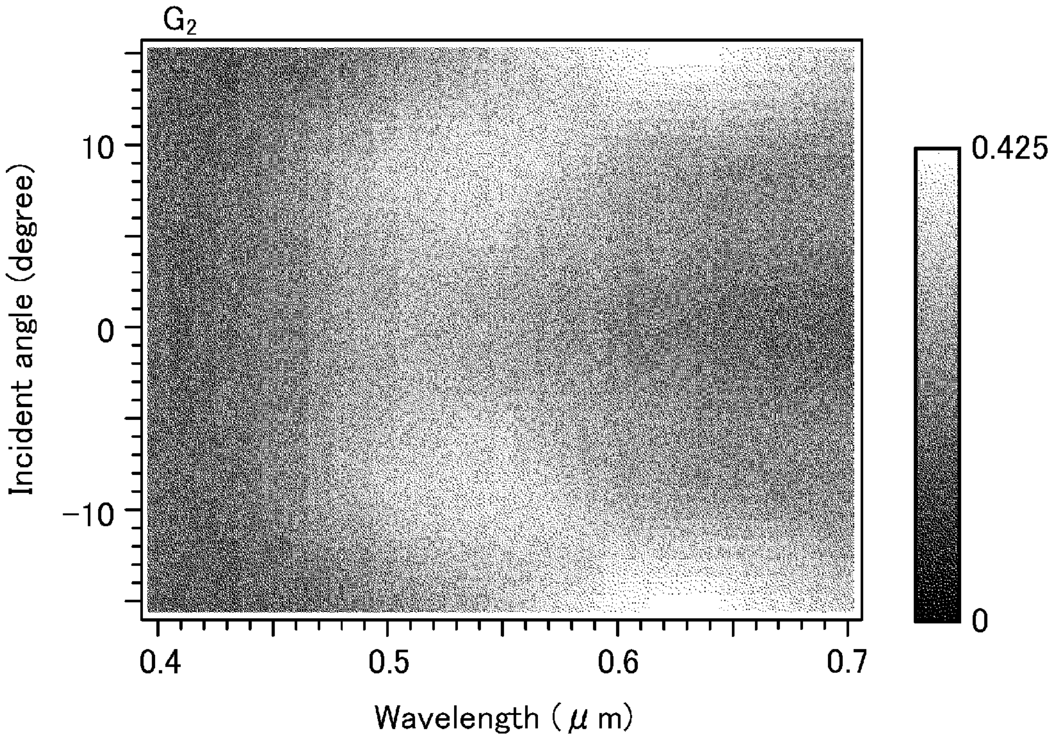
FIG. 65 is a diagram illustrating an example of incident angle dependence.
Figure 66:
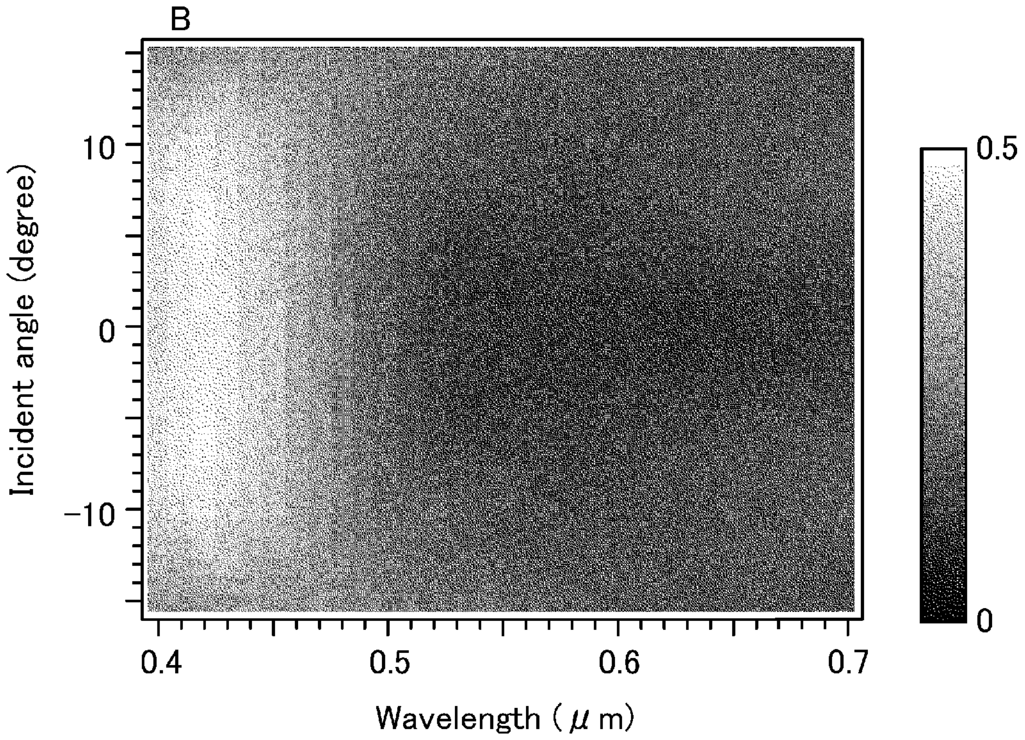
FIG. 66 is a diagram illustrating an example of incident angle dependence.

FIGS. 63 to 66 illustrate the incident angle dependences in the Y-Z plane as illustrated in FIG. 54 described above. FIG. 63 illustrates the dependence on the incident angle to the pixel R. FIG. 64 illustrates the dependence on the incident angle to the pixel $G_1$. FIG. 65 illustrates the dependence on the incident angle to the pixel $G_2$. FIG. 66 illustrates the dependence on the incident angle to the pixel B. In any of the pixels, no significant change occurs in the spectrum over the range of about ±12° in incident angle.

As described above, it has been confirmed that the incident angle has a tolerance of at least ±12°. This means that, even in a case where an image is captured with an imaging lens having a numerical aperture (NA) up to 0.21, for example, a color error is less likely to occur. Taking into consideration the fact that the NA of a general imaging lens (a telephoto lens) of a camera of a smartphone or the like is around 0.2, there is a possibility that the optical element 4 according to the embodiment can also be used in a smartphone camera or the like. Note that the tolerance for incident angle mainly depends on the focal length, and thus, the allowable range of angles becomes even wider if a lens having a shorter focal length is designed.

As described above, with the optical element 4, both functions of a lens function are achieved. For example, an imaging device according to a conventional technology includes filters (for example, color filters) in place of the optical element 4. That is, filters corresponding to the colors of the respective pixels are provided so as to cover the corresponding pixels. In this case, light having any wavelength outside the transmission wavelength band is absorbed by the filters, only about ⅓ of the amount of light that has entered the filters remains after transmission through the filters, and therefore, the light reception efficiency becomes lower. On the other hand, in the imaging device 12 according to the embodiment, a larger amount (90% or more, for example) of light is maintained as described above, and thus, the light reception efficiency is greatly increased.

Further, according to some conventional technology, microlenses are provided (integrated) on the opposite side of the filters from the pixels, to increase the amount of received light (or to increase sensitivity) by improving the aperture ratio, reducing the dependence on the light incident angle, and the like. In this case, a two-layer structure formed at least with filters and microlenses is formed. Therefore, the structure becomes complicated, and the manufacturing costs also increase. As for the optical element 4 according to the embodiment, a color separation function and a lens function can be obtained only with the optical element 4. Accordingly, the structure can be simplified, and the manufacturing costs can be lowered. Furthermore, the plurality of structure members 6 can be disposed in a plane (X-Y plane) without gaps. Thus, the aperture ratio becomes higher than that of microlenses.

Returning back to FIG. 1, the signal processing unit 13 of the imaging apparatus 10 is now described. The signal processing unit 13 generates a pixel signal on the basis of an electrical signal obtained from the imaging device 12. To obtain the electrical signal, the signal processing unit 13 also controls the imaging device 12. Controlling the imaging device 12 includes exposure of the pixels of the imaging device 12, conversion of charges accumulated in the pixel layer 3 into an electrical signal, reading of the electrical signal, and the like.

Although one embodiment of the present disclosure has been described so far, various modifications can be made to the optical element, the imaging device, and the imaging apparatus according to the embodiment, without departing from the scope of the embodiment. Some modifications will be described below.

In the example described in the above embodiment, the plurality of structure members 6 is provided on the transparent layer 5 on the side opposite from the pixel layer 3, with the transparent layer 5 interposed in between. However, the configuration of the transparent layer 5 and the plurality of structure members 6 is not limited to this.

Figure 67:
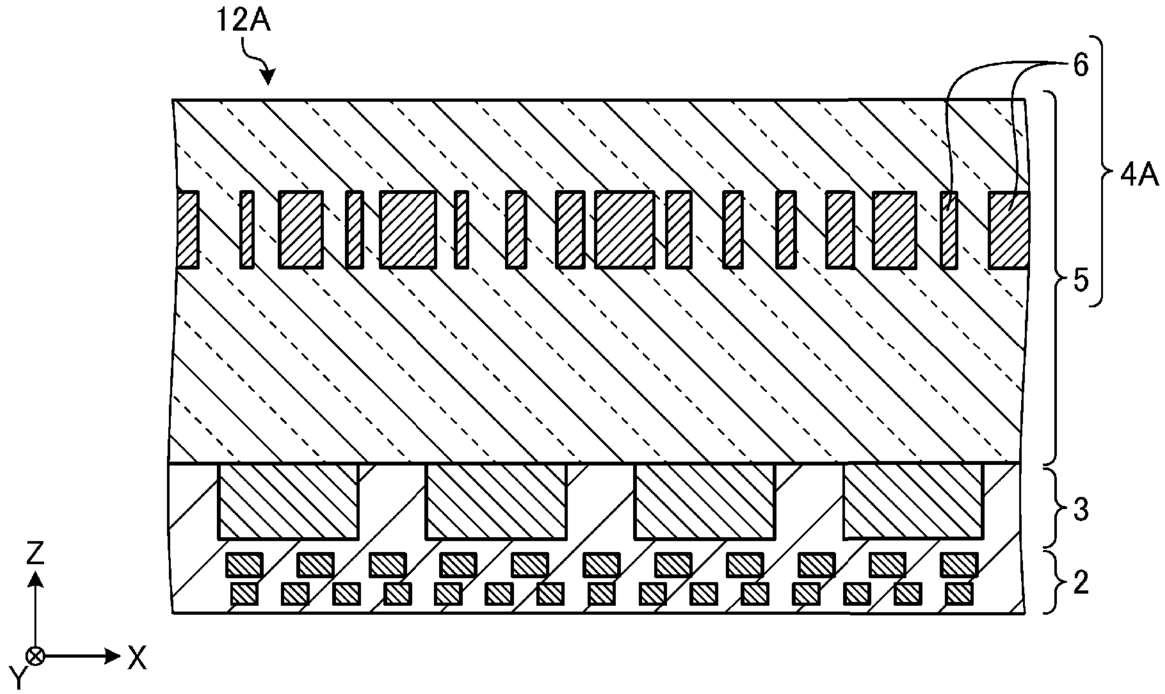
FIG. 67 is a diagram illustrating an example schematic configuration of an imaging device according to a modification.
Figure 68:
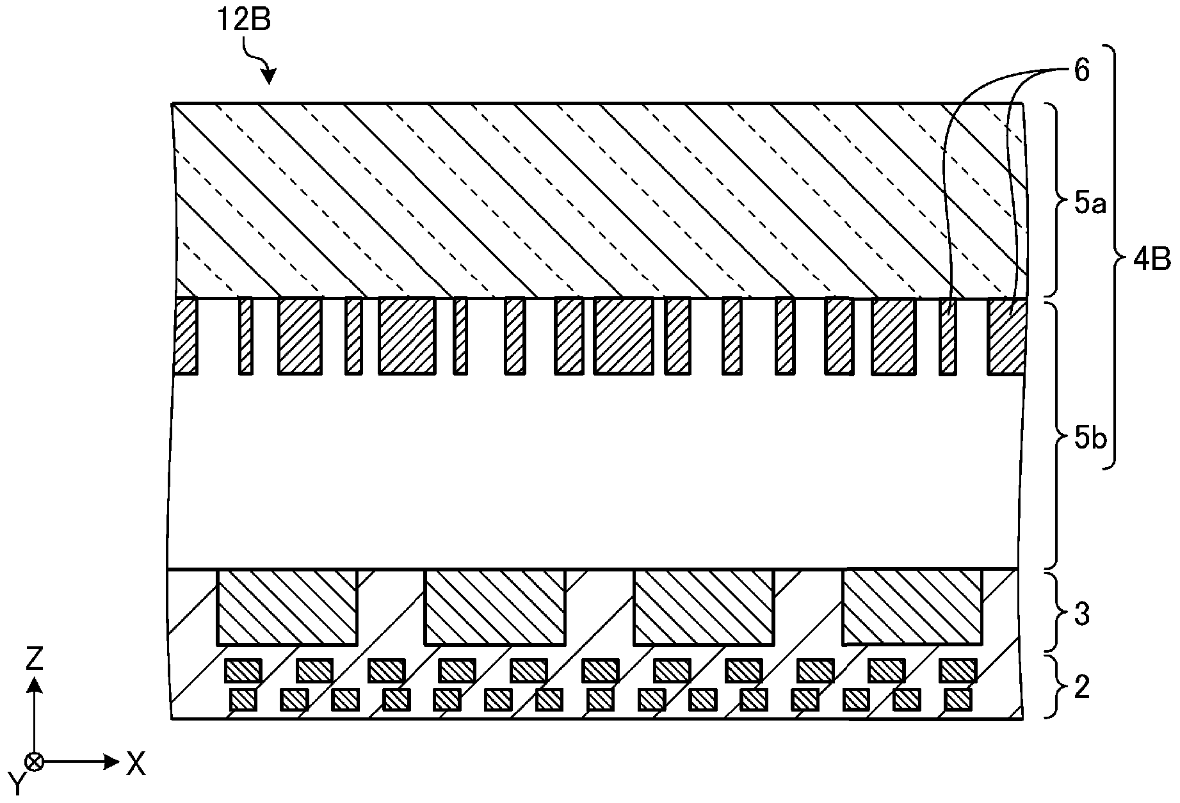
FIG. 68 is a diagram illustrating an example schematic configuration of an imaging device according to a modification.

FIGS. 67 and 68 are diagrams illustrating example schematic configurations of imaging devices according to modifications. In an imaging device 12A illustrated in FIG. 67, the plurality of structure members 6 is provided in the transparent layer 5 in an optical element 4A. The structure members 6 are buried in the transparent layer 5 (on the PDs) on the pixel layer 3. On the other hand, in an imaging device 12B illustrated in FIG. 68, the transparent layer 5 in an optical element 4B includes a transparent substrate 5*a* and an air layer 5*b*. The plurality of structure members 6 is provided on the transparent substrate 5*a* (supported by the transparent substrate 5*a*), so as to extend from the transparent substrate 5*a* toward the pixel layer 3 (in the negative Z-axis direction).

Figure 69:
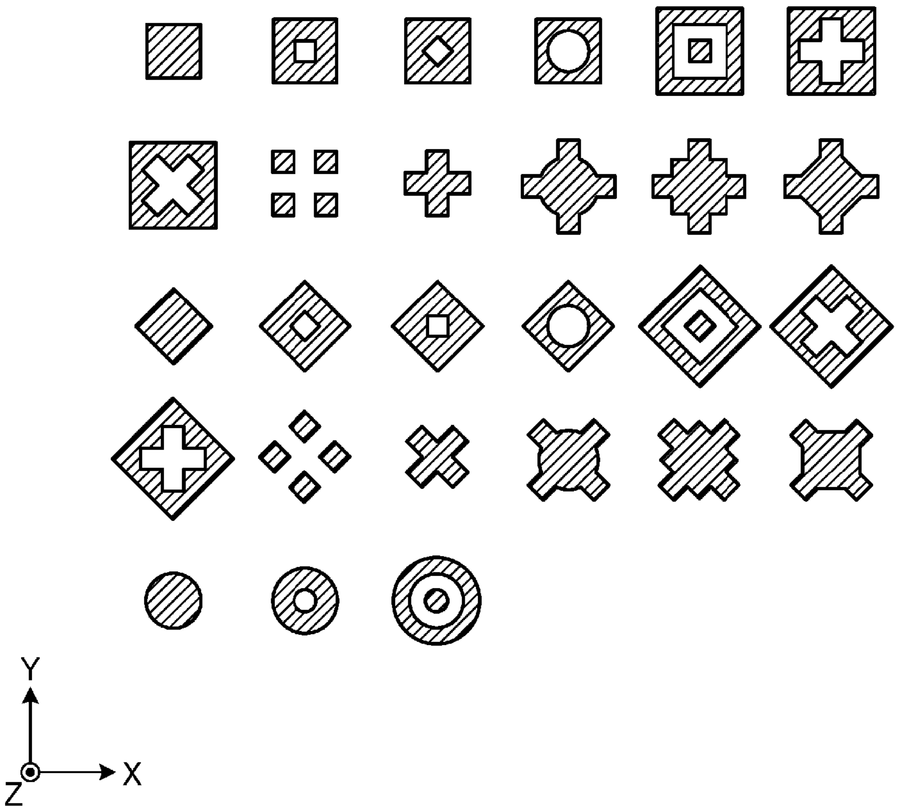
FIG. 69 is a diagram illustrating examples of cross-sectional shapes of structure members.

The cross-sectional shapes of the structure members 6 are not limited to the shapes illustrated in FIG. 5 and the like described above. FIG. 69 is a diagram illustrating examples of cross-sectional shapes of the structure members. The structure members 6 may have various cross-sectional shapes as illustrated in the drawing. The example shapes are four-fold rotationally symmetrical shapes obtained by combining square shapes, cross shapes, and circular shapes in various manners.

Figure 70:
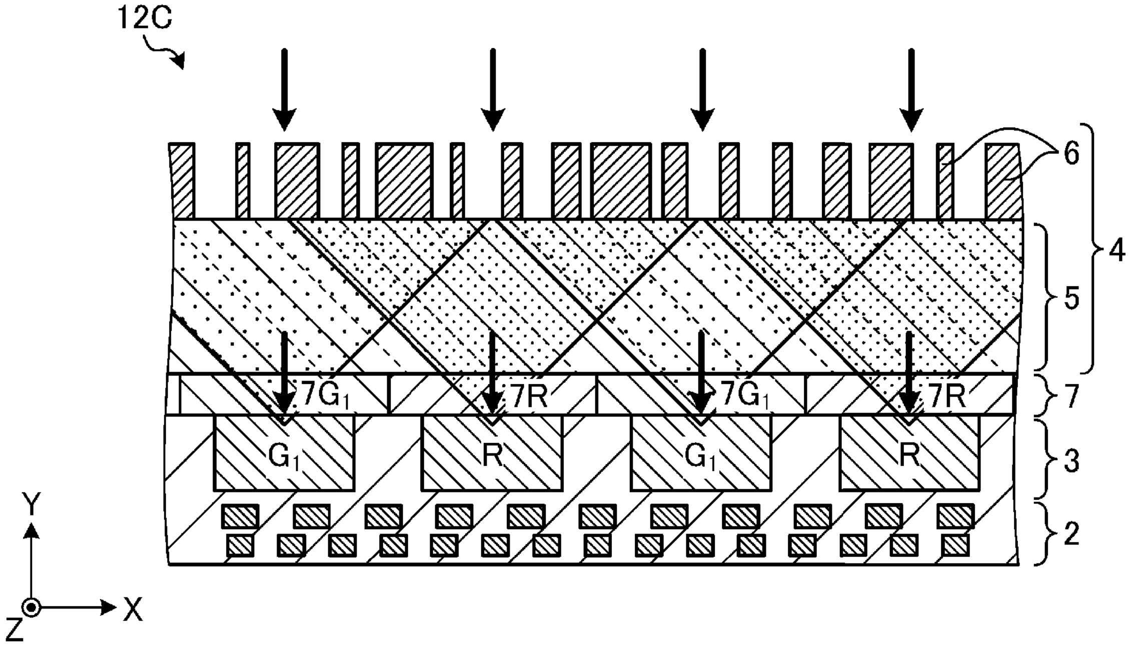
FIG. 70 is a diagram illustrating an example schematic configuration of an imaging device according to a modification.
Figure 71:
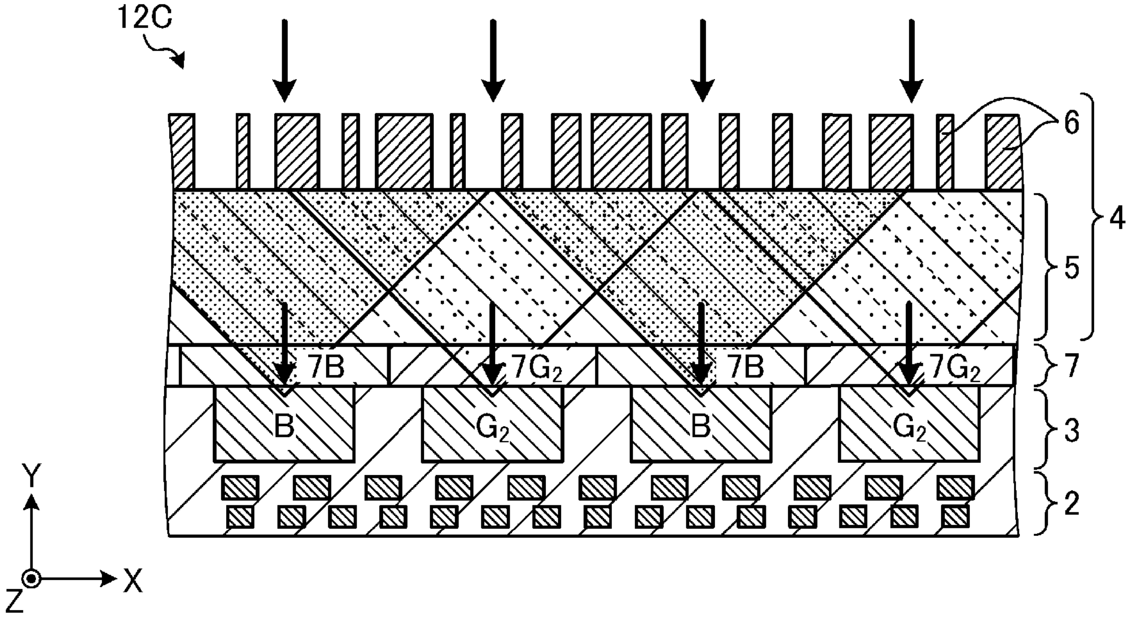
FIG. 71 is a diagram illustrating an example schematic configuration of an imaging device according to a modification.

The imaging device may include filters. FIGS. 70 and 71 are diagrams illustrating an example schematic configuration of an imaging device according to such a modification. An imaging device 12C illustrated in the drawings includes a filter layer 7 disposed between the pixel layer 3 and the optical element 4. FIG. 70 illustrates an example cross-section of the imaging device 12C as viewed from a side along the line III-III', in a case where the imaging device 12 is replaced with the imaging device 12C in FIG. 2. FIG. 71 illustrates an example cross-section of the imaging device 12C as viewed from a side along the line IV-IV', in a case where the imaging device 12 is replaced with the imaging device 12C in FIG. 2.

The filter layer 7 includes a filter 7R, a filter 7$G_1$, a filter 7$G_2$, and a filter 7B. The filter 7R is provided so as to cover a pixel R, and allows red light to pass. The filter 7$G_1$ is provided so as to cover a pixel $G_1$, and allows green light to pass. The filter 7$G_2$ is provided so as to cover a pixel $G_2$, and allows green light to pass. The filter 7B is provided so as to cover a pixel B, and allows blue light to pass. Examples of the material of the filter 7R, the filter $7G_1$, the filter $7G_2$, and the filter 7B include organic materials such as resin.

Light that has been subjected to color separation by the optical element 4 further passes through the filter layer 7, and then reaches the pixel layer 3. By the color separation by both the optical element 4 and the filter layer 7, spectrum crosstalk is made smaller (most of unnecessary other color components are removed), and color reproducibility is made higher than that in a case where color separation is performed only on one side. Further, incident light passes through the filter layer 7 after separated by the optical element 4, the amount of light is not greatly reduced. Thus, the light reception efficiency of the pixels becomes higher than that in a case where only the filter layer 7 is provided while the optical element 4 is not.

Figure 72:
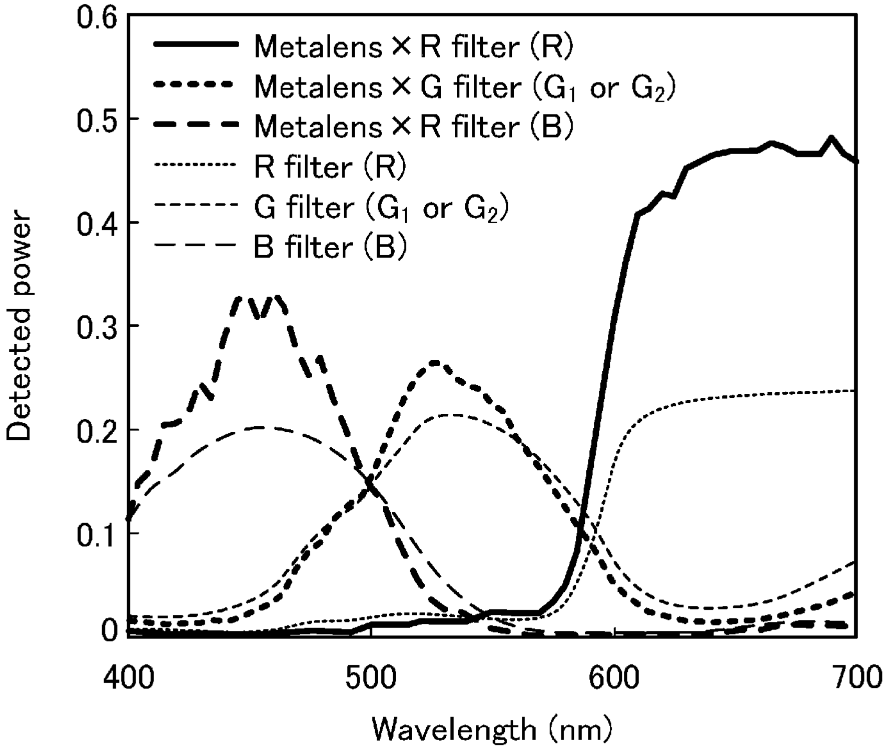
FIG. 72 is a diagram illustrating an example of the spectrums of light entering pixels.
Figure 73:
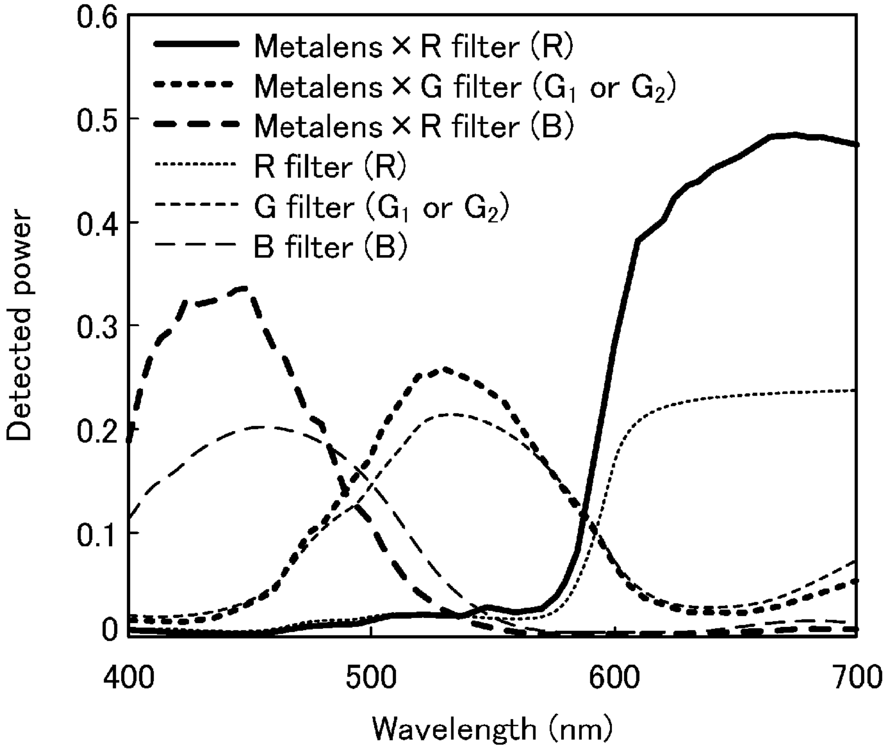
FIG. 73 is a diagram illustrating an example of the spectrums of light entering pixels.

FIGS. 72 and 73 are diagrams illustrating examples of the spectrums of light entering the pixels.

FIG. 72 illustrates an example of the spectrums in a case where the structure members 61 and the like are formed with $TiO_2$. The light reception efficiency of the pixel R is indicated by a graph line "Metalens×R filter (R)". The light reception efficiency of the pixel $G_1$ and the pixel $G_2$ is indicated by a graph line "Metalens×G filter ($G_1$ or $G_2$)". The light reception efficiency of the pixel B is indicated by a graph line "Metalens×B filter (B)". As a comparative example, the light reception efficiency of the pixel R in a case where the optical element 4 is not provided but only conventional filters are provided is indicated by a graph line "R filter (R)". The light reception efficiency of the pixel G is indicated by a graph line "G filter ($G_1$ or $G_2$)". The light reception efficiency of the pixel B is indicated by a graph line "B filter (B)".

The peak values of the spectrums of the pixel R, the pixel $G_1$, the pixel $G_2$, and the pixel B are about 1.2 to 2.0 times greater than those in the comparative example, and a higher light reception efficiency than that in the comparative example can be obtained. Also, the total transmittance is 43.3%, which is much higher (about 1.25 times higher) than 34.7% of the comparative example. Further, the spectrum of light entering each pixel is also sharper than the spectrum in the comparative example, and it is also apparent that other unnecessary color components can be reduced accordingly. Thus, color reproducibility is increased.

FIG. 73 illustrates an example of the spectrums in a case where the structure members 61 and the like are formed with SiN. The peak values of the spectrums of the pixel R, the pixel $G_1$, the pixel $G_2$, and the pixel B are about 1.2 to 2.0 times greater than those in the comparative example, and a higher light reception efficiency than that in the comparative example can be obtained. Also, the total transmittance is 45%, which is much higher (about 1.30 times higher) than 34.7% of the comparative example. Further, compared with the comparative example, the spectrum of light entering each pixel is also sharper than the spectrum in the comparative example, and it is also apparent that other unnecessary color components can be reduced accordingly. Thus, color reproducibility is increased.

Incident angle dependence is now described with reference to FIGS. 74 to 91. FIGS. 74 to 83 illustrate examples of incident angle dependences in cases where the structure members 6 are formed with $TiO_2$.

Figure 74:
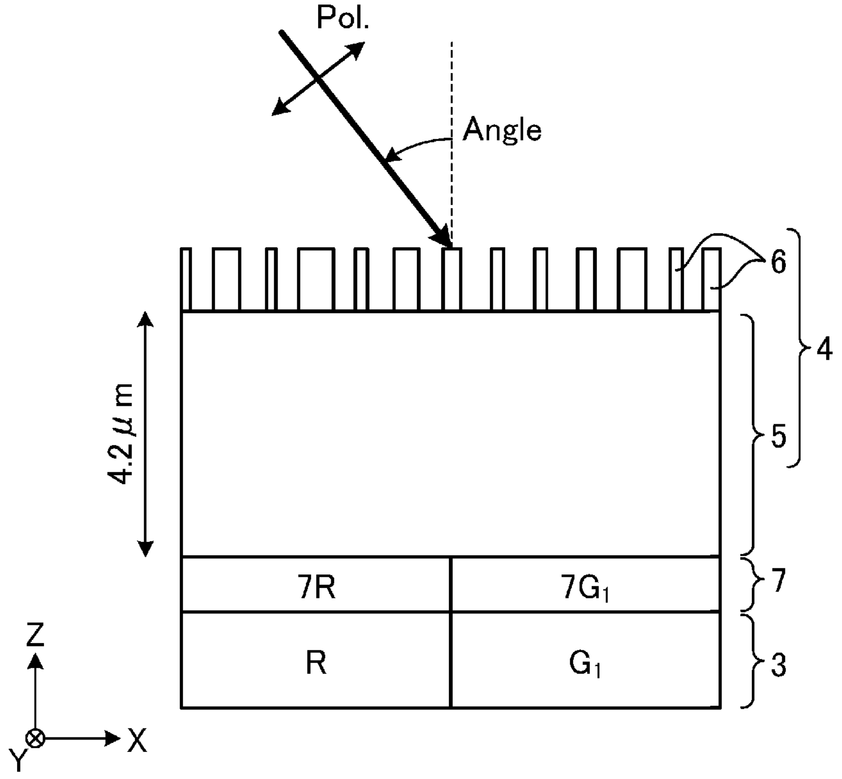
FIG. 74 is a diagram illustrating an example of incident angle dependence.
Figure 75:
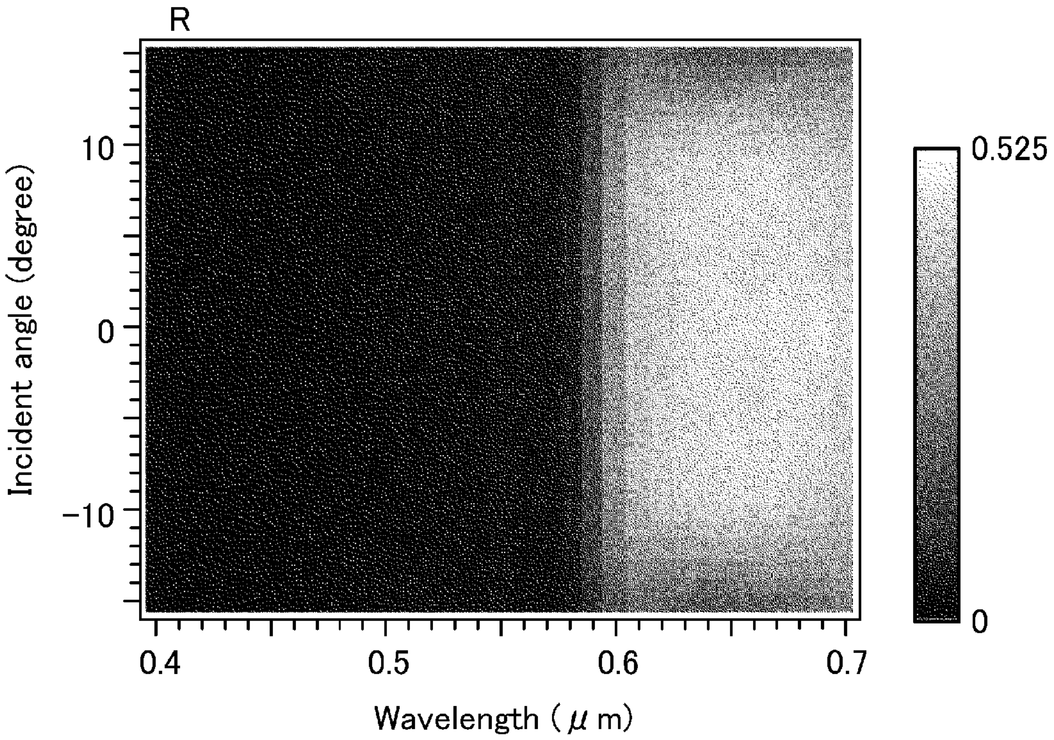
FIG. 75 is a diagram illustrating an example of incident angle dependence.
Figure 76:
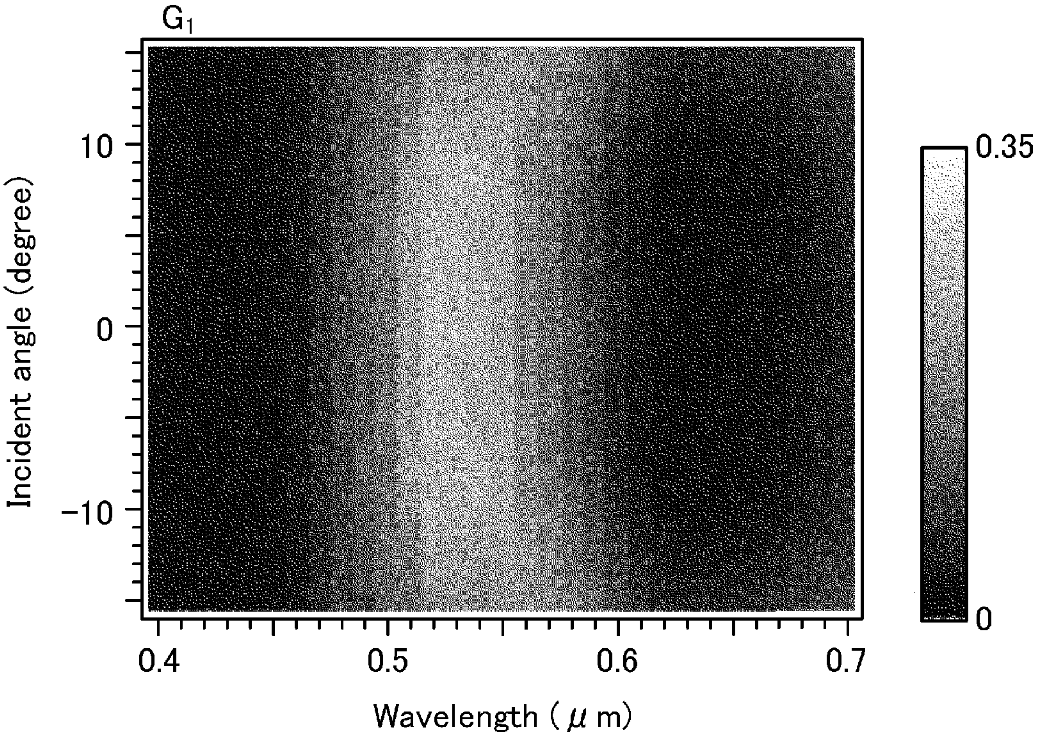
FIG. 76 is a diagram illustrating an example of incident angle dependence.
Figure 77:
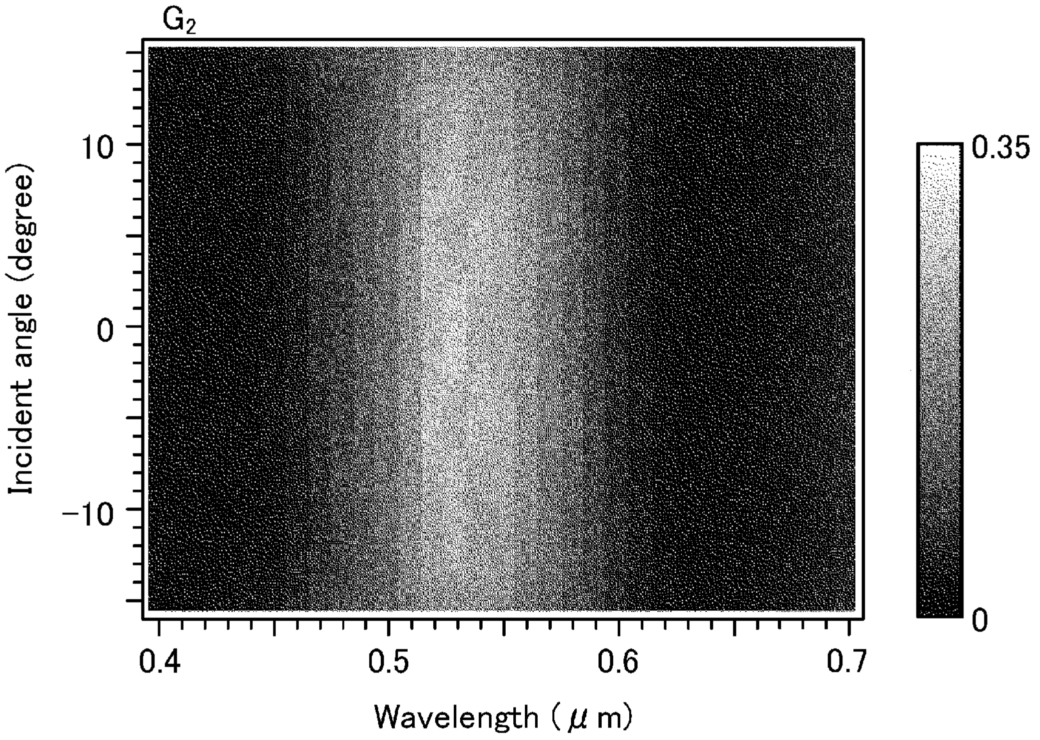
FIG. 77 is a diagram illustrating an example of incident angle dependence.
Figure 78:
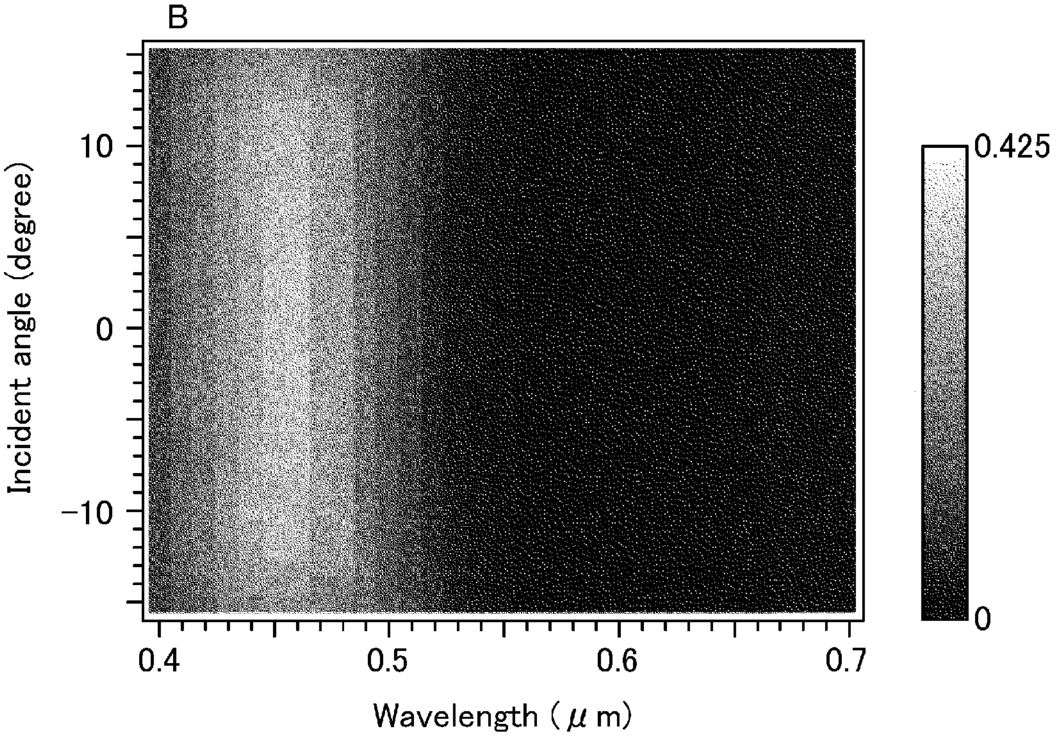
FIG. 78 is a diagram illustrating an example of incident angle dependence.

FIGS. 75 to 78 illustrate the incident angle dependences in the X-Z plane as illustrated in FIG. 74. FIG. 75 illustrates the dependence on the incident angle to the pixel R. FIG. 76 illustrates the dependence on the incident angle to the pixel $G_1$. FIG. 77 illustrates the dependence on the incident angle to the pixel $G_2$. FIG. 78 illustrates the dependence on the incident angle to the pixel B. In any of the pixels, no significant change occurs in the spectrum over the range of about ±12° in incident angle.

Figure 79:
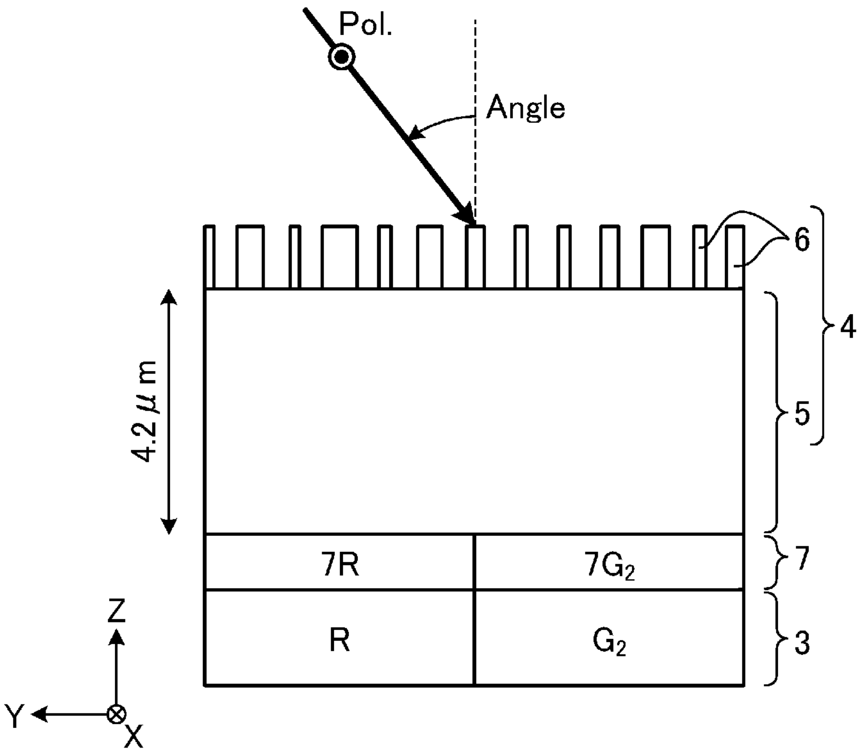
FIG. 79 is a diagram illustrating an example of incident angle dependence.
Figure 80:
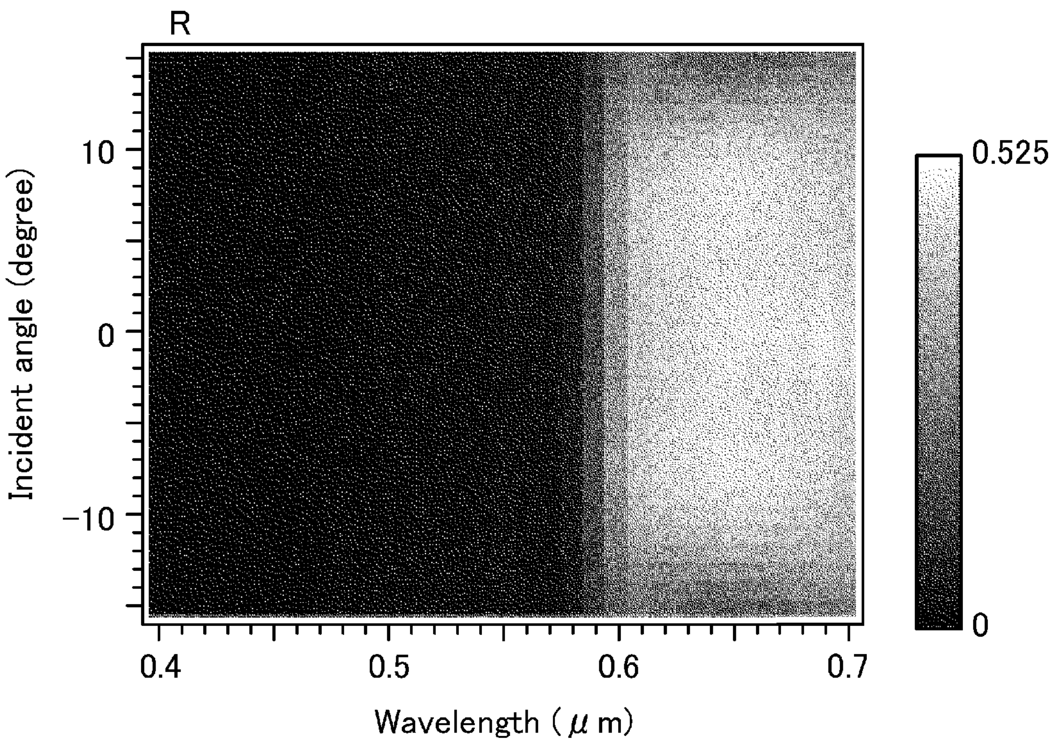
FIG. 80 is a diagram illustrating an example of incident angle dependence.
Figure 81:
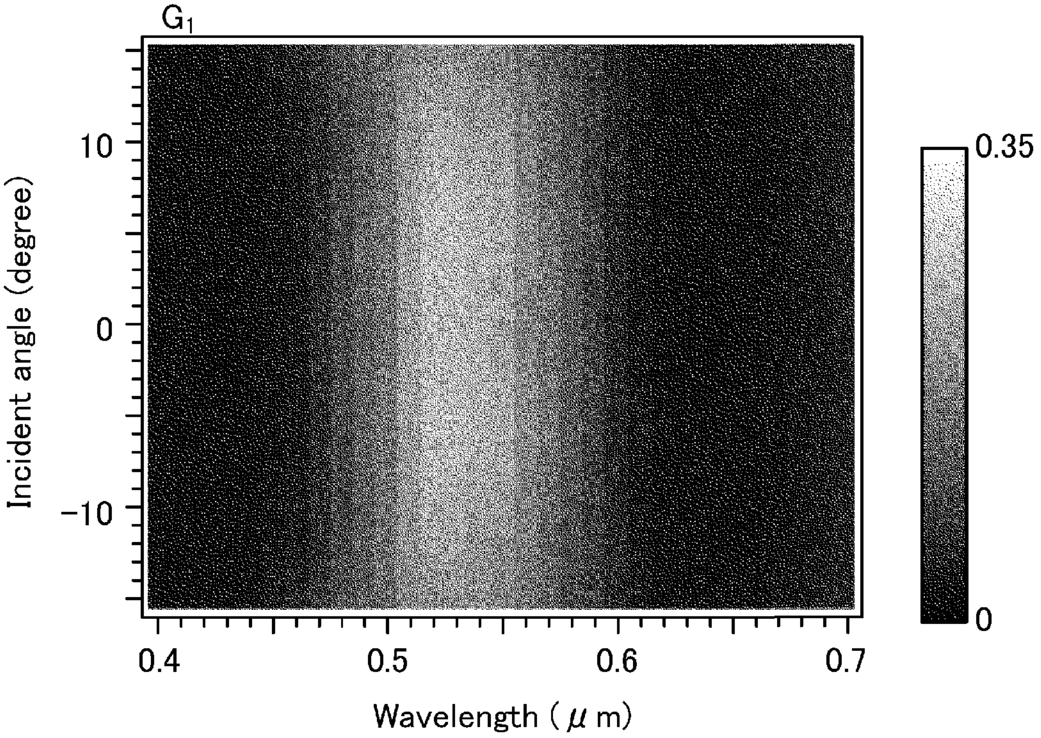
FIG. 81 is a diagram illustrating an example of incident angle dependence.
Figure 82:
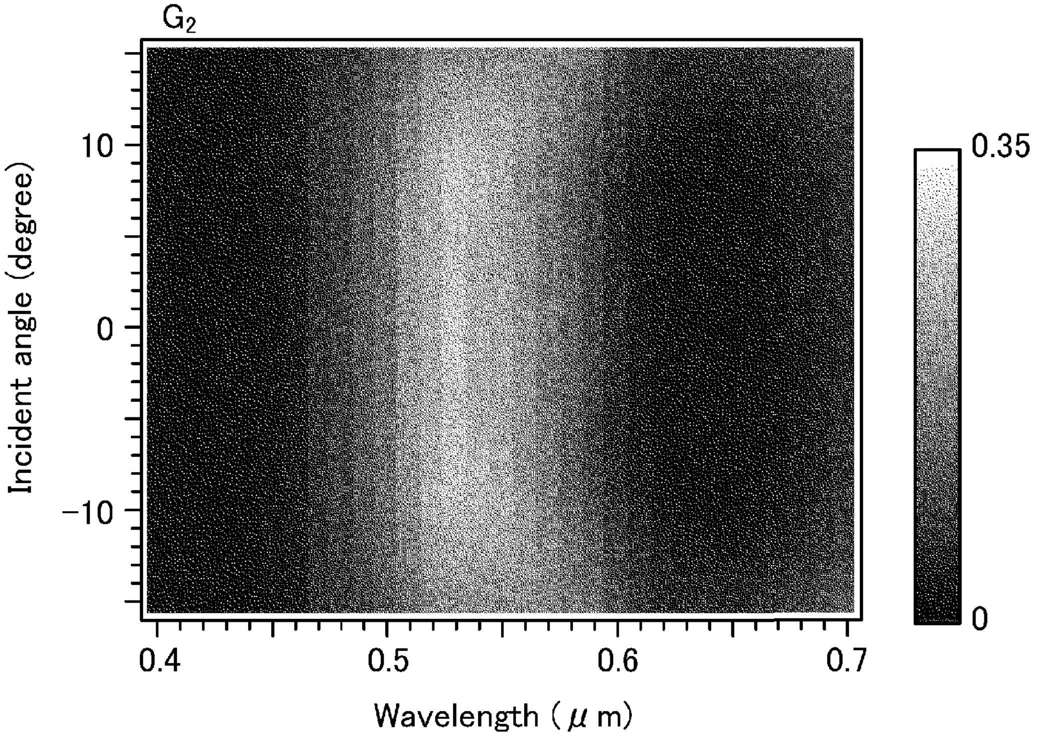
FIG. 82 is a diagram illustrating an example of incident angle dependence.
Figure 83:
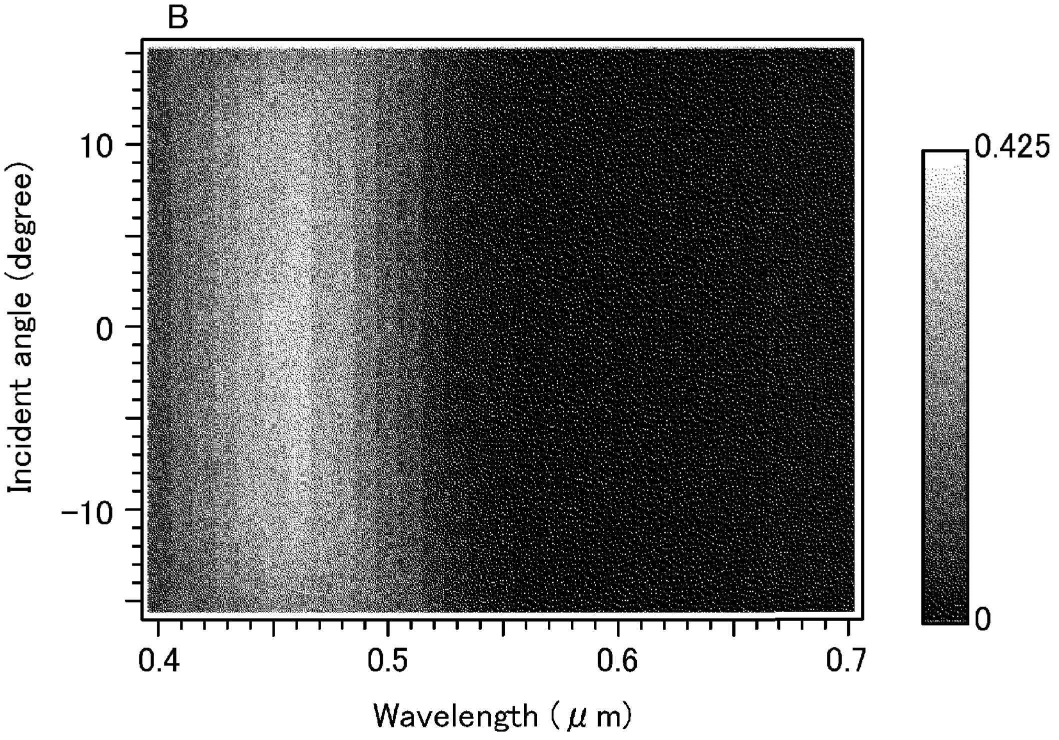
FIG. 83 is a diagram illustrating an example of incident angle dependence.

FIGS. 80 to 83 illustrate the incident angle dependences in the Y-Z plane as illustrated in FIG. 79. FIG. 80 illustrates the dependence on the incident angle to the pixel R. FIG. 81 illustrates the dependence on the incident angle to the pixel $G_1$. FIG. 82 illustrates the dependence on the incident angle to the pixel $G_2$. FIG. 83 illustrates the dependence on the incident angle to the pixel B. In any of the pixels, no significant change occurs in the spectrum over the range of about ±12° in incident angle.

FIGS. 84 to 91 illustrate examples of incident angle dependences in cases where the structure members 61 and the like are formed with SiN.

Figure 84:
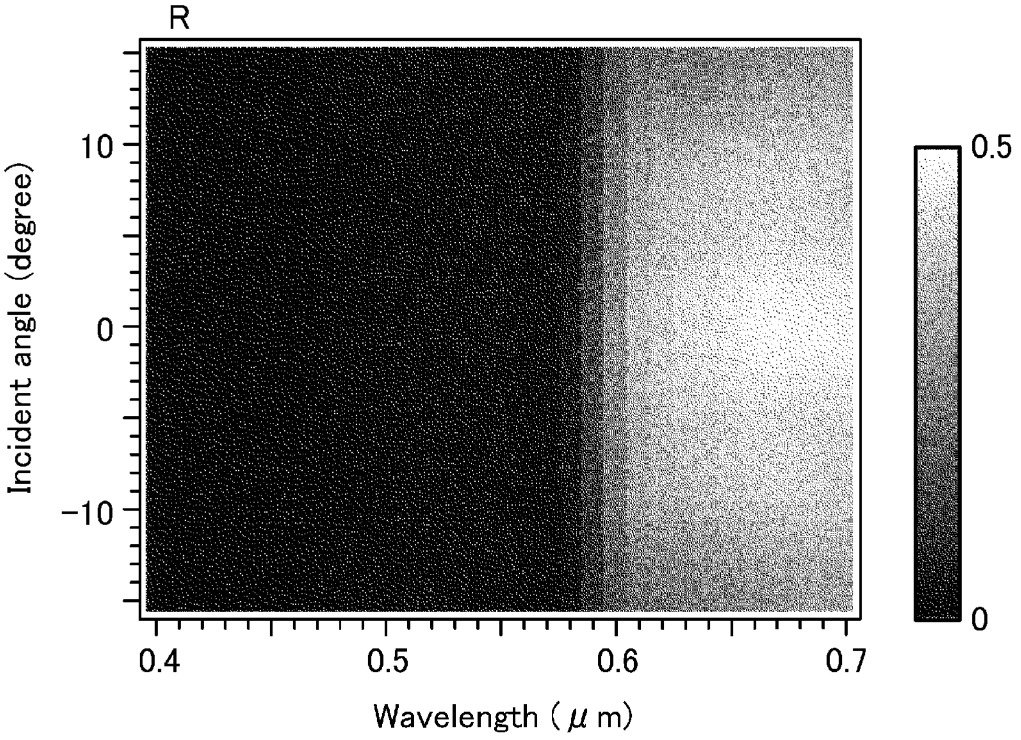
FIG. 84 is a diagram illustrating an example of incident angle dependence.
Figure 85:
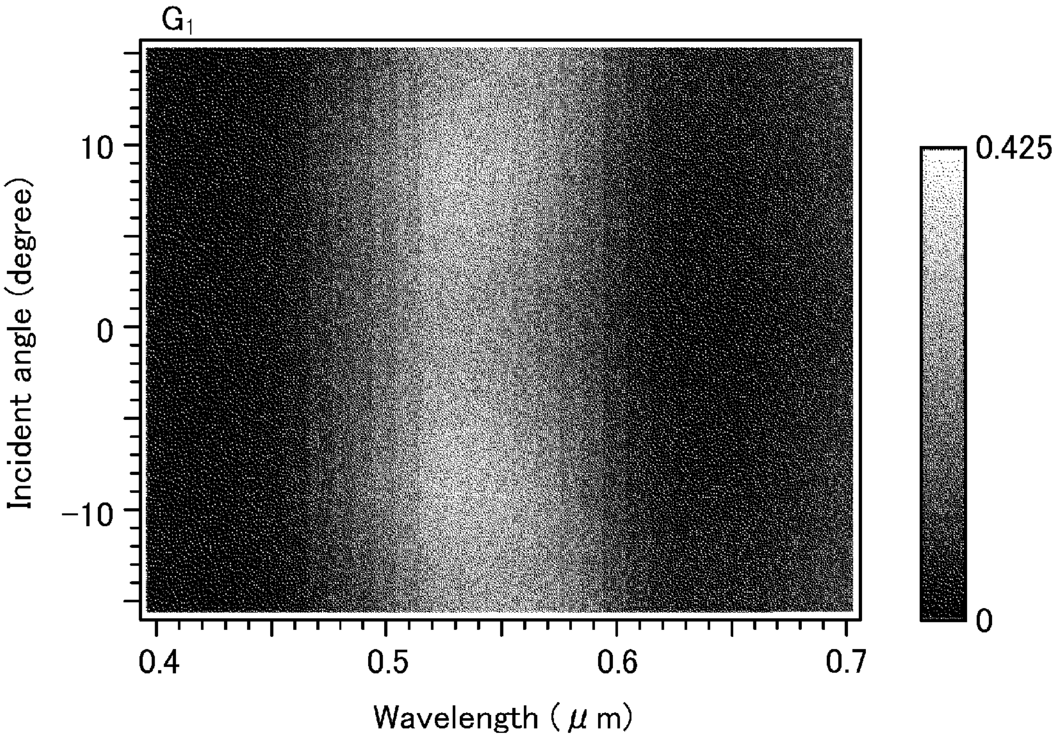
FIG. 85 is a diagram illustrating an example of incident angle dependence.
Figure 86:
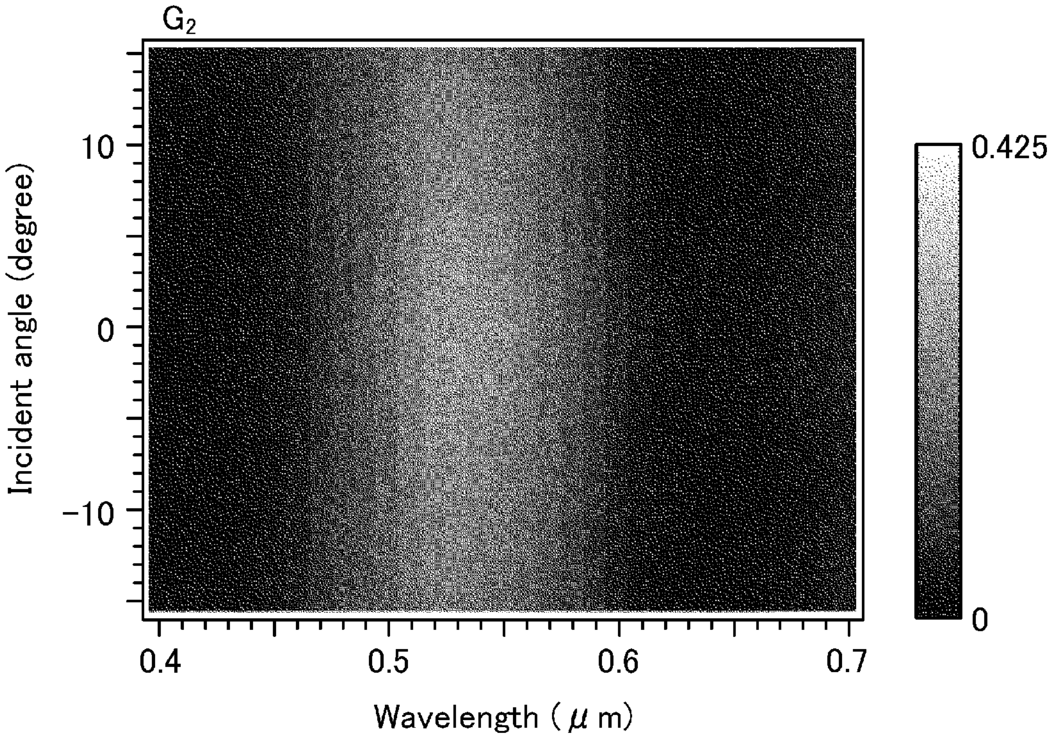
FIG. 86 is a diagram illustrating an example of incident angle dependence.
Figure 87:
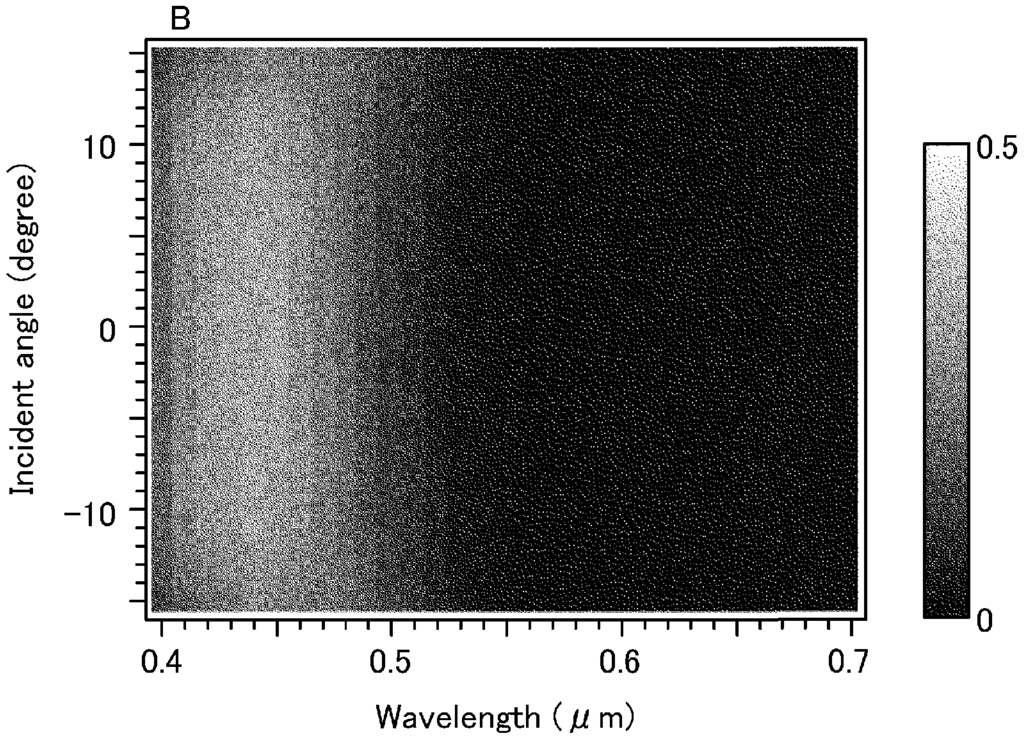
FIG. 87 is a diagram illustrating an example of incident angle dependence.

FIGS. 84 to 87 illustrate the incident angle dependences in the X-Z plane as illustrated in FIG. 74 described above. FIG. 84 illustrates the dependence on the incident angle to the pixel R. FIG. 85 illustrates the dependence on the incident angle to the pixel $G_1$. FIG. 86 illustrates the dependence on the incident angle to the pixel $G_2$. FIG. 87 illustrates the dependence on the incident angle to the pixel B. In any of the pixels, no significant change occurs in the spectrum over the range of about ±12° in incident angle.

Figure 88:
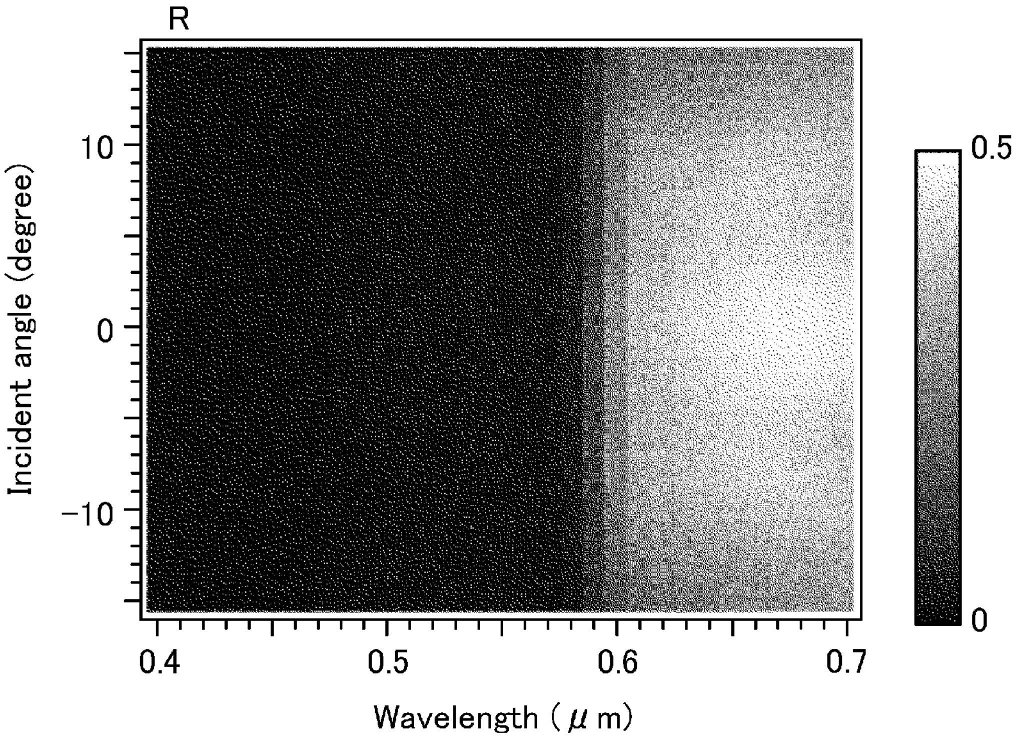
FIG. 88 is a diagram illustrating an example of incident angle dependence.
Figure 89:
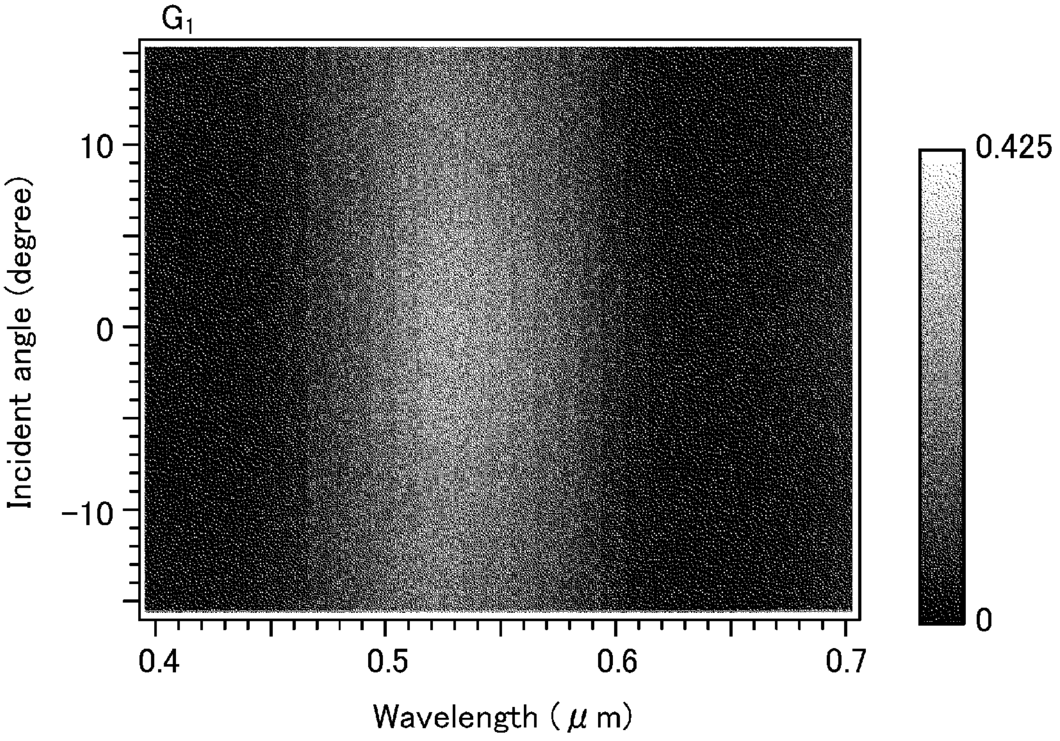
FIG. 89 is a diagram illustrating an example of incident angle dependence.
Figure 90:
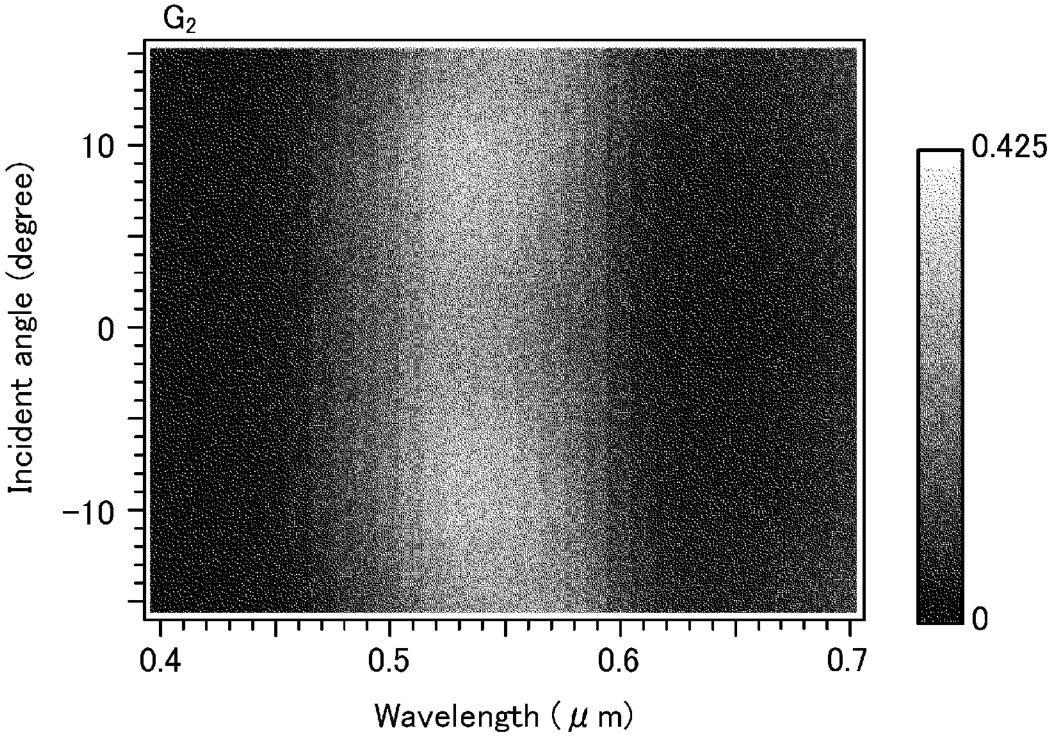
FIG. 90 is a diagram illustrating an example of incident angle dependence.
Figure 91:
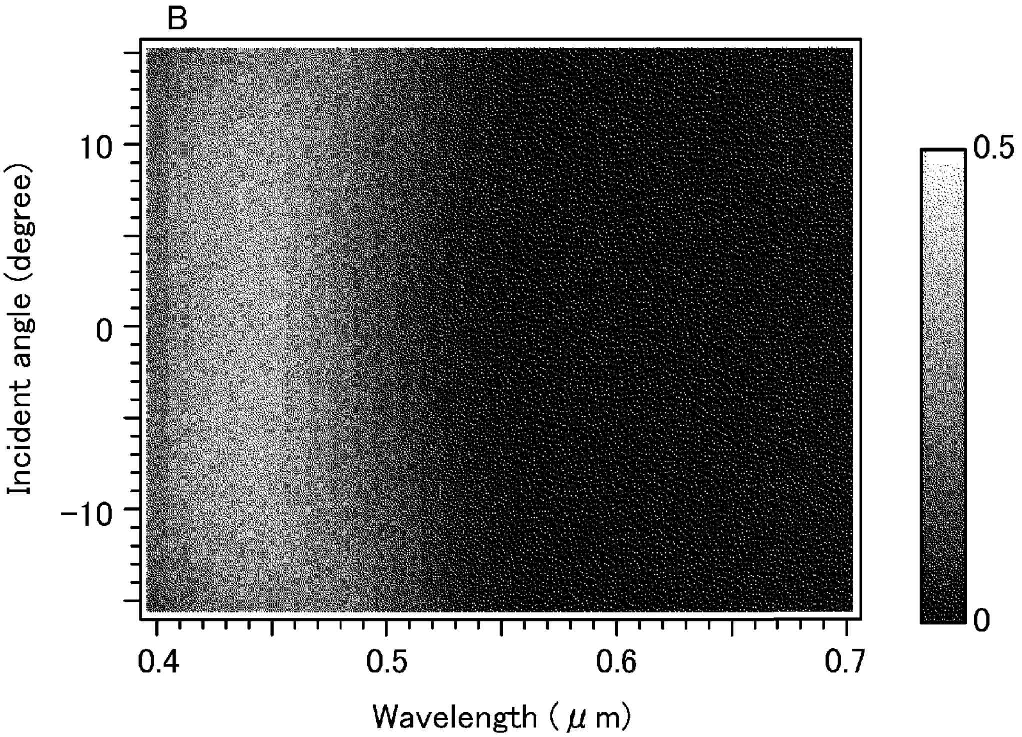
FIG. 91 is a diagram illustrating an example of incident angle dependence.

FIGS. 88 to 91 illustrate the incident angle dependences in the Y-Z plane as illustrated in FIG. 79 described above. FIG. 88 illustrates the dependence on the incident angle to the pixel R. FIG. 89 illustrates the dependence on the incident angle to the pixel $G_1$. FIG. 90 illustrates the dependence on the incident angle to the pixel $G_2$. FIG. 91 illustrates the dependence on the incident angle to the pixel B. In any of the pixels, no significant change occurs in the spectrum over the range of about ±12° in incident angle.

As described above, with the imaging device 12C further including the filter layer 7, light reception efficiency can be increased, and color reproducibility can also be further increased.

In the above embodiment, $TiO_2$ and SiN have been described as examples of the material of the structure members 6. However, the material of the structure members 6 is not limited those. For example, for light having a wavelength of 380 nm to 1000 nm (visible light to near-infrared light), SiC, $TiO_2$, GaN, or the like, other than SiN, may be used as the material of the structure members 6. Any of these materials is suitable, because the refractive index is high, and the absorption loss is low. In the case of use for light having a wavelength of 800 to 1000 nm (near-infrared light), Si, SiC, SiN, $TiO_2$, GaAs, GaN, or the like may be used as the material of the structure members 6. Any of these materials is suitable, having a low loss. For light in a near-infrared region in a long wavelength band (such as 1.3 μm or 1.55 μm as a communication wavelength), InP or the like can be used as the material of the structure members 6, in addition to the above-described materials.

In a case where the structure members 6 are formed by bonding, coating, or the like, examples of the material include polyimides such as fluorinated polyimides, benzocyclobutene (BCB), photocurable resins, UV epoxy resins, acrylic resins such as PMMA, and polymers such as resists in general.

In the example described in the above embodiment, $SiO_2$ and an air layer are assumed as the materials of the transparent layer 5. However, the materials of the transparent layer 5 are not limited to those. Any materials, including a general glass material and the like, may be used as long as each of the materials has a lower refractive index than the refractive index of the material of the structure members 6, and has a low loss at the wavelength of incident light. The transparent layer 5 is only required to have a sufficiently low loss at the wavelength of the light to reach the corresponding pixel. Therefore, the transparent layer 5 may be formed with the same material as the color filters, and may be formed with an organic material such as resin, for example. In this case, the transparent layer 5 is not only formed with a material similar to that of the color filters, but also may have a structure similar to that of the color filters, and may be designed to have absorption characteristics corresponding to the wavelength of the light to be guided to the corresponding pixel.

In the above embodiment, the three primary colors of RGB have been described as an example of the corresponding colors of the pixels. However, the pixels may also correspond to light of wavelengths (such as infrared light, ultraviolet light, and the like, for example) other than the three primary colors.

In the example described in the above embodiment, structure members having cross-sectional shapes of three different types, which are the structure members 61, the structure members 62, and the structure members 63, are used. However, structure members of two types (for example, only the structure members 61 and the structure members 62) may be used, or structure members of four or more types may be used.

The invention has been described so far on the basis of a specific embodiment. However, the present invention is not limited to the above embodiment, and it is of course possible to make various modifications to the embodiment without departing from the scope of the present invention.

The technology described so far is specified as follows, for example. As described with reference to FIGS. 1 to 5, 67, 68, and others, the optical element 4 includes the transparent layer 5 for covering a plurality of pixels (the pixel R and others) each including a photoelectric conversion element, and the plurality of structure members 6 that is disposed on the transparent layer 5 or in the transparent layer 5 in the plane direction (X-Y plane direction) of the transparent layer 5. The plurality of structure members 6 is arranged so as to condense the colors (red, green, and blue, for example) corresponding to the respective pixels of the plurality of pixels into the corresponding pixels, the colors being of incident light. The plurality of structure members 6 include structure members (the structure members 61, the structure members 62, and the structure members 63, for example) that have cross-sectional shapes of different types (a square shape, an X-like shape, and a hollow rhombic shape, for example) when the transparent layer 5 is viewed in a planar view (when viewed in the Z-axis direction).

The optical element 4 described above has both a color separation function and a lens function (a light condensing function). Accordingly, the light reception efficiency of the pixels can be made much higher, and the light sensitivity can be made higher than those in a case where filters (color filter, for example) corresponding to the respective pixels are provided, and microlenses are further provided, for example. As the structure is simplified, the manufacturing costs can also be lowered. As the plurality of structure members 6 can be disposed in a plane without gaps, the aperture ratio also becomes higher than that of microlenses.

As described with reference to FIGS. 12 to 17 and others, each structure member of the plurality of structure members 6 may be a columnar structure member that has a higher refractive index than the refractive index of the transparent layer 5, and gives incident light an optical phase delay amount corresponding to the cross-sectional shape. As described with reference to FIGS. 20 to 39 and others, the plurality of structure members 6 may be arranged in accordance with the optical phase delay amount distribution for realizing the above light condensing. For example, both the color separation function and the lens function can be obtained with such a layout of the plurality of structure members 6.

As described with reference to FIGS. 5 and 69 and others, the cross-sectional shape of each structure member of the plurality of structure members 6 may be a four-fold rotationally symmetrical shape. With this arrangement, polarization dependence can be prevented from occurring.

As described with reference to FIGS. 6 to 8 and others, the plurality of structure members 6 may be arranged so that, of light entering the outside of the region facing one pixel, light of the color corresponding to the one pixel is also condensed into the one pixel. Thus, the amount of received light can be made larger than that in a case where only the light that has entered the region facing one pixel is condensed into the pixel.

As described with reference to FIGS. 2 and 5 and others, the plurality of pixels includes a pixel unit that is formed with one pixel R corresponding to red, two pixels $G_1$ and $G_2$ corresponding to green, and one pixel B corresponding to blue that are arranged in a Bayer array. Of the plurality of structure members 6, a plurality of structure members 6 disposed in the region facing one (the pixel $G_1$, for example) of the pixels corresponding to green in the pixel unit has an overall layout structure formed by rotating 90° the overall layout structure of a plurality of structure members disposed in the region facing the other one (the pixel $G_2$, for example) of the pixels corresponding to green. As the overall layout structures of a plurality of structure members 6 are made the same except for being rotated 90°, it is possible to efficiently condense light even in a complicated color layout such as a Bayer array.

The imaging device 12 described with reference to FIGS. 1 to 5 and others is also an aspect of the present disclosure. The imaging device 12 includes the optical element 4 and a plurality of pixels (the pixel R and others) covered with the transparent layer 5. With this configuration, the manufacturing costs can be lowered as described above. Light sensitivity can also be increased, and the aperture ratio can be made higher.

As described above with reference to FIGS. 70, 71, and others, the imaging device 12C may include the filter layer 7 disposed between the plurality of pixels (the pixel R and the like) and the transparent layer 5. Thus, light reception efficiency can be increased, and color reproducibility can be further increased.

The imaging apparatus 10 described with reference to FIG. 1 and others is also an aspect of the present disclosure. The imaging apparatus 10 includes the imaging device 12 described above, and the signal processing unit 13 that generates an image signal on the basis of a pixel signal based on an electrical signal obtained from the imaging device 12. With this configuration, the manufacturing costs can be lowered as described above. Light sensitivity can also be increased, and the aperture ratio can be made higher.

REFERENCE SIGNS LIST

3 pixel layer
4 optical element
5 transparent layer
6 structure member

7 filter layer
10 imaging apparatus
11 lens optical system
12 imaging device
61 structure member
62 structure member
63 structure member
R pixel
$G_1$ pixel
$G_2$ pixel
B pixel

The invention claimed is:

1. An optical element comprising:

a transparent layer for covering a plurality of pixels each including a photoelectric conversion element; and a plurality of structure members disposed on the transparent layer or in the transparent layer, the structure members being arranged in a plane direction of the transparent layer, wherein the plurality of structure members is arranged to condense light of colors corresponding to respective pixels of the plurality of pixels into the corresponding pixels, the light of the colors being of incident light, wherein the plurality of structure members includes structure members that have at least two mutually different cross-sectional shapes, wherein the plurality of structure members are arranged in a two-dimensional array comprising a plurality of rows aligned with an in-plane axis in a plane of the transparent layer, and wherein the plurality of structure members include two or more adjacent structure members each having a predetermined-shaped cross section that is rotated to the extent that optical coupling between the adjacent structure members is weakened, with respect to the rows of the two-dimensional array.

2. The optical element according to claim 1, wherein each microstructure member is a columnar structure member that has a higher refractive index than a refractive index of the transparent layer, and gives incident light an optical phase delay amount corresponding to a cross-sectional shape of the microstructure member when the transparent layer is viewed in a planar view, the plurality of structure members is arranged in accordance with an optical phase delay amount distribution for realizing the light condensing, and a cross-sectional shape of each microstructure member is a four-fold rotationally symmetrical shape.

3. The optical element according to claim 1, wherein a cross-sectional shape of each microstructure member when the transparent layer is viewed in a planar view is designed, and the plurality of structure members is arranged to condense light of a color corresponding to one pixel into the one pixel, the light of the color being of light entering an outside of a region facing the one pixel.

4. The optical element according to claim 1, wherein the plurality of pixels includes a pixel unit that is formed with one pixel corresponding to red, two pixels corresponding to green, and one pixel corresponding to blue that are arranged in a Bayer array, and among the plurality of structure members, a plurality of structure members disposed in a region facing one of the pixels corresponding to green in the pixel unit has an overall layout structure formed by rotating 90° an overall layout structure of a plurality of structure members disposed in a region facing another one of the pixels corresponding to green.

5. The optical element according to claim 1, wherein the plurality of pixels includes a pixel unit that is formed with one pixel corresponding to red, two pixels corresponding to green, and one pixel corresponding to blue that are arranged in a Bayer array, among the plurality of structure members, a plurality of structure members disposed in a region facing the pixel corresponding to red in the pixel unit has an overall layout structure in a four-fold rotationally symmetrical shape, and among the plurality of structure members, a plurality of structure members disposed in a region facing the pixel corresponding to blue in the pixel unit has an overall layout structure in a four-fold rotationally symmetrical shape.

6. An imaging device comprising:

the optical element according to claim 1; and the plurality of pixels covered with the transparent layer.

7. The imaging device according to claim 6, further including a filter layer disposed between the plurality of pixels and the transparent layer.

8. An imaging apparatus comprising:

the imaging device according to claim 6; and a signal processing unit configured to generate an image signal on a basis of an electrical signal obtained from the imaging device.

9. The optical element according to claim 1, wherein the plurality of structure members include microstructure members that have at least three mutually different cross-sectional shapes.

10. The optical element according to claim 1, wherein the predetermined-shaped cross section is rotated by an angle enough to allow optical characteristics of each of the two or more adjacent structure members to be maintained without interference from adjacent members, with respect to the rows of the two-dimensional array.

11. The optical element according to claim 1, wherein the predetermined-shaped cross section is rotated by about 45 degrees with respect to the rows of the two-dimensional array.

12. The optical element according to claim 1, wherein the predetermined-shaped cross section is a cross-shaped cross section.

13. The optical element according to claim 10, wherein the predetermined-shaped cross section is a cross-shaped cross section.

14. The optical element according to claim 11, wherein the predetermined-shaped cross section is a cross-shaped cross section.

* * * * *